United States Patent
Kitabayashi

(10) Patent No.: US 9,365,032 B2
(45) Date of Patent: Jun. 14, 2016

(54) NOZZLE EJECTION AMOUNT CORRECTING METHOD, FUNCTIONAL LIQUID EJECTING METHOD, AND ORGANIC EL DEVICE MANUFACTURING METHOD

(71) Applicant: SEIKO EPSON CORPORATION, Tokyo (JP)

(72) Inventor: Atsushi Kitabayashi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/097,630

(22) Filed: Dec. 5, 2013

(65) Prior Publication Data

US 2014/0176631 A1    Jun. 26, 2014

(30) Foreign Application Priority Data

Dec. 21, 2012    (JP) ................... 2012-279070

(51) Int. Cl.
*B41J 2/045* (2006.01)
*H01L 51/00* (2006.01)
*B41J 3/407* (2006.01)
*B41J 2/145* (2006.01)

(52) U.S. Cl.
CPC ............ *B41J 2/04508* (2013.01); *B41J 2/0458* (2013.01); *B41J 2/0459* (2013.01); *B41J 2/04558* (2013.01); *B41J 2/04581* (2013.01); *B41J 2/145* (2013.01); *B41J 3/407* (2013.01); *H01L 51/0005* (2013.01); *B41J 2202/20* (2013.01)

(58) Field of Classification Search
CPC ...... B41J 2/12; B41J 2/04508; B41J 2/04558; B41J 2/0458; B41J 2/04581; B41J 2/04595; B41J 2/04596; B41J 2/04586; B41J 2/0459; B41J 2/04591; B41J 2/04593; B41J 2/0457; B41J 2/0456; B41J 2/04561; B41J 2/04535; B41J 2/04; H01L 21/64
USPC .............................................. 347/14; 427/64
See application file for complete search history.

(56) References Cited

U.S. PATENT DOCUMENTS

2001/0003458 A1* 6/2001 Shioya ................. B41J 2/16579
347/19
2012/0249636 A1    10/2012 Kitabayashi

FOREIGN PATENT DOCUMENTS

JP     A-2005-172927     6/2005
JP     A-2008-136927     6/2008

(Continued)

OTHER PUBLICATIONS

Kitabayashi, "MachineTranslationofJP2012209216A", 2012.*

*Primary Examiner* — Geoffrey Mruk
*Assistant Examiner* — Scott A Richmond
(74) *Attorney, Agent, or Firm* — Oliff PLC

(57) ABSTRACT

A nozzle ejection amount correcting method includes: a first signal correction for performing first signal correction by calculating correction amounts of the plurality of driving signals from a difference C between a predetermined amount B in a case of ejecting liquid droplets from the selected nozzles to the ejecting regions in the main scanning performed a plurality of times and the predetermined amount A that is set in advance; a second signal correction for performing second signal correction by calculating correction amounts of the plurality of driving signals before the correction corresponding to the main scanning in the later stage from a difference E between a predetermined amount D in a case of ejecting the liquid droplets to the ejecting regions and the predetermined amount A by using the plurality of driving signals, by which the first signal correction is performed, in the main scanning in the former stage.

15 Claims, 27 Drawing Sheets

|  | <EXAMPLE> | | | <COMPARATIVE EXAMPLE> | | |
|---|---|---|---|---|---|---|
|  | NUMBER OF SHOTS | DRIVE SIGNAL CORRECTION AMOUNT (%) | DEVIATION IN AMOUNTS OF FILLING (%) | NUMBER OF SHOTS | DRIVE SIGNAL CORRECTION AMOUNT (%) | DEVIATION IN AMOUNTS OF FILLING (%) |
| BEFORE CORRECTION |  |  | 3.39 |  |  | 3.82 |
| FIRST PASS | 2 | 3.99 | 1.05 | 1 | 8.10 | 1.26 |
| SECOND PASS | 1 | 2.32 | 0.28 | 1 | 4.10 | 0.56 |
| THIRD PASS | 1 | 0.73 | 0.11 | 1 | 1.38 | 0.23 |
| FOURTH PASS | 1 | 0.28 | 0.03 | 2 | 0.31 | 0.10 |

(56) References Cited

FOREIGN PATENT DOCUMENTS

| JP | A-2009-086155 | 4/2009 |
| JP | A-2009-189953 | 8/2009 |
| JP | A-2012-048933 | 3/2012 |
| JP | 2012209216 A * | 10/2012 |
| JP | A-2012-209216 | 10/2012 |

* cited by examiner

SUB SCANNING DIRECTION (X-AXIS DIRECTION)

MAIN SCANNING DIRECTION (Y-AXIS DIRECTION)

SUB SCANNING DIRECTION (X-AXIS DIRECTION)

FIG. 9
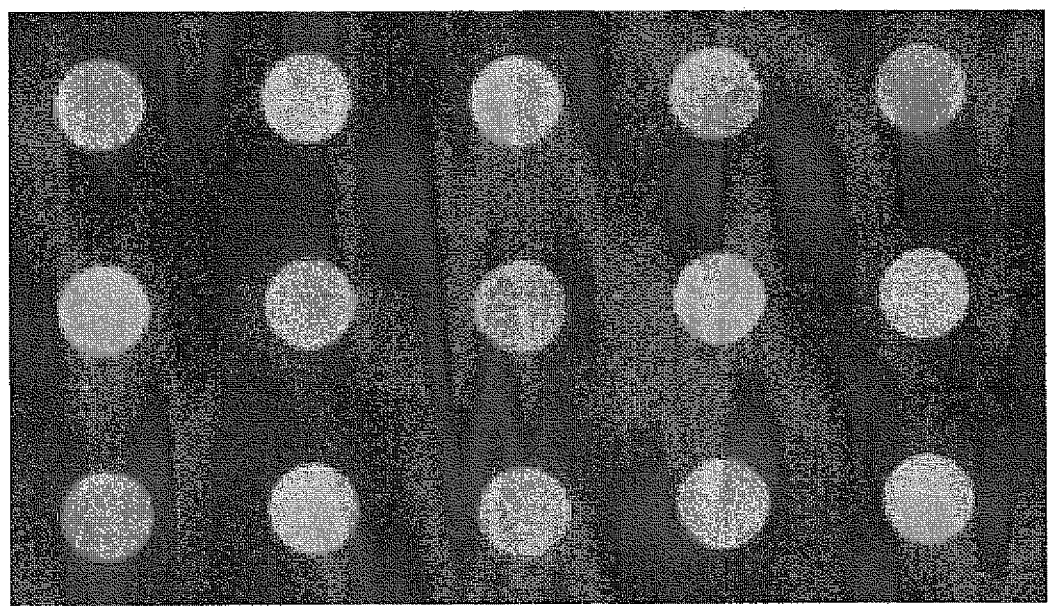
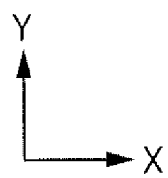

FIG. 11

<COMPARATIVE EXAMPLE: FIRST CORRECTION STEP>

| | | | | MAX | 0.07899 | |
|---|---|---|---|---|---|---|
| 5 | | | | MIN | -0.11223 | |
| NUMBER OF SHOTS | 1 | 1 | 1 | 2 | RANGE | 0.19122 | 3.82 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.98845 | 1.02080 | 1.00433 | 1.00250 | 5.01858 | 0.01858 |
| 2 | 1.00782 | 1.01157 | 1.01173 | 1.00468 | 5.04048 | 0.04048 |
| 3 | 0.99705 | 1.01582 | 1.00965 | 1.00101 | 5.02456 | 0.02456 |
| 4 | 1.05386 | 0.99455 | 1.00141 | 0.98859 | 5.02700 | 0.02700 |
| 5 | 1.00302 | 0.98893 | 0.99595 | 0.98652 | 4.96094 | -0.03906 |
| 6 | 1.01483 | 0.96928 | 1.00532 | 1.00388 | 4.99719 | -0.00281 |
| 7 | 0.99998 | 0.99675 | 0.97378 | 0.99185 | 4.95421 | -0.04579 |
| 8 | 1.01354 | 1.00280 | 1.00927 | 0.98835 | 5.00230 | 0.00230 |
| 9 | 1.02084 | 0.98457 | 1.00534 | 0.99330 | 4.99735 | -0.00265 |
| 10 | 0.98962 | 0.97294 | 0.97170 | 0.97676 | 4.88777 | -0.11223 |
| 11 | 1.01795 | 0.98632 | 1.00397 | 0.99969 | 5.00761 | 0.00761 |
| 12 | 1.00438 | 0.99909 | 0.98858 | 1.01412 | 5.02031 | 0.02031 |
| 13 | 1.01141 | 0.97976 | 0.97222 | 1.01040 | 4.98419 | -0.01581 |
| 14 | 1.03801 | 1.00856 | 0.99609 | 1.01816 | 5.07899 | 0.07899 |
| 15 | 1.00376 | 0.99867 | 0.99871 | 1.00973 | 5.02061 | 0.02061 |
| 16 | 0.99013 | 1.01205 | 1.00271 | 1.02101 | 5.04691 | 0.04691 |
| 17 | 0.98763 | 1.01172 | 0.99576 | 1.01299 | 5.02108 | 0.02108 |
| 18 | 0.99764 | 1.00161 | 0.97976 | 1.03205 | 5.04310 | 0.04310 |
| 19 | 0.97592 | 1.01062 | 1.00325 | 1.01374 | 5.01727 | 0.01727 |
| 20 | 0.97125 | 0.97455 | 0.98707 | 0.98859 | 4.91005 | -0.08995 |
| 21 | 1.01335 | 0.99593 | 0.98550 | 1.00369 | 5.00216 | 0.00216 |
| 22 | 1.00169 | 1.00543 | 1.00149 | 1.02461 | 5.05782 | 0.05782 |
| 23 | 1.00929 | 0.99094 | 0.98717 | 1.01740 | 5.02218 | 0.02218 |
| 24 | 1.00740 | 0.99081 | 0.99858 | 1.00527 | 5.00732 | 0.00732 |
| 25 | 1.01679 | 0.97947 | 1.00319 | 0.99537 | 4.99019 | -0.00981 |
| 26 | 0.97293 | 0.99591 | 1.00205 | 1.00906 | 4.98901 | -0.01099 |
| 27 | 0.99967 | 0.99823 | 1.02196 | 1.00344 | 5.02674 | 0.02674 |
| 28 | 0.98583 | 1.01744 | 1.00468 | 1.01765 | 5.04326 | 0.04326 |
| 29 | 1.01965 | 1.00585 | 1.01231 | 1.00124 | 5.04029 | 0.04029 |
| 30 | 1.01119 | 0.99907 | 1.00770 | 1.01668 | 5.05131 | 0.05131 |
| 31 | 0.99314 | 0.97561 | 1.02004 | 1.02368 | 5.03616 | 0.03616 |
| 32 | 1.01115 | 0.99970 | 1.02537 | 0.99879 | 5.03379 | 0.03379 |
| 33 | 0.99481 | 1.00042 | 1.00322 | 0.98882 | 4.97610 | -0.02390 |
| 34 | 0.99410 | 0.98581 | 0.99742 | 1.00135 | 4.98003 | -0.01997 |
| 35 | 1.00517 | 0.98908 | 1.01476 | 0.99930 | 5.00762 | 0.00762 |
| 36 | 0.99767 | 0.99455 | 1.01543 | 0.99431 | 4.99629 | -0.00371 |
| 37 | 0.97807 | 0.99650 | 1.01873 | 0.99582 | 4.98493 | -0.01507 |
| 38 | 0.99030 | 0.99616 | 1.00661 | 1.01998 | 5.03304 | 0.03304 |
| 39 | 1.00057 | 1.01304 | 1.00410 | 0.98289 | 4.98349 | -0.01651 |
| 40 | 0.99578 | 1.02986 | 0.98979 | 1.00215 | 5.01975 | 0.01975 |
| 41 | 0.98925 | 1.00701 | 1.01080 | 1.00677 | 5.02060 | 0.02060 |
| 42 | 1.00257 | 1.01179 | 0.99663 | 1.00356 | 5.01811 | 0.01811 |
| 43 | 1.01381 | 1.01706 | 1.01913 | 1.00655 | 5.06309 | 0.06309 |
| 44 | 1.00328 | 1.01800 | 1.02308 | 1.01077 | 5.06590 | 0.06590 |
| 45 | 0.98455 | 1.03325 | 0.99003 | 0.99355 | 4.99493 | -0.00507 |
| 46 | 1.00098 | 1.00943 | 0.99421 | 1.00507 | 5.01476 | 0.01476 |
| 47 | 0.98532 | 1.00393 | 0.99400 | 1.00827 | 4.99978 | -0.00022 |
| 48 | 1.01262 | 1.00449 | 0.99511 | 1.00483 | 5.02189 | 0.02189 |
| 49 | 0.99642 | 1.01693 | 0.99411 | 0.99918 | 5.00582 | 0.00582 |
| 50 | 0.98220 | 1.01513 | 1.00992 | 1.01149 | 5.03022 | 0.03022 |
| 51 | 0.99251 | 1.01397 | 1.00546 | 1.00301 | 5.01795 | 0.01795 |
| 52 | 1.01113 | 1.01182 | 0.99144 | 0.99060 | 4.99558 | -0.00442 |
| 53 | 1.00315 | 1.02096 | 1.00275 | 0.99561 | 5.01807 | 0.01807 |
| 54 | 1.02230 | 1.00783 | 1.00627 | 0.99706 | 5.03053 | 0.03053 |
| 55 | 0.99926 | 1.02098 | 1.00849 | 0.98038 | 4.98949 | -0.01051 |
| 56 | 1.00676 | 1.02183 | 1.00935 | 0.99106 | 5.02006 | 0.02006 |
| 57 | 1.02405 | 1.00503 | 1.00321 | 0.99175 | 5.01579 | 0.01579 |
| 58 | 1.03181 | 1.00843 | 1.01452 | 0.98273 | 5.02023 | 0.02023 |
| 59 | 1.01025 | 1.00324 | 1.00799 | 0.98616 | 4.99380 | -0.00620 |
| 60 | 0.97311 | 0.98817 | 1.00473 | 0.98349 | 4.93300 | -0.06700 |

CORRECTION RATE OF FIRST PASS

| COM1 | 103.6 % |
|---|---|
| COM2 | 99.8 % |
| COM3 | 97.8 % |
| COM4 | 95.5 % |
| MAX-MIN | 8.1 % |

FIG. 12

< COMPARATIVE EXAMPLE: SECOND CORRECTION STEP >

| | | | | | MAX | 0.03176 | |
|---|---|---|---|---|---|---|---|
| 5 | | | | | MIN | -0.03139 | |
| NUMBER OF SHOTS | 1 | 1 | 1 | 2 | RANGE | 0.06315 | 1.26 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.95464 | 1.02080 | 1.00433 | 1.00250 | 4.98477 | -0.01523 |
| 2 | 0.97628 | 1.01157 | 1.01173 | 1.00468 | 5.00894 | 0.00894 |
| 3 | 0.96133 | 1.01582 | 1.00965 | 1.00101 | 4.98883 | -0.01117 |
| 4 | 1.05862 | 0.99455 | 1.00141 | 0.98859 | 5.03176 | 0.03176 |
| 5 | 1.04067 | 0.98868 | 0.99595 | 0.98652 | 4.99835 | -0.00165 |
| 6 | 1.01506 | 0.97229 | 1.00532 | 1.00388 | 5.00043 | 0.00043 |
| 7 | 1.04533 | 0.98796 | 0.97378 | 0.99185 | 4.99077 | -0.00923 |
| 8 | 1.01239 | 1.00282 | 1.00927 | 0.98835 | 5.00118 | 0.00118 |
| 9 | 1.01827 | 0.98337 | 1.00534 | 0.99330 | 4.99358 | -0.00642 |
| 10 | 1.05545 | 0.98795 | 0.97170 | 0.97676 | 4.96861 | -0.03139 |
| 11 | 1.01263 | 0.98927 | 1.00397 | 0.99969 | 5.00525 | 0.00525 |
| 12 | 0.98048 | 1.00677 | 0.98858 | 1.01412 | 5.00407 | 0.00407 |
| 13 | 1.03461 | 0.98699 | 0.97222 | 1.01040 | 5.01462 | 0.01462 |
| 14 | 0.97298 | 1.01716 | 0.99609 | 1.01816 | 5.02256 | 0.02256 |
| 15 | 0.98176 | 0.99775 | 0.99871 | 1.00973 | 4.99769 | -0.00231 |
| 16 | 0.94852 | 0.99555 | 1.00271 | 1.02101 | 4.98879 | -0.01121 |
| 17 | 0.97133 | 1.00527 | 0.99576 | 1.01299 | 4.99833 | -0.00167 |
| 18 | 0.96659 | 0.99588 | 0.97976 | 1.03205 | 5.00633 | 0.00633 |
| 19 | 0.95757 | 1.00935 | 1.00325 | 1.01374 | 4.99765 | -0.00235 |
| 20 | 1.03018 | 0.97920 | 0.98707 | 0.98859 | 4.97364 | -0.02636 |
| 21 | 1.03048 | 0.99296 | 0.98550 | 1.00369 | 5.01633 | 0.01633 |
| 22 | 0.94773 | 1.01474 | 1.00149 | 1.02461 | 5.01317 | 0.01317 |
| 23 | 1.02037 | 0.98328 | 0.98717 | 1.01740 | 5.02561 | 0.02561 |
| 24 | 1.02324 | 0.99018 | 0.99858 | 1.00527 | 5.02254 | 0.02254 |
| 25 | 1.03825 | 0.98581 | 1.00319 | 0.99537 | 5.01799 | 0.01799 |
| 26 | 0.98239 | 0.98762 | 1.00205 | 1.00906 | 4.99019 | -0.00981 |
| 27 | 0.96785 | 0.99269 | 1.02196 | 1.00344 | 4.98939 | -0.01061 |
| 28 | 0.94971 | 1.00499 | 1.00468 | 1.01765 | 4.99469 | -0.00531 |
| 29 | 0.99154 | 1.00436 | 1.01231 | 1.00124 | 5.01070 | 0.01070 |
| 30 | 0.96458 | 1.00013 | 1.00770 | 1.01668 | 5.00577 | 0.00577 |
| 31 | 0.95430 | 0.97268 | 1.02004 | 1.02368 | 4.99439 | -0.00561 |
| 32 | 0.98484 | 0.99391 | 1.02537 | 0.99879 | 5.00169 | 0.00169 |
| 33 | 1.02046 | 1.00334 | 1.00322 | 0.98882 | 5.00467 | 0.00467 |
| 34 | 1.01828 | 0.99156 | 0.99742 | 1.00135 | 5.00996 | 0.00996 |
| 35 | 0.98953 | 0.99393 | 1.01476 | 0.99930 | 4.99683 | -0.00317 |
| 36 | 0.99939 | 0.98953 | 1.01543 | 0.99431 | 4.99299 | -0.00701 |
| 37 | 1.00540 | 0.99219 | 1.01873 | 0.99582 | 5.00796 | 0.00796 |
| 38 | 0.95270 | 0.99505 | 1.00661 | 1.01998 | 4.99432 | -0.00568 |
| 39 | 1.02899 | 1.01108 | 1.00410 | 0.98289 | 5.00995 | 0.00995 |
| 40 | 0.98738 | 1.02238 | 0.98979 | 1.00215 | 5.00386 | 0.00386 |
| 41 | 0.96001 | 1.00345 | 1.01080 | 1.00677 | 4.98780 | -0.01220 |
| 42 | 0.98399 | 1.00687 | 0.99663 | 1.00356 | 4.99461 | -0.00539 |
| 43 | 0.95830 | 1.01840 | 1.01913 | 1.00655 | 5.00893 | 0.00893 |
| 44 | 0.94712 | 1.02113 | 1.02308 | 1.01077 | 5.01287 | 0.01287 |
| 45 | 0.98564 | 1.03281 | 0.99003 | 0.99355 | 4.99559 | -0.00441 |
| 46 | 0.98318 | 1.01018 | 0.99421 | 1.00507 | 4.99770 | -0.00230 |
| 47 | 0.99079 | 0.99405 | 0.99400 | 1.00827 | 4.99537 | -0.00463 |
| 48 | 1.02350 | 0.99336 | 0.99511 | 1.00483 | 5.02164 | 0.02164 |
| 49 | 0.99253 | 1.01745 | 0.99411 | 0.99918 | 5.00244 | 0.00244 |
| 50 | 0.95731 | 1.01280 | 1.00992 | 1.01149 | 5.00301 | 0.00301 |
| 51 | 0.97971 | 1.00311 | 1.00546 | 1.00301 | 4.99430 | -0.00570 |
| 52 | 1.01297 | 1.00985 | 0.99144 | 0.99060 | 4.99545 | -0.00455 |
| 53 | 0.98980 | 1.00345 | 1.00275 | 0.99561 | 4.98721 | -0.01279 |
| 54 | 0.99719 | 1.00645 | 1.00627 | 0.99706 | 5.00404 | 0.00404 |
| 55 | 1.00856 | 1.00883 | 1.00849 | 0.98038 | 4.98665 | -0.01335 |
| 56 | 0.97793 | 1.01117 | 1.00935 | 0.99106 | 4.98056 | -0.01944 |
| 57 | 1.01222 | 1.00909 | 1.00321 | 0.99175 | 5.00803 | 0.00803 |
| 58 | 1.01110 | 1.01738 | 1.01452 | 0.98273 | 5.00846 | 0.00846 |
| 59 | 1.01316 | 1.00324 | 1.00799 | 0.98616 | 4.99672 | -0.00328 |
| 60 | 1.02347 | 0.98817 | 1.00473 | 0.98349 | 4.98335 | -0.01665 |

CORRECTION RATE OF SECOND PASS

| COM1 | 101.6 % |
|---|---|
| COM2 | 100.8 % |
| COM3 | 99.4 % |
| COM4 | 97.5 % |
| MAX-MIN | 4.1 % |

FIG. 13

<COMPARATIVE EXAMPLE: THIRD CORRECTION STEP>

| | | | | | MAX | 0.01285 | |
|---|---|---|---|---|---|---|---|
| 5 | | | | | MIN | -0.01520 | |
| NUMBER OF SHOTS | 1 | 1 | 1 | 2 | RANGE | 0.02805 | 0.56 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.95464 | 1.03507 | 1.00433 | 1.00250 | 4.99903 | -0.00097 |
| 2 | 0.97628 | 1.00418 | 1.01173 | 1.00468 | 5.00155 | 0.00155 |
| 3 | 0.96133 | 1.02855 | 1.00965 | 1.00101 | 5.00155 | 0.00155 |
| 4 | 1.05862 | 0.96285 | 1.00141 | 0.98859 | 5.00006 | 0.00006 |
| 5 | 1.04067 | 0.99096 | 0.99595 | 0.98652 | 5.00062 | 0.00062 |
| 6 | 1.01506 | 0.97205 | 1.00532 | 1.00388 | 5.00019 | 0.00019 |
| 7 | 1.04533 | 1.00676 | 0.97378 | 0.99185 | 5.00957 | 0.00957 |
| 8 | 1.01239 | 1.00419 | 1.00927 | 0.98835 | 5.00255 | 0.00255 |
| 9 | 1.01827 | 0.98455 | 1.00534 | 0.99330 | 4.99477 | -0.00523 |
| 10 | 1.05545 | 1.00414 | 0.97170 | 0.97676 | 4.98480 | -0.01520 |
| 11 | 1.01263 | 0.98355 | 1.00397 | 0.99969 | 4.99953 | -0.00047 |
| 12 | 0.98048 | 0.99919 | 0.98858 | 1.01412 | 4.99650 | -0.00350 |
| 13 | 1.03461 | 0.96724 | 0.97222 | 1.01040 | 4.99486 | -0.00514 |
| 14 | 0.97298 | 0.99406 | 0.99609 | 1.01816 | 4.99946 | -0.00054 |
| 15 | 0.98176 | 1.00067 | 0.99871 | 1.00973 | 5.00061 | 0.00061 |
| 16 | 0.94852 | 1.01850 | 1.00271 | 1.02101 | 5.01175 | 0.01175 |
| 17 | 0.97133 | 1.01915 | 0.99576 | 1.01299 | 5.01221 | 0.01221 |
| 18 | 0.96659 | 0.99443 | 0.97976 | 1.03205 | 5.00487 | 0.00487 |
| 19 | 0.95757 | 1.01202 | 1.00325 | 1.01374 | 5.00033 | 0.00033 |
| 20 | 1.03018 | 0.99923 | 0.98707 | 0.98859 | 4.99366 | -0.00634 |
| 21 | 1.03048 | 0.97719 | 0.98550 | 1.00369 | 5.00056 | 0.00056 |
| 22 | 0.94773 | 0.99406 | 1.00149 | 1.02461 | 4.99248 | -0.00752 |
| 23 | 1.02037 | 0.96639 | 0.98717 | 1.01740 | 5.00872 | 0.00872 |
| 24 | 1.02324 | 0.97101 | 0.99858 | 1.00527 | 5.00337 | 0.00337 |
| 25 | 1.03825 | 0.96487 | 1.00319 | 0.99537 | 4.99704 | -0.00296 |
| 26 | 0.98239 | 1.00645 | 1.00205 | 1.00906 | 5.00901 | 0.00901 |
| 27 | 0.96785 | 1.00891 | 1.02196 | 1.00344 | 5.00561 | 0.00561 |
| 28 | 0.94971 | 1.02315 | 1.00468 | 1.01765 | 5.01285 | 0.01285 |
| 29 | 0.99154 | 0.99840 | 1.01231 | 1.00124 | 5.00474 | 0.00474 |
| 30 | 0.96458 | 0.99526 | 1.00770 | 1.01668 | 5.00091 | 0.00091 |
| 31 | 0.95430 | 0.97879 | 1.02004 | 1.02368 | 5.00051 | 0.00051 |
| 32 | 0.98484 | 0.99387 | 1.02537 | 0.99879 | 5.00165 | 0.00165 |
| 33 | 1.02046 | 0.99072 | 1.00322 | 0.98882 | 4.99204 | -0.00796 |
| 34 | 1.01828 | 0.97469 | 0.99742 | 1.00135 | 4.99310 | -0.00690 |
| 35 | 0.98953 | 0.99379 | 1.01476 | 0.99930 | 4.99670 | -0.00330 |
| 36 | 0.99939 | 0.99719 | 1.01543 | 0.99431 | 5.00065 | 0.00065 |
| 37 | 1.00540 | 0.98893 | 1.01873 | 0.99582 | 5.00469 | 0.00469 |
| 38 | 0.95270 | 1.00047 | 1.00661 | 1.01998 | 4.99974 | -0.00026 |
| 39 | 1.02899 | 1.00575 | 1.00410 | 0.98289 | 5.00462 | 0.00462 |
| 40 | 0.98738 | 1.02240 | 0.98979 | 1.00215 | 5.00387 | 0.00387 |
| 41 | 0.96001 | 1.01986 | 1.01080 | 1.00677 | 5.00422 | 0.00422 |
| 42 | 0.98399 | 1.01351 | 0.99663 | 1.00356 | 5.00125 | 0.00125 |
| 43 | 0.95830 | 1.00468 | 1.01913 | 1.00655 | 4.99520 | -0.00480 |
| 44 | 0.94712 | 1.00454 | 1.02308 | 1.01077 | 4.99628 | -0.00372 |
| 45 | 0.98564 | 1.03524 | 0.99003 | 0.99355 | 4.99802 | -0.00198 |
| 46 | 0.98318 | 1.01189 | 0.99421 | 1.00507 | 4.99942 | -0.00058 |
| 47 | 0.99079 | 1.01043 | 0.99400 | 1.00827 | 5.01175 | 0.01175 |
| 48 | 1.02350 | 0.97963 | 0.99511 | 1.00483 | 5.00791 | 0.00791 |
| 49 | 0.99253 | 1.01395 | 0.99411 | 0.99918 | 4.99894 | -0.00106 |
| 50 | 0.95731 | 1.01014 | 1.00992 | 1.01149 | 5.00034 | 0.00034 |
| 51 | 0.97971 | 1.02138 | 1.00546 | 1.00301 | 5.01257 | 0.01257 |
| 52 | 1.01297 | 1.01459 | 0.99144 | 0.99060 | 5.00020 | 0.00020 |
| 53 | 0.98980 | 1.02804 | 1.00275 | 0.99561 | 5.01181 | 0.01181 |
| 54 | 0.99719 | 1.00342 | 1.00627 | 0.99706 | 5.00101 | 0.00101 |
| 55 | 1.00856 | 1.03138 | 1.00849 | 0.98038 | 5.00920 | 0.00920 |
| 56 | 0.97793 | 1.03585 | 1.00935 | 0.99106 | 5.00524 | 0.00524 |
| 57 | 1.01222 | 0.99432 | 1.00321 | 0.99175 | 4.99326 | -0.00674 |
| 58 | 1.01110 | 1.00860 | 1.01452 | 0.98273 | 4.99969 | -0.00031 |
| 59 | 1.01316 | 1.00709 | 1.00799 | 0.98616 | 5.00056 | 0.00056 |
| 60 | 1.02347 | 1.00402 | 1.00473 | 0.98349 | 4.99920 | -0.00080 |

CORRECTION RATE OF THIRD PASS

| COM1 | 100.3 % |
|---|---|
| COM2 | 100.0 % |
| COM3 | 99.6 % |
| COM4 | 98.9 % |
| MAX-MIN | 1.4 % |

FIG. 14

<COMPARATIVE EXAMPLE: FOURTH CORRECTION STEP>

| | | | | | MAX | 0.00598 | |
|---|---|---|---|---|---|---|---|
| 5 | | | | | MIN | -0.00576 | |
| NUMBER OF SHOTS | 1 | 1 | 1 | 2 | RANGE | 0.01174 | 0.23 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.95464 | 1.03507 | 1.00650 | 1.00250 | 5.00120 | 0.00120 |
| 2 | 0.97628 | 1.00418 | 1.01196 | 1.00468 | 5.00179 | 0.00179 |
| 3 | 0.96133 | 1.02855 | 1.00989 | 1.00101 | 5.00179 | 0.00179 |
| 4 | 1.05862 | 0.96285 | 1.00164 | 0.98859 | 5.00029 | 0.00029 |
| 5 | 1.04067 | 0.99096 | 0.99435 | 0.98652 | 4.99902 | -0.00098 |
| 6 | 1.01506 | 0.97205 | 1.00718 | 1.00388 | 5.00204 | 0.00204 |
| 7 | 1.04533 | 1.00676 | 0.96499 | 0.99185 | 5.00078 | 0.00078 |
| 8 | 1.01239 | 1.00419 | 1.00671 | 0.98835 | 4.99999 | -0.00001 |
| 9 | 1.01827 | 0.98455 | 1.01487 | 0.99330 | 5.00430 | 0.00430 |
| 10 | 1.05545 | 1.00414 | 0.98114 | 0.97676 | 4.99424 | -0.00576 |
| 11 | 1.01263 | 0.98355 | 1.00407 | 0.99969 | 4.99963 | -0.00037 |
| 12 | 0.98048 | 0.99919 | 0.99677 | 1.01412 | 5.00469 | 0.00469 |
| 13 | 1.03461 | 0.96724 | 0.98122 | 1.01040 | 5.00386 | 0.00386 |
| 14 | 0.97298 | 0.99406 | 1.00261 | 1.01816 | 5.00598 | 0.00598 |
| 15 | 0.98176 | 1.00067 | 0.99771 | 1.00973 | 4.99961 | -0.00039 |
| 16 | 0.94852 | 1.01850 | 0.99472 | 1.02101 | 5.00375 | 0.00375 |
| 17 | 0.97133 | 1.01915 | 0.98632 | 1.01299 | 5.00278 | 0.00278 |
| 18 | 0.96659 | 0.99443 | 0.97654 | 1.03205 | 5.00166 | 0.00166 |
| 19 | 0.95757 | 1.01202 | 1.00197 | 1.01374 | 4.99905 | -0.00095 |
| 20 | 1.03018 | 0.99923 | 0.99592 | 0.98859 | 5.00250 | 0.00250 |
| 21 | 1.03048 | 0.97719 | 0.98413 | 1.00369 | 4.99919 | -0.00081 |
| 22 | 0.94773 | 0.99406 | 1.01041 | 1.02461 | 5.00140 | 0.00140 |
| 23 | 1.02037 | 0.96639 | 0.97811 | 1.01740 | 4.99966 | -0.00034 |
| 24 | 1.02324 | 0.97101 | 0.99561 | 1.00527 | 5.00039 | 0.00039 |
| 25 | 1.03825 | 0.96487 | 1.00416 | 0.99537 | 4.99801 | -0.00199 |
| 26 | 0.98239 | 1.00645 | 0.99302 | 1.00906 | 4.99998 | -0.00002 |
| 27 | 0.96785 | 1.00891 | 1.01495 | 1.00344 | 4.99860 | -0.00140 |
| 28 | 0.94971 | 1.02315 | 0.99658 | 1.01765 | 5.00475 | 0.00475 |
| 29 | 0.99154 | 0.99840 | 1.00264 | 1.00124 | 4.99507 | -0.00493 |
| 30 | 0.96458 | 0.99526 | 1.00870 | 1.01668 | 5.00191 | 0.00191 |
| 31 | 0.95430 | 0.97879 | 1.02057 | 1.02368 | 5.00103 | 0.00103 |
| 32 | 0.98484 | 0.99387 | 1.02340 | 0.99879 | 4.99968 | -0.00032 |
| 33 | 1.02046 | 0.99072 | 1.01251 | 0.98882 | 5.00132 | 0.00132 |
| 34 | 1.01828 | 0.97469 | 1.00499 | 1.00135 | 5.00066 | 0.00066 |
| 35 | 0.98953 | 0.99379 | 1.01671 | 0.99930 | 4.99864 | -0.00136 |
| 36 | 0.99939 | 0.99719 | 1.01434 | 0.99431 | 4.99955 | -0.00045 |
| 37 | 1.00540 | 0.98893 | 1.00975 | 0.99582 | 4.99571 | -0.00429 |
| 38 | 0.95270 | 1.00047 | 1.00641 | 1.01998 | 4.99954 | -0.00046 |
| 39 | 1.02899 | 1.00575 | 1.00165 | 0.98289 | 5.00217 | 0.00217 |
| 40 | 0.98738 | 1.02240 | 0.98171 | 1.00215 | 4.99579 | -0.00421 |
| 41 | 0.96001 | 1.01986 | 1.00387 | 1.00677 | 4.99729 | -0.00271 |
| 42 | 0.98399 | 1.01351 | 0.99461 | 1.00356 | 4.99923 | -0.00077 |
| 43 | 0.95830 | 1.00468 | 1.02767 | 1.00655 | 5.00374 | 0.00374 |
| 44 | 0.94712 | 1.00454 | 1.03166 | 1.01077 | 5.00485 | 0.00485 |
| 45 | 0.98564 | 1.03524 | 0.98774 | 0.99355 | 4.99573 | -0.00427 |
| 46 | 0.98318 | 1.01189 | 0.99528 | 1.00507 | 5.00049 | 0.00049 |
| 47 | 0.99079 | 1.01043 | 0.98407 | 1.00827 | 5.00183 | 0.00183 |
| 48 | 1.02350 | 0.97963 | 0.98974 | 1.00483 | 5.00253 | 0.00253 |
| 49 | 0.99253 | 1.01395 | 0.99785 | 0.99918 | 5.00268 | 0.00268 |
| 50 | 0.95731 | 1.01014 | 1.00490 | 1.01149 | 4.99533 | -0.00467 |
| 51 | 0.97971 | 1.02138 | 0.99445 | 1.00301 | 5.00156 | 0.00156 |
| 52 | 1.01297 | 1.01459 | 0.99105 | 0.99060 | 4.99981 | -0.00019 |
| 53 | 0.98980 | 1.02804 | 0.99324 | 0.99561 | 5.00230 | 0.00230 |
| 54 | 0.99719 | 1.00342 | 1.00493 | 0.99706 | 4.99967 | -0.00033 |
| 55 | 1.00856 | 1.03138 | 0.99687 | 0.98038 | 4.99759 | -0.00241 |
| 56 | 0.97793 | 1.03585 | 1.00590 | 0.99106 | 5.00179 | 0.00179 |
| 57 | 1.01222 | 0.99432 | 1.00754 | 0.99175 | 4.99759 | -0.00241 |
| 58 | 1.01110 | 1.00860 | 1.01579 | 0.98273 | 5.00096 | 0.00096 |
| 59 | 1.01316 | 1.00709 | 1.00782 | 0.98616 | 5.00039 | 0.00039 |
| 60 | 1.02347 | 1.00402 | 1.00823 | 0.98349 | 5.00270 | 0.00270 |

CORRECTION RATE OF FOURTH PASS

| COM1 | 100.2 % |
|---|---|
| COM2 | 100.0 % |
| COM3 | 100.0 % |
| COM4 | 99.9 % |
| MAX-MIN | 0.3 % |

FIG. 15

< COMPARATIVE EXAMPLE: CALCULATION OF VARIATION IN AMOUNTS OF EJECTION AFTER CORRECTION >

| | | | | | MAX | 0.00244 | |
|---|---|---|---|---|---|---|---|
| | 5 | | | | MIN | -0.00237 | |
| NUMBER OF SHOTS | 1 | 1 | 1 | 2 | RANGE | 0.00481 | 0.10 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.95464 | 1.03507 | 1.00650 | 1.00223 | 5.00067 | 0.00067 |
| 2 | 0.97628 | 1.00418 | 1.01196 | 1.00352 | 4.99945 | -0.00055 |
| 3 | 0.96133 | 1.02855 | 1.00989 | 0.99985 | 4.99946 | -0.00054 |
| 4 | 1.05862 | 0.96285 | 1.00164 | 0.98818 | 4.99947 | -0.00053 |
| 5 | 1.04067 | 0.99096 | 0.99435 | 0.98792 | 5.00181 | 0.00181 |
| 6 | 1.01506 | 0.97205 | 1.00718 | 1.00269 | 4.99966 | -0.00034 |
| 7 | 1.04533 | 1.00676 | 0.96499 | 0.99151 | 5.00011 | 0.00011 |
| 8 | 1.01239 | 1.00419 | 1.00671 | 0.98803 | 4.99934 | -0.00066 |
| 9 | 1.01827 | 0.98455 | 1.01487 | 0.99140 | 5.00049 | 0.00049 |
| 10 | 1.05545 | 1.00414 | 0.98114 | 0.97845 | 4.99763 | -0.00237 |
| 11 | 1.01263 | 0.98355 | 1.00407 | 0.99975 | 4.99977 | -0.00023 |
| 12 | 0.98048 | 0.99919 | 0.99677 | 1.01182 | 5.00009 | 0.00009 |
| 13 | 1.03461 | 0.96724 | 0.98122 | 1.00818 | 4.99942 | -0.00058 |
| 14 | 0.97298 | 0.99406 | 1.00261 | 1.01570 | 5.00105 | 0.00105 |
| 15 | 0.98176 | 1.00067 | 0.99771 | 1.01089 | 5.00193 | 0.00193 |
| 16 | 0.94852 | 1.01850 | 0.99472 | 1.01904 | 4.99982 | -0.00018 |
| 17 | 0.97133 | 1.01915 | 0.98632 | 1.01107 | 4.99895 | -0.00105 |
| 18 | 0.96659 | 0.99443 | 0.97654 | 1.03116 | 4.99988 | -0.00012 |
| 19 | 0.95757 | 1.01202 | 1.00197 | 1.01390 | 4.99935 | -0.00065 |
| 20 | 1.03018 | 0.99923 | 0.99592 | 0.98740 | 5.00013 | 0.00013 |
| 21 | 1.03048 | 0.97719 | 0.98413 | 1.00532 | 5.00244 | 0.00244 |
| 22 | 0.94773 | 0.99406 | 1.01041 | 1.02418 | 5.00056 | 0.00056 |
| 23 | 1.02037 | 0.96639 | 0.97811 | 1.01853 | 5.00193 | 0.00193 |
| 24 | 1.02324 | 0.97101 | 0.99561 | 1.00526 | 5.00038 | 0.00038 |
| 25 | 1.03825 | 0.96487 | 1.00416 | 0.99713 | 5.00154 | 0.00154 |
| 26 | 0.98239 | 1.00645 | 0.99302 | 1.00873 | 4.99933 | -0.00067 |
| 27 | 0.96785 | 1.00891 | 1.01495 | 1.00526 | 5.00223 | 0.00223 |
| 28 | 0.94971 | 1.02315 | 0.99658 | 1.01560 | 5.00064 | 0.00064 |
| 29 | 0.99154 | 0.99840 | 1.00264 | 1.00269 | 4.99797 | -0.00203 |
| 30 | 0.96458 | 0.99526 | 1.00870 | 1.01549 | 4.99952 | -0.00048 |
| 31 | 0.95430 | 0.97879 | 1.02057 | 1.02341 | 5.00049 | 0.00049 |
| 32 | 0.98484 | 0.99387 | 1.02340 | 0.99912 | 5.00036 | 0.00036 |
| 33 | 1.02046 | 0.99072 | 1.01251 | 0.98799 | 4.99966 | -0.00034 |
| 34 | 1.01828 | 0.97469 | 1.00499 | 1.00063 | 4.99921 | -0.00079 |
| 35 | 0.98953 | 0.99379 | 1.01671 | 0.99980 | 4.99964 | -0.00036 |
| 36 | 0.99939 | 0.99719 | 1.01434 | 0.99533 | 5.00158 | 0.00158 |
| 37 | 1.00540 | 0.98893 | 1.00975 | 0.99717 | 4.99842 | -0.00158 |
| 38 | 0.95270 | 1.00047 | 1.00641 | 1.02024 | 5.00007 | 0.00007 |
| 39 | 1.02899 | 1.00575 | 1.00165 | 0.98211 | 5.00061 | 0.00061 |
| 40 | 0.98738 | 1.02240 | 0.98171 | 1.00349 | 4.99846 | -0.00154 |
| 41 | 0.96001 | 1.01986 | 1.00387 | 1.00850 | 5.00073 | 0.00073 |
| 42 | 0.98399 | 1.01351 | 0.99461 | 1.00380 | 4.99970 | -0.00030 |
| 43 | 0.95830 | 1.00468 | 1.02767 | 1.00474 | 5.00012 | 0.00012 |
| 44 | 0.94712 | 1.00454 | 1.03166 | 1.00895 | 5.00121 | 0.00121 |
| 45 | 0.98564 | 1.03524 | 0.98774 | 0.99570 | 5.00001 | 0.00001 |
| 46 | 0.98318 | 1.01189 | 0.99528 | 1.00451 | 4.99937 | -0.00063 |
| 47 | 0.99079 | 1.01043 | 0.98407 | 1.00675 | 4.99879 | -0.00121 |
| 48 | 1.02350 | 0.97963 | 0.98974 | 1.00364 | 5.00014 | 0.00014 |
| 49 | 0.99253 | 1.01395 | 0.99785 | 0.99759 | 4.99950 | -0.00050 |
| 50 | 0.95731 | 1.01014 | 1.00490 | 1.01384 | 5.00003 | 0.00003 |
| 51 | 0.97971 | 1.02138 | 0.99445 | 1.00225 | 5.00005 | 0.00005 |
| 52 | 1.01297 | 1.01459 | 0.99105 | 0.99083 | 5.00027 | 0.00027 |
| 53 | 0.98980 | 1.02804 | 0.99324 | 0.99472 | 5.00052 | 0.00052 |
| 54 | 0.99719 | 1.00342 | 1.00493 | 0.99693 | 4.99940 | -0.00060 |
| 55 | 1.00856 | 1.03138 | 0.99687 | 0.98223 | 5.00128 | 0.00128 |
| 56 | 0.97793 | 1.03585 | 1.00590 | 0.99009 | 4.99986 | -0.00014 |
| 57 | 1.01222 | 0.99432 | 1.00754 | 0.99286 | 4.99982 | -0.00018 |
| 58 | 1.01110 | 1.00860 | 1.01579 | 0.98210 | 4.99969 | -0.00031 |
| 59 | 1.01316 | 1.00709 | 1.00782 | 0.98593 | 4.99993 | -0.00007 |
| 60 | 1.02347 | 1.00402 | 1.00823 | 0.98233 | 5.00038 | 0.00038 |

FIG. 16

<EXAMPLE: FIRST CORRECTION STEP>

| | | | | | MAX | 0.09801 | |
|---|---|---|---|---|---|---|---|
| 5 | | | | | MIN | -0.07126 | |
| NUMBER OF SHOTS | 2 | 1 | 1 | 1 | RANGE | 0.16927 | 3.39 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.99643 | 1.02080 | 1.00433 | 1.00250 | 5.02049 | 0.02049 |
| 2 | 1.00221 | 1.01157 | 1.01173 | 1.00468 | 5.03239 | 0.03239 |
| 3 | 1.00872 | 1.01582 | 1.00965 | 1.00101 | 5.04393 | 0.04393 |
| 4 | 1.02486 | 0.99455 | 1.00141 | 0.98859 | 5.03427 | 0.03427 |
| 5 | 1.00664 | 0.98868 | 0.99595 | 0.98652 | 4.98444 | -0.01556 |
| 6 | 1.02050 | 0.97229 | 1.00532 | 1.00388 | 5.02249 | 0.02249 |
| 7 | 1.00688 | 0.98796 | 0.97378 | 0.99185 | 4.96735 | -0.03265 |
| 8 | 1.01712 | 1.00282 | 1.00927 | 0.98835 | 5.03468 | 0.03468 |
| 9 | 1.01100 | 0.98337 | 1.00534 | 0.99330 | 5.00402 | 0.00402 |
| 10 | 1.01794 | 0.98795 | 0.97170 | 0.97676 | 4.97227 | -0.02773 |
| 11 | 1.01366 | 0.98927 | 1.00397 | 0.99969 | 5.02024 | 0.02024 |
| 12 | 1.00774 | 1.00677 | 0.98858 | 1.01412 | 5.02495 | 0.02495 |
| 13 | 0.99346 | 0.98699 | 0.97222 | 1.01040 | 4.95653 | -0.04347 |
| 14 | 1.03253 | 1.01716 | 0.99609 | 1.01816 | 5.09647 | 0.09647 |
| 15 | 1.00330 | 0.99775 | 0.99871 | 1.00973 | 5.01280 | 0.01280 |
| 16 | 1.00162 | 0.99555 | 1.00271 | 1.02101 | 5.02251 | 0.02251 |
| 17 | 0.99033 | 1.00527 | 0.99576 | 1.01299 | 4.99469 | -0.00531 |
| 18 | 0.99593 | 0.99588 | 0.97976 | 1.03205 | 4.99955 | -0.00045 |
| 19 | 0.97028 | 1.00935 | 1.00325 | 1.01374 | 4.96690 | -0.03310 |
| 20 | 0.98694 | 0.97920 | 0.98707 | 0.98859 | 4.92874 | -0.07126 |
| 21 | 1.00099 | 0.99296 | 0.98550 | 1.00369 | 4.98414 | -0.01586 |
| 22 | 0.98863 | 1.01474 | 1.00149 | 1.02461 | 5.01809 | 0.01809 |
| 23 | 0.98270 | 0.98328 | 0.98717 | 1.01740 | 4.95323 | -0.04677 |
| 24 | 0.99029 | 0.99018 | 0.99858 | 1.00527 | 4.97461 | -0.02539 |
| 25 | 0.99737 | 0.98581 | 1.00319 | 0.99537 | 4.97911 | -0.02089 |
| 26 | 0.98445 | 0.98762 | 1.00205 | 1.00906 | 4.96764 | -0.03236 |
| 27 | 1.00451 | 0.99269 | 1.02196 | 1.00344 | 5.02712 | 0.02712 |
| 28 | 0.99895 | 1.00499 | 1.00468 | 1.01765 | 5.02522 | 0.02522 |
| 29 | 1.00573 | 1.00436 | 1.01231 | 1.00124 | 5.02939 | 0.02939 |
| 30 | 1.00038 | 1.00013 | 1.00770 | 1.01668 | 5.02526 | 0.02526 |
| 31 | 0.99237 | 0.97268 | 1.02004 | 1.02368 | 5.00114 | 0.00114 |
| 32 | 0.99589 | 0.99391 | 1.02537 | 0.99879 | 5.00985 | 0.00985 |
| 33 | 0.98975 | 1.00334 | 1.00322 | 0.98882 | 4.97488 | -0.02512 |
| 34 | 0.98058 | 0.99156 | 0.99742 | 1.00135 | 4.95149 | -0.04851 |
| 35 | 1.01289 | 0.99393 | 1.01476 | 0.99930 | 5.03377 | 0.03377 |
| 36 | 1.00483 | 0.98953 | 1.01543 | 0.99431 | 5.00893 | 0.00893 |
| 37 | 0.96348 | 0.99219 | 1.01873 | 0.99582 | 4.93371 | -0.06629 |
| 38 | 0.99102 | 0.99505 | 1.00661 | 1.01998 | 5.00369 | 0.00369 |
| 39 | 0.98701 | 1.01108 | 1.00410 | 0.98289 | 4.97210 | -0.02790 |
| 40 | 0.98771 | 1.02238 | 0.98979 | 1.00215 | 4.98975 | -0.01025 |
| 41 | 1.00498 | 1.00345 | 1.01080 | 1.00677 | 5.03099 | 0.03099 |
| 42 | 1.00387 | 1.00687 | 0.99663 | 1.00356 | 5.01480 | 0.01480 |
| 43 | 1.00002 | 1.01840 | 1.01913 | 1.00655 | 5.04412 | 0.04412 |
| 44 | 0.98085 | 1.02113 | 1.02308 | 1.01077 | 5.01669 | 0.01669 |
| 45 | 0.98428 | 1.03281 | 0.99003 | 0.99355 | 4.98495 | -0.01505 |
| 46 | 1.00158 | 1.01018 | 0.99421 | 1.00507 | 5.01261 | 0.01261 |
| 47 | 0.99952 | 0.99405 | 0.99400 | 1.00827 | 4.99535 | -0.00465 |
| 48 | 0.99325 | 0.99336 | 0.99511 | 1.00483 | 4.97980 | -0.02020 |
| 49 | 0.99463 | 1.01745 | 0.99411 | 0.99918 | 4.99999 | -0.00001 |
| 50 | 0.97395 | 1.01280 | 1.00992 | 1.01149 | 4.98211 | -0.01789 |
| 51 | 1.00713 | 1.00311 | 1.00546 | 1.00301 | 5.02584 | 0.02584 |
| 52 | 1.01442 | 1.00985 | 0.99144 | 0.99060 | 5.02072 | 0.02072 |
| 53 | 1.01443 | 1.00345 | 1.00275 | 0.99561 | 5.03066 | 0.03066 |
| 54 | 1.01478 | 1.00645 | 1.00627 | 0.99706 | 5.03935 | 0.03935 |
| 55 | 1.00907 | 1.00883 | 1.00849 | 0.98038 | 5.01584 | 0.01584 |
| 56 | 1.02546 | 1.01117 | 1.00935 | 0.99106 | 5.06250 | 0.06250 |
| 57 | 1.00427 | 1.00909 | 1.00321 | 0.99175 | 5.01259 | 0.01259 |
| 58 | 1.04169 | 1.01738 | 1.01452 | 0.98273 | 5.09801 | 0.09801 |
| 59 | 1.01663 | 1.00324 | 1.00799 | 0.98616 | 5.03066 | 0.03066 |
| 60 | 0.98379 | 0.98817 | 1.00473 | 0.98349 | 4.94397 | -0.05603 |

CORRECTION RATE OF FIRST PASS

| COM1 | 101.5 % |
|---|---|
| COM2 | 99.9 % |
| COM3 | 98.9 % |
| COM4 | 97.5 % |
| MAX-MIN | 4.0 % |

FIG. 17

<EXAMPLE: SECOND CORRECTION STEP>

| | | | | | MAX | 0.02702 | |
|---|---|---|---|---|---|---|---|
| 5 | | | | | MIN | -0.02566 | |
| NUMBER OF SHOTS | 2 | 1 | 1 | 1 | RANGE | 0.05268 | 1.05 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.97899 | 1.02080 | 1.00433 | 1.00250 | 4.98561 | -0.01439 |
| 2 | 0.98859 | 1.01157 | 1.01173 | 1.00468 | 5.00516 | 0.00516 |
| 3 | 0.98585 | 1.01582 | 1.00965 | 1.00101 | 4.99819 | -0.00181 |
| 4 | 1.01046 | 0.99455 | 1.00141 | 0.98859 | 5.00546 | 0.00546 |
| 5 | 1.01630 | 0.98868 | 0.99595 | 0.98652 | 4.98376 | 0.00376 |
| 6 | 1.01353 | 0.97229 | 1.00532 | 1.00388 | 5.00856 | 0.00856 |
| 7 | 1.02085 | 0.98796 | 0.97378 | 0.99185 | 4.99529 | -0.00471 |
| 8 | 1.00316 | 1.00282 | 1.00927 | 0.98835 | 5.00676 | 0.00676 |
| 9 | 0.99617 | 0.98337 | 1.00534 | 0.99330 | 4.97434 | -0.02566 |
| 10 | 1.03074 | 0.98795 | 0.97170 | 0.97676 | 4.99787 | -0.00213 |
| 11 | 1.00341 | 0.98927 | 1.00397 | 0.99969 | 4.99974 | -0.00026 |
| 12 | 1.00047 | 1.00677 | 0.98858 | 1.01412 | 5.01041 | 0.01041 |
| 13 | 1.01038 | 0.98699 | 0.97222 | 1.01040 | 4.99037 | -0.00963 |
| 14 | 0.99780 | 1.01716 | 0.99609 | 1.01816 | 5.02702 | 0.02702 |
| 15 | 0.99414 | 0.99775 | 0.99871 | 1.00973 | 4.99448 | -0.00552 |
| 16 | 0.99280 | 0.99555 | 1.00271 | 1.02101 | 5.00487 | 0.00487 |
| 17 | 0.99113 | 1.00527 | 0.99576 | 1.01299 | 4.99628 | -0.00372 |
| 18 | 1.00141 | 0.99588 | 0.97976 | 1.03205 | 5.01052 | 0.01052 |
| 19 | 0.97940 | 1.00935 | 1.00325 | 1.01374 | 4.98513 | -0.01487 |
| 20 | 1.01367 | 0.97920 | 0.98707 | 0.98859 | 4.98220 | -0.01780 |
| 21 | 1.01396 | 0.99296 | 0.98550 | 1.00369 | 5.01008 | 0.01008 |
| 22 | 0.97968 | 1.01474 | 1.00149 | 1.02461 | 5.00019 | 0.00019 |
| 23 | 1.00401 | 0.98328 | 0.98717 | 1.01740 | 4.99586 | -0.00414 |
| 24 | 1.00684 | 0.99018 | 0.99858 | 1.00527 | 5.00771 | 0.00771 |
| 25 | 1.00455 | 0.98581 | 1.00319 | 0.99537 | 4.99348 | -0.00652 |
| 26 | 1.00207 | 0.98762 | 1.00205 | 1.00906 | 5.00288 | 0.00288 |
| 27 | 0.98517 | 0.99269 | 1.02196 | 1.00344 | 4.98844 | -0.01156 |
| 28 | 0.99375 | 1.00499 | 1.00468 | 1.01765 | 5.01483 | 0.01483 |
| 29 | 0.98654 | 1.00436 | 1.01231 | 1.00124 | 4.99100 | -0.00900 |
| 30 | 0.98184 | 1.00013 | 1.00770 | 1.01668 | 4.98819 | -0.01181 |
| 31 | 0.98648 | 0.97268 | 1.02004 | 1.02368 | 4.98936 | -0.01064 |
| 32 | 0.97987 | 0.99391 | 1.02537 | 0.99879 | 4.97781 | -0.02219 |
| 33 | 1.00410 | 1.00334 | 1.00322 | 0.98882 | 5.00359 | 0.00359 |
| 34 | 1.00196 | 0.99156 | 0.99742 | 1.00135 | 4.99425 | -0.00575 |
| 35 | 0.99985 | 0.99393 | 1.01476 | 0.99930 | 5.00768 | 0.00768 |
| 36 | 1.00240 | 0.98953 | 1.01543 | 0.99431 | 5.00408 | 0.00408 |
| 37 | 0.98928 | 0.99219 | 1.01873 | 0.99582 | 4.98530 | -0.01470 |
| 38 | 0.98482 | 0.99505 | 1.00661 | 1.01998 | 4.99128 | -0.00872 |
| 39 | 0.99559 | 1.01108 | 1.00410 | 0.98289 | 4.98926 | -0.01074 |
| 40 | 0.99035 | 1.02238 | 0.98979 | 1.00215 | 4.99502 | -0.00498 |
| 41 | 0.99237 | 1.00345 | 1.01080 | 1.00677 | 5.00577 | 0.00577 |
| 42 | 0.99425 | 1.00687 | 0.99663 | 1.00356 | 4.99556 | -0.00444 |
| 43 | 0.97545 | 1.01840 | 1.01913 | 1.00655 | 4.99497 | -0.00503 |
| 44 | 0.96406 | 1.02113 | 1.02308 | 1.01077 | 4.98311 | -0.01689 |
| 45 | 0.98861 | 1.03281 | 0.99003 | 0.99355 | 4.99361 | -0.00639 |
| 46 | 0.99343 | 1.01018 | 0.99421 | 1.00507 | 4.99630 | -0.00370 |
| 47 | 1.01064 | 0.99405 | 0.99400 | 1.00827 | 5.01760 | 0.01760 |
| 48 | 1.00709 | 0.99336 | 0.99511 | 1.00483 | 5.00749 | 0.00749 |
| 49 | 0.99551 | 1.01745 | 0.99411 | 0.99918 | 5.00176 | 0.00176 |
| 50 | 0.97913 | 1.01280 | 1.00992 | 1.01149 | 4.99247 | -0.00753 |
| 51 | 1.00204 | 1.00311 | 1.00546 | 1.00301 | 5.01565 | 0.01565 |
| 52 | 1.00374 | 1.00985 | 0.99144 | 0.99060 | 4.99936 | -0.00064 |
| 53 | 1.00012 | 1.00345 | 1.00275 | 0.99561 | 5.00204 | 0.00204 |
| 54 | 0.99216 | 1.00645 | 1.00627 | 0.99706 | 4.99410 | -0.00590 |
| 55 | 0.99937 | 1.00883 | 1.00849 | 0.98038 | 4.99644 | -0.00356 |
| 56 | 0.99542 | 1.01117 | 1.00935 | 0.99106 | 5.00242 | 0.00242 |
| 57 | 0.98764 | 1.00909 | 1.00321 | 0.99175 | 4.97933 | -0.02067 |
| 58 | 1.00600 | 1.01738 | 1.01452 | 0.98273 | 5.02663 | 0.02663 |
| 59 | 1.00392 | 1.00324 | 1.00799 | 0.98616 | 5.00524 | 0.00524 |
| 60 | 1.00706 | 0.98817 | 1.00473 | 0.98349 | 4.99052 | -0.00948 |

CORRECTION RATE OF SECOND PASS

| COM1 | 101.4 % |
|---|---|
| COM2 | 100.4 % |
| COM3 | 99.7 % |
| COM4 | 99.1 % |
| MAX-MIN | 2.3 % |

FIG. 18

<EXAMPLE: THIRD CORRECTION STEP>

| | | | | | MAX | 0.00777 | |
|---|---|---|---|---|---|---|---|
| 5 | | | | | MIN | -0.00640 | |
| NUMBER OF SHOTS | 2 | 1 | 1 | 1 | RANGE | 0.01417 | 0.28 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.97899 | 1.03415 | 1.00433 | 1.00250 | 4.99895 | -0.00105 |
| 2 | 0.98859 | 1.00759 | 1.01173 | 1.00468 | 5.00118 | 0.00118 |
| 3 | 0.98585 | 1.01881 | 1.00965 | 1.00101 | 5.00118 | 0.00118 |
| 4 | 1.01046 | 0.98952 | 1.00141 | 0.98859 | 5.00043 | 0.00043 |
| 5 | 1.01630 | 0.98532 | 0.99595 | 0.98652 | 5.00039 | 0.00039 |
| 6 | 1.01353 | 0.96652 | 1.00532 | 1.00388 | 5.00278 | 0.00278 |
| 7 | 1.02085 | 0.99321 | 0.97378 | 0.99185 | 5.00054 | 0.00054 |
| 8 | 1.00316 | 0.99847 | 1.00927 | 0.98835 | 5.00241 | 0.00241 |
| 9 | 0.99617 | 1.00262 | 1.00534 | 0.99330 | 4.99360 | -0.00640 |
| 10 | 1.03074 | 0.99062 | 0.97170 | 0.97676 | 5.00054 | 0.00054 |
| 11 | 1.00341 | 0.99227 | 1.00397 | 0.99969 | 5.00274 | 0.00274 |
| 12 | 1.00047 | 1.00028 | 0.98858 | 1.01412 | 5.00392 | 0.00392 |
| 13 | 1.01038 | 0.99854 | 0.97222 | 1.01040 | 5.00192 | 0.00192 |
| 14 | 0.99780 | 0.99767 | 0.99609 | 1.01816 | 5.00753 | 0.00753 |
| 15 | 0.99414 | 1.00271 | 0.99871 | 1.00973 | 4.99943 | -0.00057 |
| 16 | 0.99280 | 0.98600 | 1.00271 | 1.02101 | 4.99532 | -0.00468 |
| 17 | 0.99113 | 1.01489 | 0.99576 | 1.01299 | 5.00590 | 0.00590 |
| 18 | 1.00141 | 0.98450 | 0.97976 | 1.03205 | 4.99913 | -0.00087 |
| 19 | 0.97940 | 1.02362 | 1.00325 | 1.01374 | 4.99940 | -0.00060 |
| 20 | 1.01367 | 0.99505 | 0.98707 | 0.98859 | 4.99804 | -0.00196 |
| 21 | 1.01396 | 0.98074 | 0.98550 | 1.00369 | 4.99786 | -0.00214 |
| 22 | 0.97968 | 1.01667 | 1.00149 | 1.02461 | 5.00212 | 0.00212 |
| 23 | 1.00401 | 0.98837 | 0.98717 | 1.01740 | 5.00096 | 0.00096 |
| 24 | 1.00684 | 0.98544 | 0.99858 | 1.00527 | 5.00297 | 0.00297 |
| 25 | 1.00455 | 0.99610 | 1.00319 | 0.99537 | 5.00376 | 0.00376 |
| 26 | 1.00207 | 0.98525 | 1.00205 | 1.00906 | 5.00050 | 0.00050 |
| 27 | 0.98517 | 1.00469 | 1.02196 | 1.00344 | 5.00043 | 0.00043 |
| 28 | 0.99375 | 0.99050 | 1.00468 | 1.01765 | 5.00034 | 0.00034 |
| 29 | 0.98654 | 1.01672 | 1.01231 | 1.00124 | 5.00336 | 0.00336 |
| 30 | 0.98184 | 1.01353 | 1.00770 | 1.01668 | 5.00159 | 0.00159 |
| 31 | 0.98648 | 0.98079 | 1.02004 | 1.02368 | 4.99747 | -0.00253 |
| 32 | 0.97987 | 1.01211 | 1.02537 | 0.99879 | 4.99601 | -0.00399 |
| 33 | 1.00410 | 0.99431 | 1.00322 | 0.98882 | 4.99457 | -0.00543 |
| 34 | 1.00196 | 0.99686 | 0.99742 | 1.00135 | 4.99956 | -0.00044 |
| 35 | 0.99985 | 0.98814 | 1.01476 | 0.99930 | 5.00190 | 0.00190 |
| 36 | 1.00240 | 0.98054 | 1.01543 | 0.99431 | 4.99510 | -0.00490 |
| 37 | 0.98928 | 1.00708 | 1.01873 | 0.99582 | 5.00019 | 0.00019 |
| 38 | 0.98482 | 1.00251 | 1.00661 | 1.01998 | 4.99874 | -0.00126 |
| 39 | 0.99559 | 1.02421 | 1.00410 | 0.98289 | 5.00239 | 0.00239 |
| 40 | 0.99035 | 1.02351 | 0.98979 | 1.00215 | 4.99615 | -0.00385 |
| 41 | 0.99237 | 0.99837 | 1.01080 | 1.00677 | 5.00069 | 0.00069 |
| 42 | 0.99425 | 1.00774 | 0.99663 | 1.00356 | 4.99642 | -0.00358 |
| 43 | 0.97545 | 1.01961 | 1.01913 | 1.00655 | 4.99618 | -0.00382 |
| 44 | 0.96406 | 1.03705 | 1.02308 | 1.01077 | 4.99903 | -0.00097 |
| 45 | 0.98861 | 1.03735 | 0.99003 | 0.99355 | 4.99814 | -0.00186 |
| 46 | 0.99343 | 1.01395 | 0.99421 | 1.00507 | 5.00008 | 0.00008 |
| 47 | 1.01064 | 0.97819 | 0.99400 | 1.00827 | 5.00174 | 0.00174 |
| 48 | 1.00709 | 0.98319 | 0.99511 | 1.00483 | 4.99731 | -0.00269 |
| 49 | 0.99551 | 1.01505 | 0.99411 | 0.99918 | 4.99937 | 0.00063 |
| 50 | 0.97913 | 1.01909 | 1.00992 | 1.01149 | 4.99876 | -0.00124 |
| 51 | 1.00204 | 0.98879 | 1.00546 | 1.00301 | 5.00133 | 0.00133 |
| 52 | 1.00374 | 1.00882 | 0.99144 | 0.99060 | 4.99833 | -0.00167 |
| 53 | 1.00012 | 0.99524 | 1.00275 | 0.99561 | 4.99384 | -0.00616 |
| 54 | 0.99216 | 1.01231 | 1.00627 | 0.99706 | 4.99996 | -0.00004 |
| 55 | 0.99937 | 1.00965 | 1.00849 | 0.98038 | 4.99725 | -0.00275 |
| 56 | 0.99542 | 1.00280 | 1.00935 | 0.99106 | 4.99406 | -0.00594 |
| 57 | 0.98764 | 1.02650 | 1.00321 | 0.99175 | 4.99674 | -0.00326 |
| 58 | 1.00600 | 0.99852 | 1.01452 | 0.98273 | 5.00777 | 0.00777 |
| 59 | 1.00392 | 0.99821 | 1.00799 | 0.98616 | 5.00020 | 0.00020 |
| 60 | 1.00706 | 0.99717 | 1.00473 | 0.98349 | 4.99952 | -0.00048 |

CORRECTION RATE OF THIRD PASS

| COM1 | 100.4 % |
|---|---|
| COM2 | 100.2 % |
| COM3 | 100.0 % |
| COM4 | 99.7 % |
| MAX-MIN | 0.7 % |

FIG. 19

<EXAMPLE: FOURTH CORRECTION STEP>

| | | | | | MAX | 0.00284 | |
|---|---|---|---|---|---|---|---|
| 5 | | | | | MIN | -0.00260 | |
| NUMBER OF SHOTS | 2 | 1 | 1 | 1 | RANGE | 0.00544 | 0.11 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.97899 | 1.03415 | 1.00433 | 1.00250 | 4.99895 | -0.00105 |
| 2 | 0.98859 | 1.00759 | 1.01173 | 1.00468 | 5.00118 | 0.00118 |
| 3 | 0.98585 | 1.01881 | 1.00965 | 1.00101 | 5.00118 | 0.00118 |
| 4 | 1.01046 | 0.98952 | 1.00141 | 0.98859 | 5.00043 | 0.00043 |
| 5 | 1.01630 | 0.98532 | 0.99519 | 0.98652 | 4.99963 | -0.00037 |
| 6 | 1.01353 | 0.96652 | 1.00212 | 1.00388 | 4.99958 | -0.00042 |
| 7 | 1.02085 | 0.99321 | 0.97398 | 0.99185 | 5.00073 | 0.00073 |
| 8 | 1.00316 | 0.99847 | 1.00756 | 0.98835 | 5.00071 | 0.00071 |
| 9 | 0.99617 | 1.00262 | 1.01029 | 0.99330 | 4.99854 | -0.00146 |
| 10 | 1.03074 | 0.99062 | 0.96932 | 0.97676 | 4.99817 | -0.00183 |
| 11 | 1.00341 | 0.99227 | 1.00191 | 0.99969 | 5.00068 | 0.00068 |
| 12 | 1.00047 | 1.00028 | 0.98476 | 1.01412 | 5.00010 | 0.00010 |
| 13 | 1.01038 | 0.99854 | 0.96939 | 1.01040 | 4.99910 | -0.00090 |
| 14 | 0.99780 | 0.99767 | 0.99053 | 1.01816 | 5.00197 | 0.00197 |
| 15 | 0.99414 | 1.00271 | 0.99855 | 1.00973 | 4.99928 | -0.00072 |
| 16 | 0.99280 | 0.98600 | 1.00679 | 1.02101 | 4.99941 | -0.00059 |
| 17 | 0.99113 | 1.01489 | 0.99074 | 1.01299 | 5.00088 | 0.00088 |
| 18 | 1.00141 | 0.98450 | 0.98199 | 1.03205 | 5.00136 | 0.00136 |
| 19 | 0.97940 | 1.02362 | 1.00281 | 1.01374 | 4.99897 | -0.00103 |
| 20 | 1.01367 | 0.99505 | 0.98865 | 0.98859 | 4.99962 | -0.00038 |
| 21 | 1.01396 | 0.98074 | 0.98685 | 1.00369 | 4.99921 | -0.00079 |
| 22 | 0.97968 | 1.01667 | 0.99823 | 1.02461 | 4.99886 | -0.00114 |
| 23 | 1.00401 | 0.98837 | 0.98723 | 1.01740 | 5.00102 | 0.00102 |
| 24 | 1.00684 | 0.98544 | 0.99645 | 1.00527 | 5.00083 | 0.00083 |
| 25 | 1.00455 | 0.99610 | 0.99912 | 0.99537 | 4.99969 | -0.00031 |
| 26 | 1.00207 | 0.98525 | 1.00227 | 1.00906 | 5.00072 | 0.00072 |
| 27 | 0.98517 | 1.00469 | 1.01950 | 1.00344 | 4.99797 | -0.00203 |
| 28 | 0.99375 | 0.99050 | 1.00393 | 1.01765 | 4.99959 | -0.00041 |
| 29 | 0.98654 | 1.01672 | 1.01004 | 1.00124 | 5.00109 | 0.00109 |
| 30 | 0.98184 | 1.01353 | 1.00653 | 1.01668 | 5.00042 | 0.00042 |
| 31 | 0.98648 | 0.98079 | 1.02319 | 1.02368 | 5.00061 | 0.00061 |
| 32 | 0.97987 | 1.01211 | 1.02911 | 0.99879 | 4.99975 | -0.00025 |
| 33 | 1.00410 | 0.99431 | 1.00793 | 0.98882 | 4.99927 | -0.00073 |
| 34 | 1.00196 | 0.99686 | 0.99766 | 1.00135 | 4.99979 | -0.00021 |
| 35 | 0.99985 | 0.98814 | 1.01160 | 0.99930 | 4.99874 | -0.00126 |
| 36 | 1.00240 | 0.98054 | 1.01999 | 0.99431 | 4.99966 | -0.00034 |
| 37 | 0.98928 | 1.00708 | 1.01916 | 0.99582 | 5.00061 | 0.00061 |
| 38 | 0.98482 | 1.00251 | 1.00899 | 1.01998 | 5.00112 | 0.00112 |
| 39 | 0.99559 | 1.02421 | 1.00250 | 0.98289 | 5.00079 | 0.00079 |
| 40 | 0.99035 | 1.02351 | 0.99363 | 1.00215 | 4.99999 | -0.00001 |
| 41 | 0.99237 | 0.99837 | 1.00837 | 1.00677 | 4.99826 | -0.00174 |
| 42 | 0.99425 | 1.00774 | 1.00016 | 1.00356 | 4.99995 | -0.00005 |
| 43 | 0.97545 | 1.01961 | 1.02302 | 1.00655 | 5.00007 | 0.00007 |
| 44 | 0.96406 | 1.03705 | 1.02413 | 1.01077 | 5.00008 | 0.00008 |
| 45 | 0.98861 | 1.03735 | 0.98928 | 0.99355 | 4.99740 | -0.00260 |
| 46 | 0.99343 | 1.01395 | 0.99281 | 1.00507 | 4.99869 | -0.00131 |
| 47 | 1.01064 | 0.97819 | 0.99173 | 1.00827 | 4.99948 | -0.00052 |
| 48 | 1.00709 | 0.98319 | 0.99853 | 1.00483 | 5.00073 | 0.00073 |
| 49 | 0.99551 | 1.01505 | 0.99439 | 0.99918 | 4.99965 | -0.00035 |
| 50 | 0.97913 | 1.01909 | 1.01103 | 1.01149 | 4.99987 | -0.00013 |
| 51 | 1.00204 | 0.98879 | 1.00485 | 1.00301 | 5.00073 | 0.00073 |
| 52 | 1.00374 | 1.00882 | 0.99307 | 0.99060 | 4.99996 | -0.00004 |
| 53 | 1.00012 | 0.99524 | 1.00829 | 0.99561 | 4.99938 | -0.00062 |
| 54 | 0.99216 | 1.01231 | 1.00698 | 0.99706 | 5.00067 | 0.00067 |
| 55 | 0.99937 | 1.00965 | 1.01197 | 0.98038 | 5.00074 | 0.00074 |
| 56 | 0.99542 | 1.00280 | 1.01483 | 0.99106 | 4.99954 | -0.00046 |
| 57 | 0.98764 | 1.02650 | 1.00592 | 0.99175 | 4.99946 | -0.00054 |
| 58 | 1.00600 | 0.99852 | 1.00959 | 0.98273 | 5.00284 | 0.00284 |
| 59 | 1.00392 | 0.99821 | 1.00799 | 0.98616 | 5.00020 | 0.00020 |
| 60 | 1.00706 | 0.99717 | 1.00473 | 0.98349 | 4.99952 | -0.00048 |

CORRECTION RATE OF FOURTH PASS

| COM1 | 100.1 % |
|---|---|
| COM2 | 100.1 % |
| COM3 | 100.0 % |
| COM4 | 99.9 % |
| MAX-MIN | 0.3 % |

FIG. 20

<EXAMPLE: CALCULATION OF VARIATION IN AMOUNTS OF EJECTION AFTER CORRECTION>

| | | | | | MAX | 0.00076 | |
|---|---|---|---|---|---|---|---|
| 5 | | | | | MIN | -0.00078 | |
| NUMBER OF SHOTS | 2 | 1 | 1 | 1 | RANGE | 0.00154 | 0.03 % |

| EJECTION REGION | FIRST PASS | SECOND PASS | THIRD PASS | FOURTH PASS | TOTAL | AMOUNT OF DEVIATION |
|---|---|---|---|---|---|---|
| 1 | 0.97899 | 1.03415 | 1.00433 | 1.00363 | 5.00008 | 0.00008 |
| 2 | 0.98859 | 1.00759 | 1.01173 | 1.00388 | 5.00037 | 0.00037 |
| 3 | 0.98585 | 1.01881 | 1.00965 | 1.00021 | 5.00037 | 0.00037 |
| 4 | 1.01046 | 0.98952 | 1.00141 | 0.98779 | 4.99963 | -0.00037 |
| 5 | 1.01630 | 0.98532 | 0.99519 | 0.98688 | 4.99999 | -0.00001 |
| 6 | 1.01353 | 0.96652 | 1.00212 | 1.00469 | 5.00040 | 0.00040 |
| 7 | 1.02085 | 0.99321 | 0.97398 | 0.99127 | 5.00015 | 0.00015 |
| 8 | 1.00316 | 0.99847 | 1.00756 | 0.98778 | 5.00014 | 0.00014 |
| 9 | 0.99617 | 1.00262 | 1.01029 | 0.99463 | 4.99987 | -0.00013 |
| 10 | 1.03074 | 0.99062 | 0.96932 | 0.97826 | 4.99967 | -0.00033 |
| 11 | 1.00341 | 0.99227 | 1.00191 | 0.99876 | 4.99975 | -0.00025 |
| 12 | 1.00047 | 1.00028 | 0.98476 | 1.01425 | 5.00023 | 0.00023 |
| 13 | 1.01038 | 0.99854 | 0.96939 | 1.01146 | 5.00016 | 0.00016 |
| 14 | 0.99780 | 0.99767 | 0.99053 | 1.01658 | 5.00038 | 0.00038 |
| 15 | 0.99414 | 1.00271 | 0.99855 | 1.01070 | 5.00025 | 0.00025 |
| 16 | 0.99280 | 0.98600 | 1.00679 | 1.02148 | 4.99988 | -0.00012 |
| 17 | 0.99113 | 1.01489 | 0.99074 | 1.01195 | 4.99984 | -0.00016 |
| 18 | 1.00141 | 0.98450 | 0.98199 | 1.03076 | 5.00007 | 0.00007 |
| 19 | 0.97940 | 1.02362 | 1.00281 | 1.01443 | 4.99966 | -0.00034 |
| 20 | 1.01367 | 0.99505 | 0.98865 | 0.98938 | 5.00040 | 0.00040 |
| 21 | 1.01396 | 0.98074 | 0.98685 | 1.00426 | 4.99978 | -0.00022 |
| 22 | 0.97968 | 1.01667 | 0.99823 | 1.02535 | 4.99961 | -0.00039 |
| 23 | 1.00401 | 0.98837 | 0.98723 | 1.01667 | 5.00029 | 0.00029 |
| 24 | 1.00684 | 0.98544 | 0.99645 | 1.00426 | 4.99982 | -0.00018 |
| 25 | 1.00455 | 0.99610 | 0.99912 | 0.99531 | 4.99963 | -0.00037 |
| 26 | 1.00207 | 0.98525 | 1.00227 | 1.00848 | 5.00014 | 0.00014 |
| 27 | 0.98517 | 1.00469 | 1.01950 | 1.00506 | 4.99959 | -0.00041 |
| 28 | 0.99375 | 0.99050 | 1.00393 | 1.01803 | 4.99997 | -0.00003 |
| 29 | 0.98654 | 1.01672 | 1.01004 | 1.00011 | 4.99995 | -0.00005 |
| 30 | 0.98184 | 1.01353 | 1.00653 | 1.01664 | 5.00039 | 0.00039 |
| 31 | 0.98648 | 0.98079 | 1.02319 | 1.02316 | 5.00008 | 0.00008 |
| 32 | 0.97987 | 1.01211 | 1.02911 | 0.99883 | 4.99979 | -0.00021 |
| 33 | 1.00410 | 0.99431 | 1.00793 | 0.98992 | 5.00037 | 0.00037 |
| 34 | 1.00196 | 0.99686 | 0.99766 | 1.00079 | 4.99922 | -0.00078 |
| 35 | 0.99985 | 0.98614 | 1.01160 | 1.00020 | 4.99963 | -0.00037 |
| 36 | 1.00240 | 0.98054 | 1.01999 | 0.99522 | 5.00057 | 0.00057 |
| 37 | 0.98928 | 1.00708 | 1.01916 | 0.99543 | 5.00023 | 0.00023 |
| 38 | 0.98482 | 1.00251 | 1.00899 | 1.01874 | 4.99987 | -0.00013 |
| 39 | 0.99559 | 1.02421 | 1.00250 | 0.98242 | 5.00032 | 0.00032 |
| 40 | 0.99035 | 1.02351 | 0.99363 | 1.00243 | 5.00026 | 0.00026 |
| 41 | 0.99237 | 0.99837 | 1.00837 | 1.00839 | 4.99988 | -0.00012 |
| 42 | 0.99425 | 1.00774 | 1.00016 | 1.00350 | 4.99990 | -0.00010 |
| 43 | 0.97545 | 1.01961 | 1.02302 | 1.00678 | 5.00030 | 0.00030 |
| 44 | 0.96406 | 1.03705 | 1.02413 | 1.01100 | 5.00031 | 0.00031 |
| 45 | 0.98861 | 1.03735 | 0.98928 | 0.99559 | 4.99943 | -0.00057 |
| 46 | 0.99343 | 1.01395 | 0.99281 | 1.00647 | 5.00009 | 0.00009 |
| 47 | 1.01064 | 0.97819 | 0.99173 | 1.00879 | 5.00001 | 0.00001 |
| 48 | 1.00709 | 0.98319 | 0.99853 | 1.00380 | 4.99969 | -0.00031 |
| 49 | 0.99551 | 1.01505 | 0.99439 | 0.99962 | 5.00009 | 0.00009 |
| 50 | 0.97913 | 1.01909 | 1.01103 | 1.01087 | 4.99926 | -0.00074 |
| 51 | 1.00204 | 0.98879 | 1.00485 | 1.00256 | 5.00028 | 0.00028 |
| 52 | 1.00374 | 1.00882 | 0.99307 | 0.99054 | 4.99990 | -0.00010 |
| 53 | 1.00012 | 0.99524 | 1.00829 | 0.99666 | 5.00042 | 0.00042 |
| 54 | 0.99216 | 1.01231 | 1.00698 | 0.99606 | 4.99967 | -0.00033 |
| 55 | 0.99937 | 1.00965 | 1.01197 | 0.97936 | 4.99971 | -0.00029 |
| 56 | 0.99542 | 1.00280 | 1.01483 | 0.99202 | 5.00050 | 0.00050 |
| 57 | 0.98764 | 1.02650 | 1.00592 | 0.99276 | 5.00046 | 0.00046 |
| 58 | 1.00600 | 0.99852 | 1.00959 | 0.98065 | 5.00076 | 0.00076 |
| 59 | 1.00392 | 0.99821 | 1.00799 | 0.98632 | 5.00036 | 0.00036 |
| 60 | 1.00706 | 0.99717 | 1.00473 | 0.98365 | 4.99968 | -0.00032 |

FIG. 21

| | <EXAMPLE> | | | <COMPARATIVE EXAMPLE> | |
|---|---|---|---|---|---|
| | NUMBER OF SHOTS | DRIVE SIGNAL CORRECTION AMOUNT (%) | DEVIATION IN AMOUNTS OF FILLING (%) | NUMBER OF SHOTS | DRIVE SIGNAL CORRECTION AMOUNT (%) | DEVIATION IN AMOUNTS OF FILLING (%) |
| BEFORE CORRECTION | | | 3.39 | | | 3.82 |
| FIRST PASS | 2 | 3.99 | 1.05 | 1 | 8.10 | 1.26 |
| SECOND PASS | 1 | 2.32 | 0.28 | 1 | 4.10 | 0.56 |
| THIRD PASS | 1 | 0.73 | 0.11 | 1 | 1.38 | 0.23 |
| FOURTH PASS | 1 | 0.28 | 0.03 | 2 | 0.31 | 0.10 |

NOZZLE EJECTION AMOUNT CORRECTING METHOD, FUNCTIONAL LIQUID EJECTING METHOD, AND ORGANIC EL DEVICE MANUFACTURING METHOD

BACKGROUND

1. Technical Field

The present invention relates to a nozzle ejection amount correcting method for functional liquid which is ejected from a nozzle of an ejection head, a functional liquid ejecting method using the nozzle ejection amount correcting method, and an organic electroluminescence (EL) device manufacturing method.

2. Related Art

In the related art, a liquid droplet ejecting method (ink jet method), in which liquid droplets in a form of liquid including a functional material are ejected from a nozzle of an ink jet head and a thin film is formed, has been known. Representative examples of the thin film formed by the liquid droplet ejecting method include a color filter and a light emitting layer of an organic EL panel.

The ink jet head includes a plurality of cavities for retaining a substance in a liquid form, a plurality of nozzles which communicate with the cavities and are aligned in one direction, and a plurality of actuators (piezoelectric elements, resistive heating elements, and the like) for pressurizing the substance in a liquid form in each cavity.

The ink jet head inputs common driving signals to actuators selected based on image depiction data and causes nozzles corresponding to the respective actuators to eject liquid droplets in a liquid form. According to the ink jet method, a thin film is formed by causing the nozzles of the ink jet head to eject liquid droplets in a liquid form toward a substrate and drying the liquid droplets landed on the substrate.

It is desired to depict an image with more excellent gradation expression by the ink jet method as resolution for depicting the targeted image increases. For example, JP-A-2008-136927 discloses a method of driving a liquid droplet ejection head as an ink jet head capable of depicting an image with excellent gradation expression.

According to the method of driving a liquid droplet ejection head disclosed in JP-A-2008-136927, a plurality of different driving signals corresponding to ranks set by actuators are applied to nozzles selected based on image depiction data, and an average weight of the ejected liquid droplets can be adjusted to a predetermined weight which is defined in advance. Accordingly, it is possible to calibrate a total weight of the substance in a liquid form (liquid droplets) to be ejected on a target for each nozzle based on a combination of driving signals generated for each rank and to thereby enhance uniformity of thickness of a thin film which is obtained by drying the substance in a liquid form. Furthermore, there is a description that it is possible to further enhance precision when the average weight is adjusted and to increase a degree of freedom due to the combination of the different driving signals as compared with a case where a single driving signal is used to cause the nozzles to eject the liquid droplets.

On the other hand, since ranking gradations are limited in the method of driving a liquid droplet ejection head disclosed in JP-A-2008-136927, in which the average weight of a plurality of liquid droplets is classified into a corresponding rank, it is possible to sufficiently correct variations in weights of the liquid droplets.

In a case where variations in weights of the liquid droplets are not sufficiently corrected, liquid droplets with high weights or liquid droplets with low weights are successively aligned along a scanning direction of a substrate. For this reason, there is a problem that there is a difference in thicknesses of the thin film such as a color filter or a light emitting layer of an organic EL panel even if the weight difference between the liquid droplets with high weights and the liquid droplets with low weights is a minute difference, that the difference in film thicknesses is reflected at high sensitivity in display of an electric optical device, and that image quality is thus degraded.

As a method for solving such a problem, JP-A-2012-209216 discloses a nozzle ejection amount correcting method. The nozzle ejection amount correcting method disclosed in JP-A-2012-209216 includes: a first step for performing correction calculation in units of a first nozzle array, in units of ejection, or in units of scanning for each nozzle based on a difference between a sum A of weights of all droplets ejected to an ejecting region in a case where a weight of the liquid droplets is not corrected for each nozzle and a predetermined amount B which is set in advance, such that a sum C of the weight of the liquid droplets after correction in units of the first nozzle array, in units of ejection, or in units of scanning and a weight of liquid droplets ejected to the same ejecting region in units of nozzle arrays other than the first nozzle array, in units of ejection, or in units of scanning is equal to the predetermined amount B; and a second process for performing correction calculation in units of a second nozzle array, in units of ejection, or in units of scanning for each nozzle based on a difference between a sum D of a weight of all droplets calculated to be ejected to the ejecting region, which is corrected in the first process, and the predetermined amount B, such that a sum E of the weight of liquid droplets after correction in units of the first nozzle array, in units of ejection, or in units of scanning, a weight of liquid droplets, which are ejected to the same ejecting regions, after the correction, in units of the second nozzle array, in units of ejection, or in units of scanning, and a weight of the liquid droplets which are ejected to the same ejecting regions in units of nozzle arrays other than the first and second nozzle arrays, in units of ejection, or in units of scanning is equal to the predetermined amount B, in which correction amount calculation by the number of units of nozzle arrays, the number of units of ejection, or the number of units of scanning is performed in a stepwise manner.

According to the method disclosed in JP-A-2012-209216, it is possible to raise correction gradations by a power of the number of units of the nozzle arrays which eject liquid droplets to the ejecting region, the number of units of ejection, or the number of units of scanning since correction is performed in units of one nozzle array, in units of ejection, or in units of scanning such that the sums A and C of the weight of all the liquid droplets in the ejecting region is equal to the predetermined amount B. In doing so, it is possible to sufficiently correct variations in weights of liquid droplets ejected from the respective nozzles and to thereby uniformize the thickness of the thin film formed in the ejecting region by using the plurality of nozzles.

However, there is a concern that in a case where the driving signals applied to the respective nozzles by the actuator are corrected, the driving signals are corrected outside an appropriate correction range if priority is given to scanning, in which the number of liquid droplets ejected to the ejecting region is smaller than those in other scanning.

Specifically, the total weight of the substances in a liquid form ejected to the ejecting region is relatively smaller in scanning, in which the number of ejected liquid droplets is smaller, than those in other scanning, and if priority is given to correcting the total weight, then there is a problem that correction is performed outside an appropriate range of a standard curve which represents a relationship between setting of driving signals applied by the actuator and a weight of liquid droplets ejected from a nozzle corresponding to the actuator.

SUMMARY

The invention can be realized in the following forms or application examples.

Application Example 1

According to this application example, there is provided a nozzle ejection amount correcting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and ejection amounts of liquid droplets when a predetermined amount A of functional liquid set in advance is ejected as the liquid droplets onto the ejecting regions are corrected for the plurality of nozzles, the method including: performing first signal correction by calculating correction amounts of the plurality of driving signals from a difference C between a predetermined amount B in a case of ejecting the liquid droplets from the selected nozzles to the ejecting regions in the main scanning performed a plurality of times and the predetermined amount A, by using the plurality of driving signals; performing second signal correction by calculating correction amounts of the plurality of driving signals before the correction corresponding to the main scanning in the later stage from a difference E between a predetermine amount D in a case of ejecting the liquid droplets from the selected nozzles to the ejecting regions and the predetermined amount A, by using the plurality of driving signals, by which the first signal correction is performed, in the main scanning in the former stage among the main scanning performed a plurality of times and using the plurality of driving signals before correction in the main scanning in the later stage; and performing the second signal correction in a stepwise manner in accordance with the remaining number of times of the main scanning performed a plurality of times, wherein main scanning, in which the number of ejected liquid droplets ejected to the ejecting regions is the largest, among the main scanning performed a plurality of times, is regarded as the main scanning in the former stage.

According to this application example, the driving signals applied to the actuators of the selected nozzles in the main scanning performed a plurality of times are sequentially corrected in accordance with the number of times of the main scanning, and main scanning, in which the number of ejected liquid droplets to the ejecting regions is the largest, is regarded as main scanning in the former stage, and a second signal correction is performed.

For this reason, the correction amounts of the driving signals for ejecting the liquid droplets from the nozzles are smaller as compared with a case of performing the second signal correction in priority to main scanning, in which the number of ejected liquid droplets is smaller than those in the other main scanning. In other words, since the correction load on the driving signals is small, it is possible to perform the correction in the respective main scanning within an appropriate range of a standard curve relating to the ejection amount of the liquid droplets. For this reason, it is possible to provide a nozzle ejection amount correcting method capable of causing the selected nozzles to precisely eject a predetermined amount of functional liquid as liquid droplets.

Application Example 2

In the nozzle ejection amount correcting method according to the above application example, it is preferable that a nozzle selected at least once in the main scanning performed a plurality of times be different from nozzles selected in the other main scanning with respect to the same ejecting region.

According to this method, it is possible to perform nozzle dispersion type nozzle ejection amount correction in consideration of ejection properties of the plurality of nozzles.

Application Example 3

In the nozzle ejection amount correcting method according to the above application example, it is preferable that different nozzles be selected in the main scanning performed a plurality of times with respect to the same ejecting region.

According to this method, it is possible to more reliably perform nozzle dispersion type nozzle ejection amount correction in consideration of ejection properties of the plurality of nozzles.

Application Example 4

In the nozzle ejection amount correcting method according to the above application example, it is preferable that the actuators be piezoelectric elements, and that the plurality of driving signals be corrected by correcting a potential of waveforms of the plurality of driving signals.

According to this method, it is possible to control drive of the piezoelectric elements as actuators by correcting the potential of the waveforms of the driving signals and precisely correct the ejection amounts of liquid droplets ejected from the nozzles.

Application Example 5

According to this application example, there is provided a functional liquid ejecting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and a predetermined amount of functional liquid is ejected as liquid droplets from the selected nozzles to the ejecting regions, the method including: performing signal correction, in which the plurality of driving signals are corrected in the main scanning performed a plurality of times by using the nozzle ejection amount correcting method according to the Application Example; and ejecting the predetermined amount of functional liquid as the liquid droplets from the selected nozzles to the ejecting regions while the main scanning is performed a plurality of times by using the plurality of driving signals, by which the signal correction is performed.

According to this application example, it is possible to provide a functional liquid ejecting method capable of causing the selected nozzles to precisely eject a predetermined amount of functional liquid to the ejecting regions in the main scanning performed a plurality of times.

Application Example 6

In the functional liquid ejecting method according to the above application example, it is preferable that in ejecting the predetermined amount of functional liquid, main scanning, in which the number of ejected liquid droplets to the ejecting regions is the largest among the main scanning performed a plurality of times, be performed as first main scanning.

According to this method, the driving signals are corrected in priority to the first main scanning, in which the number of ejected liquid droplets to the ejecting regions is the largest, and therefore, it is possible to more precisely eject the predetermined amount of functional liquid to the ejecting regions than in a case of correcting the driving signals in priority to the main scanning in which the number of ejected liquid droplets is smaller.

Application Example 7

According to a third aspect of the present invention, there is provided a manufacturing method of an organic EL device which includes a functional layer configured to have a light emitting layer in each of a plurality of ejecting regions on a substrate, the method including: applying a predetermined amount of functional liquid to each of the plurality of ejecting regions by using the functional liquid ejecting method according to the Application Example; and forming one organic layer among the functional layers in each of the plurality of ejecting regions by solidifying the applied functional liquid.

According to this application example, the predetermined amount of functional liquid is precisely ejected to each of the plurality of ejecting regions, and therefore, it is possible to manufacture an organic EL device which includes a functional layer with an organic layer with less unevenness and variations in film thicknesses.

Application Example 8

In the organic EL device manufacturing method according to the above application example, it is preferable that in applying the functional liquid, the functional liquid which contains a light emitting layer forming material be applied.

According to this method, it is possible to manufacture an organic EL device with a stable light emitting property at high yield.

BRIEF DESCRIPTION OF THE DRAWINGS

The invention will be described with reference to the accompanying drawings, wherein like numbers reference like elements.

FIG. 9 is a photograph showing landing marks of liquid droplets.

FIG. 11 is a table showing variations in functional liquid filling amounts and driving signal correction amounts in a first correction step in a nozzle ejection amount correcting method according to a comparative example.

FIG. 12 is a table showing variations in functional liquid filling amounts and driving signal correction amounts in a second correction step in a nozzle ejection amount correcting method according to the comparative example.

FIG. 13 is a table showing variations in functional liquid filling amounts and driving signal correction amounts in a third correction step in a nozzle ejection amount correcting method according to the comparative example.

FIG. 14 is a table showing variations in functional liquid filling amounts and driving signal correction amounts in a fourth correction step in a nozzle ejection amount correcting method according to the comparative example.

FIG. 15 is a table showing variations in functional liquid filling amounts after final correction in a nozzle ejection amount correcting method according to the comparative example.

FIG. 16 is a table showing functional liquid filling amounts and driving signal correction amounts in a first correction step in a nozzle ejection amount correcting method according to an example.

FIG. 17 is a table showing functional liquid filling amounts and driving signal correction amounts in a second correction step in a nozzle ejection amount correcting method according to the example.

FIG. 18 is a table showing functional liquid filling amounts and driving signal correction amounts in a third correction step in a nozzle ejection amount correcting method according to the example.

FIG. 19 is a table showing functional liquid filling amounts and driving signal correction amounts in a fourth correction step in a nozzle ejection amount correcting method according to the example.

FIG. 20 is a table showing functional liquid filling amounts after final correction in a nozzle ejection amount correcting method according to the example.

FIG. 21 is a table showing driving signal correction amounts in main scanning and variations in functional liquid filling amounts in ejecting regions according to the comparative example and the example.

DESCRIPTION OF EXEMPLARY EMBODIMENTS

Hereinafter, a description will be given of embodiments, in which the invention is implemented, with reference to drawings. In addition, the drawings used will be appropriately enlarged or reduced in size such that a part to be described can be recognized.

A description of "on a substrate" in the following embodiments represents a case where an object is arranged in contact with the substrate, a case where the object is arranged above the substrate via another constituent, or a case where the object is arranged such that a part thereof is in contact with the substrate and a different part thereof is arranged via another constituent.

First Embodiment

Ejection Device

Figure 1:
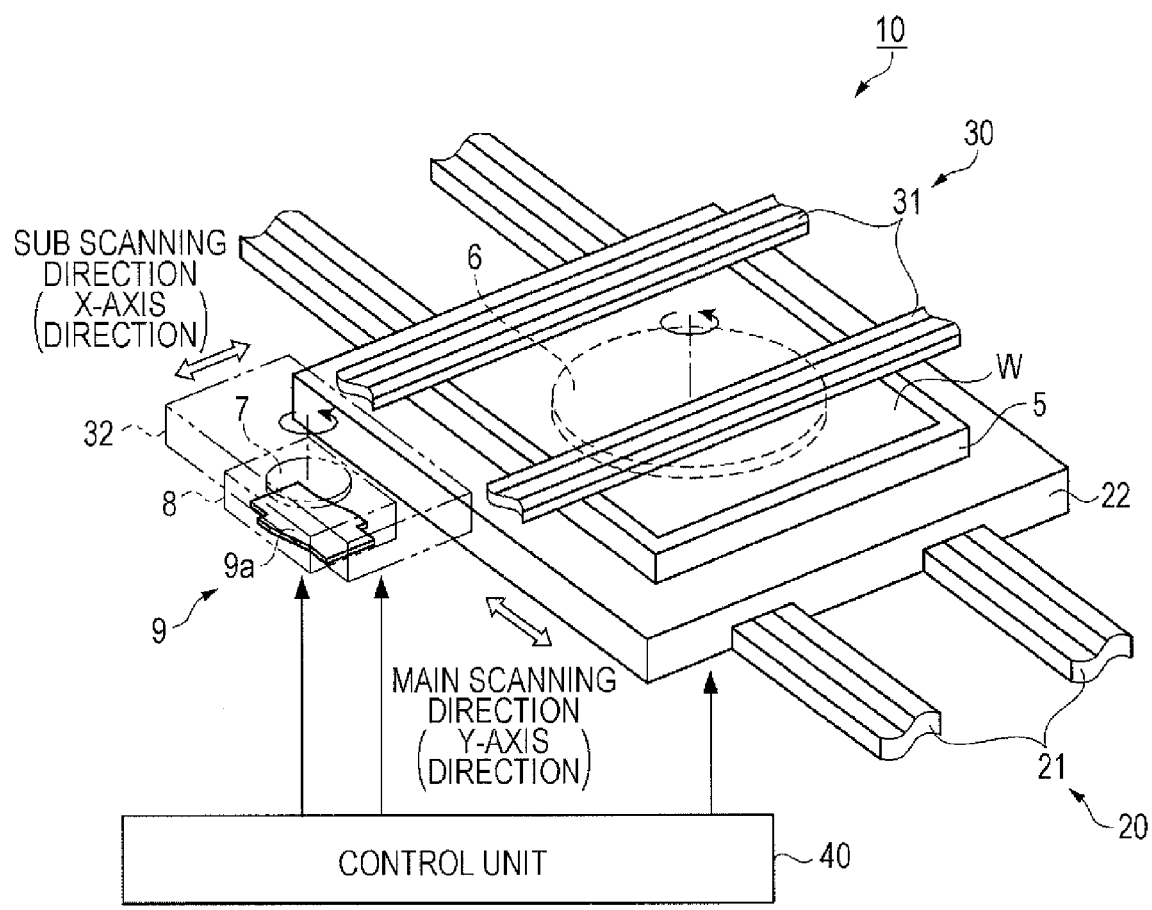
FIG. 1 is an outline perspective view showing a configuration of an ejection device.

First, a description will be given of an ejection device capable of ejecting functional liquid, which includes a functional layer forming material, as liquid droplets to a work with reference to FIGS. 1 to 7. FIG. 1 is an outline perspective view showing a configuration of the ejection device.

As shown in FIG. 1, an ejection device 10 is provided with a work moving mechanism 20 which moves a work W with a plate shape, for example, as a target of ejection in a main scanning direction (Y-axis direction) as a first direction and a head moving mechanism 30 which moves a head unit 9 in a sub scanning direction (X-axis direction) as a second direction which is orthogonal to the main scanning direction.

The work moving mechanism 20 is provided with a pair of guide rails 21, a moving table 22 which moves along the pair of guide rails 21, and a stage 5, on which the work W is disposed above the moving table 22 via a rotation mechanism 6.

The moving table 22 moves in the main scanning direction (Y-axis direction) by an air slider and a linear motor (not shown in the drawing) provided inside the guide rails 21. The moving table 22 is provided with an encoder 12 (see FIG. 5) as a timing signal generating unit.

The encoder 12 reads a scale mark of a linear scale (not shown in the drawing) which is aligned with the guide rail 21 as the moving table 22 relatively moves in the main scanning direction (Y-axis direction) and generates an encoder pulse as a timing signal. In addition, arrangement of the encoder 12 is not limited thereto, and for example, the moving table 22 may be configured so as to relatively move in the main scanning direction (Y-axis direction) along a rotation axis, and the encoder 12 may be provided at a drive unit in a case where the drive unit for rotating the rotation axis is provided. As the drive unit, a servo motor can be exemplified.

The stage 5 can absorb and fix the work W and cause the rotation mechanism 6 to correctly adjust a reference axis in the work W in the main scanning direction (Y-axis direction) and the sub scanning direction (X-axis direction).

In addition, it is also possible to cause the work W to pivot by 90° in accordance with arrangement of ejecting regions (also referred to as film formation regions), to which the functional liquid is ejected, on the work W.

The head moving mechanism 30 is provided with a pair of guide rails 31 and a moving table 32 which moves along the pair of guide rails 31. The moving table 32 is provided with a carriage 8 which is suspended via a rotation mechanism 7.

A head unit 9, in which a plurality of ejection heads 50 (see FIGS. 2A and 2B) are mounted on a head plate 9a, is attached to the carriage 8.

In addition, a functional liquid supply mechanism (not shown in the drawing) for supplying the functional liquid to the ejection heads 50 and a head driver 48 (see FIG. 5) for electrically controlling drive of the plurality of ejection heads 50 are provided.

The moving table 32 moves the carriage 8 in the sub scanning direction (X-axis direction) and arranges the head unit 9 to face the work W.

In addition to the above configurations, the ejection device 10 also includes a maintenance mechanism which performs maintenance for solving nozzle clogging of the plurality of ejection heads 50 mounted on the head unit 9 and removing foreign matters and contamination from the nozzle surfaces disposed at a position, at which the maintenance mechanism faces the plurality of ejection heads 50.

In addition, a weight measurement mechanism which receives the functional liquid ejected from the plurality of nozzles of the ejection heads 50 and measures the weight of the ejected functional liquid and a landing area measurement mechanism 60 (see FIG. 5) as a measurement mechanism according to this embodiment, which measures a landing area of the functional liquid ejected from the plurality of nozzles are provided. Moreover, a control unit 40 which collectively controls these configurations is provided. In addition, the maintenance mechanism, the weight measurement mechanism, and the landing area measurement mechanism 60 are not shown in FIG. 1.

Figure 2A:
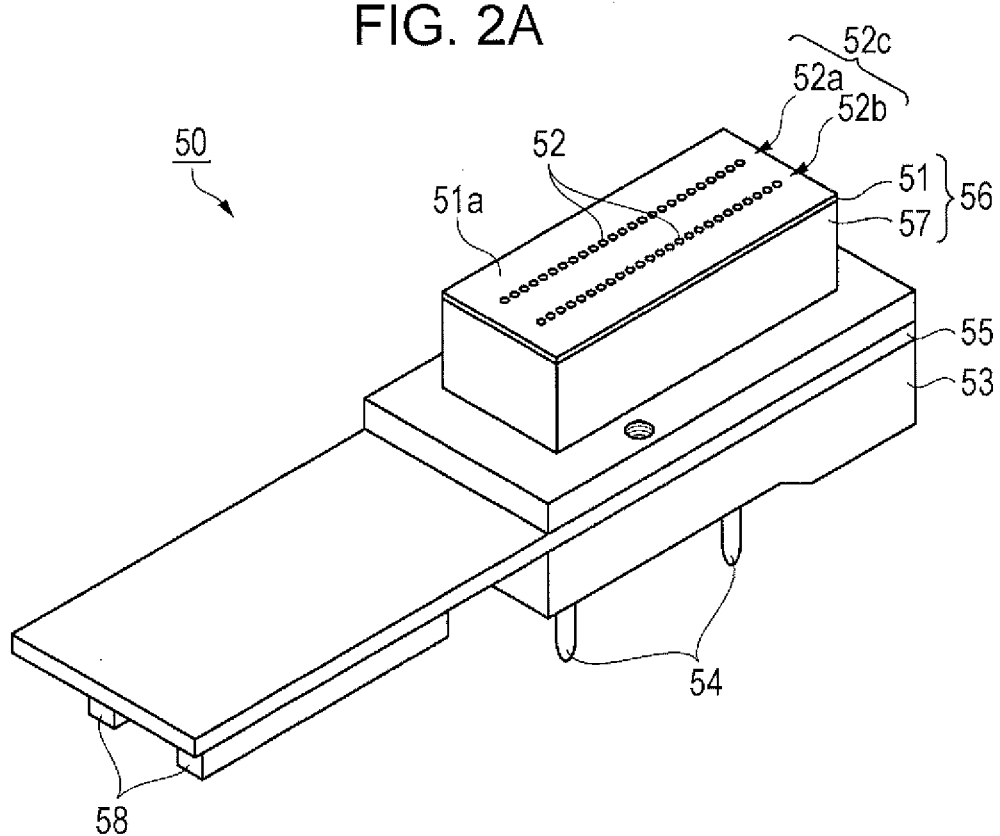
FIG. 2A is an outline perspective view showing a configuration of an ejection head.
Figure 2B:
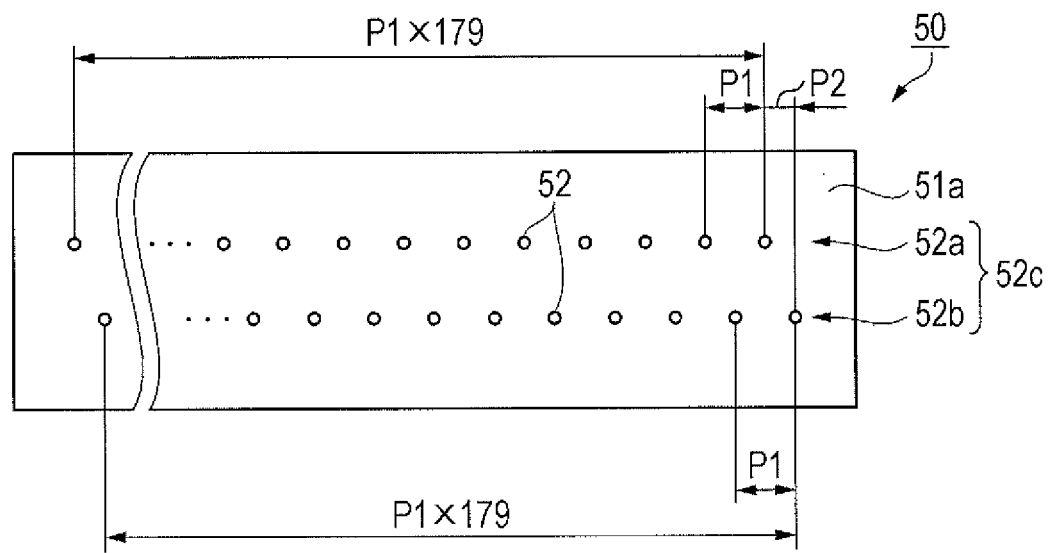
FIG. 2B is a planar view showing an arrangement state of a plurality of nozzles in a nozzle plane.

FIG. 2A is an outline perspective view showing a configuration of each ejection head, and FIG. 2B is a planar view showing an arrangement state of the plurality of nozzles in the nozzle surface.

As shown in FIG. 2A, the ejection head 50 is a so-called double ejection head and includes a functional liquid introduction unit 53 with double connecting needles 54, a head substrate 55 which is laminated on the introduction unit 53, and a head main body 56 which is arranged on the head substrate 55 and includes a functional liquid in-head flow path formed therein. The connecting needles 54 are connected to the aforementioned functional liquid supply mechanism (not shown in the drawing) via a pipe work and supply the functional liquid to the in-head flow path. The head substrate 55 is provided with double connectors 58 which are connected to the head driver 48 (see FIG. 5) via a flexible flat cable (not shown in the drawing).

The head main body 56 is provided with a pressurizing unit 57 which includes cavities configured by piezoelectric elements as drive sections (actuators) and a nozzle plate 51, in which two nozzle arrays 52a and 52b are formed in parallel with each other on a nozzle surface 51a.

As shown in FIG. 2B, plurality of (180) nozzles 52 are aligned at substantially equal intervals at a pitch P1 in each of the two nozzle arrays 52a and 52b, and the two nozzle arrays 52a and 52b are arranged on the nozzle surface 51a in a state where the two nozzle arrays 52a and 52b deviates from each other by a pitch P2 which is a half of the pitch P1. In this embodiment, the pitch P1 is approximately 141 µm, for example. Therefore, 360 nozzles 52 are aligned at a nozzle pitch of approximately 70.5 µm when viewed from a direction orthogonal to a nozzle array 52c configured by the two nozzle arrays 52a and 52b. In addition, a diameter of each nozzle 52 is approximately 27 µm.

If a driving signal as an electric signal is applied from the head driver 48 to each piezoelectric element, content of each cavity of the pressurizing unit 57 varies in the ejection head 50, the functional liquid contained in the cavity is pressurized by a pump effect caused by the variation, and the functional liquid can be ejected as liquid droplets from the nozzle 52.

The drive section (actuator) provided for each nozzle 52 in the ejection head 50 is not limited to a piezoelectric element. An electromechanical transduction element which displaces a vibrating plate as an actuator by electrostatic adsorption or an electrothermal transduction element which heats the functional liquid and causes the nozzle 52 to eject the functional liquid as liquid droplets may be used.

Figure 3:
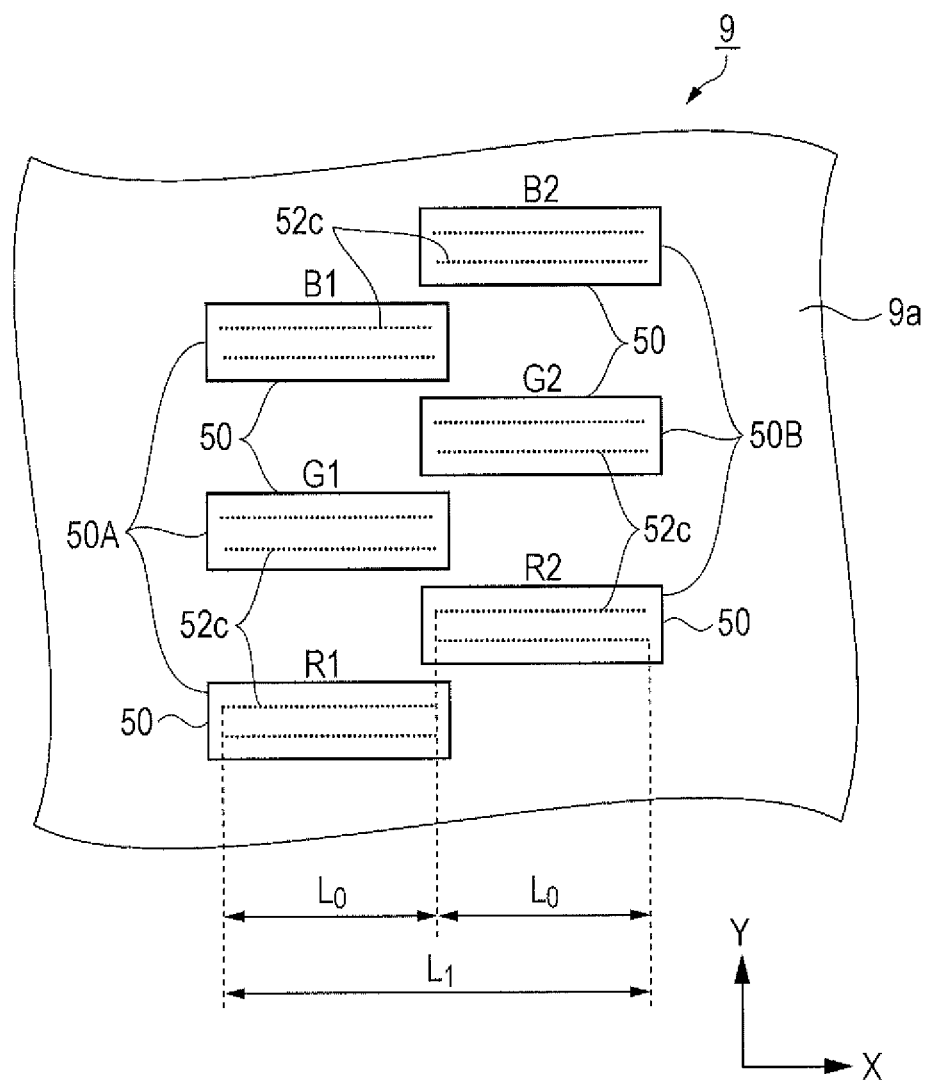
FIG. 3 is an outline planar view showing arrangement of ejection heads in a head unit.

FIG. 3 is an outline planar view showing arrangement of the ejection heads in the head unit. More specifically, FIG. 3 is a diagram viewed from a side facing the work W.

As shown in FIG. 3, the head unit 9 is provided with a head plate 9a, on which the plurality of ejection heads 50 are disposed. On the head plate 9a, a head group 50A configured by three ejection heads 50 and a head group 50B similarly configured by three ejection heads 50, namely a total of six ejection heads 50 are mounted. In this embodiment, a head R1 (ejection head 50) of the head group 50A and a head R2 (ejection head 50) of the head group 50B eject the same type of functional liquid. Similarly, a head G1 and a head G2 eject a same type of functional liquid, and a head B1 and a head B2 eject a same type of functional liquid. That is, the head unit 9 has a configuration capable of ejecting three different types of functional liquid.

An image depiction width which can be depicted by one ejection head 50 is L0, which is assumed to be an effective length of the nozzle array 52c. Hereinafter, the nozzle array 52c represents a nozzle array configured by the 360 nozzles 52.

The head R1 and the head R2 are disposed in parallel with each other in the main scanning direction such that arrays in the nozzle array 52c, which are adjacent to each other when viewed from the main scanning direction (Y-axis direction), are successively disposed at an interval of one nozzle pitch in the sub scanning direction (X-axis direction) orthogonal to the main scanning direction. Therefore, an effective image depiction width L1 between the head R1 and the head R2 which eject the same type of functional liquid is twice as wide as the image depiction width L0. Similarly, the head G1 and the head G2 are arranged in parallel with each other in the main scanning direction (Y-axis direction), and the head B1 and the head B2 are arranged in parallel with each other in the main scanning direction (Y-axis direction).

In addition, the nozzle array 52c provided in the ejection head 50 is not limited to double nozzle arrays and may be a single nozzle array. Moreover, arrangement of the ejection heads 50 in the head unit 9 is not limited to the above arrangement.

Figure 4A:
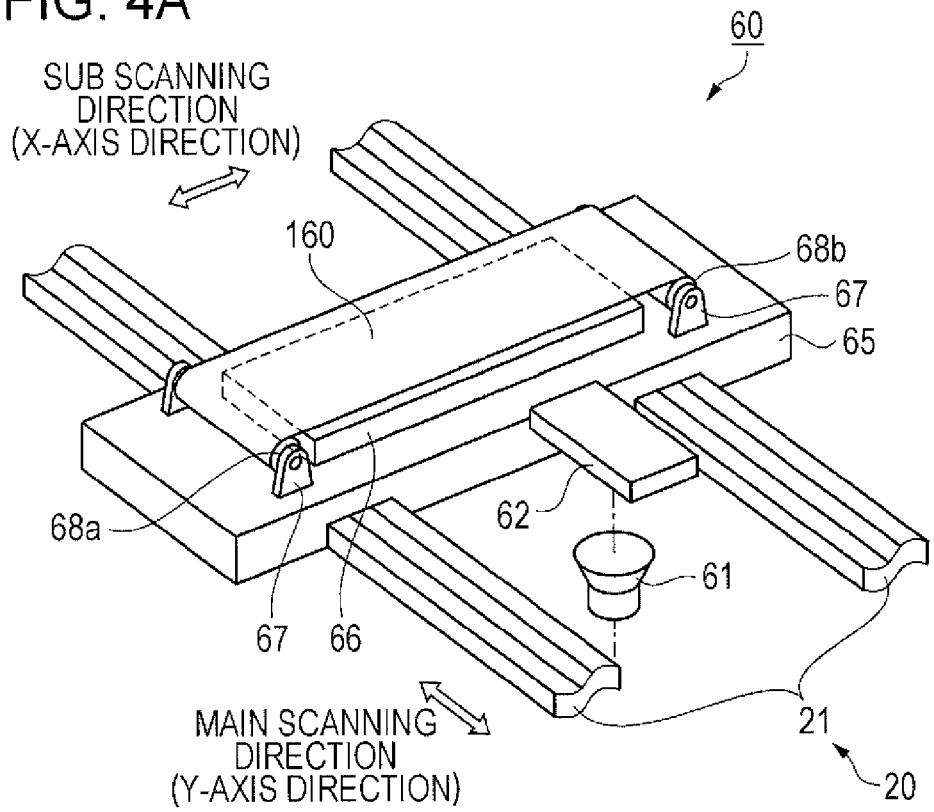
FIG. 4A is an outline perspective view showing a configuration of a landing area measurement mechanism.

Next, a description will be given of the landing area measurement mechanism with reference to FIGS. 4A and 4B. FIG. 4A is an outline perspective view showing a configuration of the landing area measurement mechanism, and FIG. 4B is a diagram showing arrangement of each configuration in the landing area measurement mechanism when viewed in the main scanning direction.

Figure 4B:
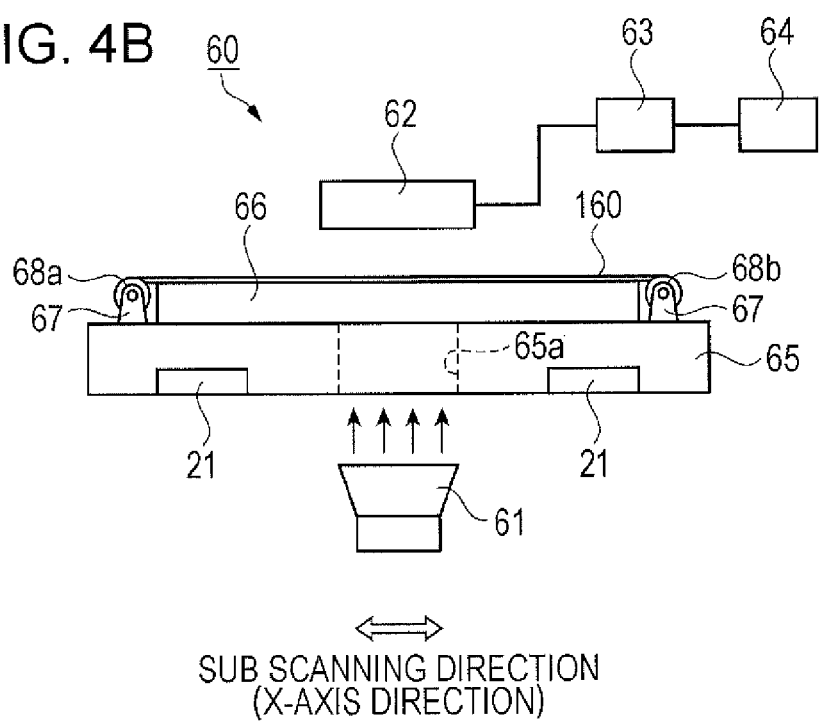
FIG. 4B is a diagram showing arrangement of each configuration in the landing area measurement mechanism when viewed in a main scanning direction.

As shown in FIGS. 4A and 4B, the landing area measurement mechanism 60 is configured by an illumination unit 61, an imaging unit 62, an image processing unit 63, a monitor 64, a moving table 65, a recording medium 160 placed on the moving table 65.

The landing area measurement mechanism 60 is for causing the functional liquid as liquid droplets to land on the medium 160 from the plurality of nozzles 52 of the aforementioned ejection heads 50, causing the imaging unit 62 to image landing marks produced on the medium 160, and measuring an area (landing area) of the landing marks.

The recording medium 160 is selected depending on the functional liquid. In a case where the functional liquid contains a coloring material, an opaque recording paper, for example, is used as the medium 160. In a case where the functional liquid does not contain a coloring material and is substantially transparent, a transparent film with an receiving later for receiving the functional liquid formed on the surface thereof is used, for example. In this embodiment, a transparent film of the later example is used as the medium 160.

The moving table 65 can move in the main scanning direction (Y-axis direction) by an air slider and a linear motor (not shown in the drawing) which are provided inside the pair of guide rails 21 in the same manner as the moving table 22 (see FIG. 1). The moving table 65 is also provided with the encoder 12 (see FIG. 5) as the timing signal generating unit.

A support table 66 which extends in the X-axis direction and is made of transparent glass, plastic, or the like is arranged on the moving table 65. The long medium 160 is wound around a winding-out roller 68a and a winding-up roller 68b, and both ends of the long medium 160 are supported. On the moving table 65, the winding-out roller 68a and the winding-up roller 68b are respectively attached to bearings 67 provided at both end sides in the X-axis direction such that the support table 66 is interposed therebetween. In doing so, the medium 160 is expanded in the X-axis direction on the support table 66, and a back surface side of the medium 160 is supported by the support table 66.

The illumination unit 61 is provided with a light source such as a halogen lamp or a xenon lamp and a light collecting section which collects light emitted from the light source in a predetermined direction. The light collecting section is a reflective plate (minor) or a light collecting lens, for example. The illumination unit 61 is arranged between the pair of guide rails 21 in the X-axis direction and can illuminate the moving table 65 with the light by the light source. A hole 65a which penetrates through the moving table 65 is formed at a part of the moving table 65 which faces the illumination unit 61. The transparent support table 66 is arranged on the moving table 65 so as to block the hole 65a. That is, the illumination unit 61 can illuminate the transparent medium 160, which is developed on the support table 66, from the back surface side via the moving table 65 and the support table 66.

In addition, another illumination unit which illuminates the medium 160 from an upper side may be provided for a case of using an opaque recording paper, for example, as the medium 160 as described above.

The imaging unit 62 is provided with an imaging element such as a CCD and is arranged at a position, at which the imaging unit 62 faces the illumination unit 61 from an upper side of the illumination unit 61. The imaging unit 62 is electrically connected to the image processing unit 63. In addition, the image processing unit 63 is electrically connected to the monitor 64 such as a liquid crystal display device. That is, it is possible to perform image processing on an image, which is captured by the imaging unit 62, by the image processing unit 63 and check not only the original captured image but also the image after the image processing on the monitor 64.

Figure 5:
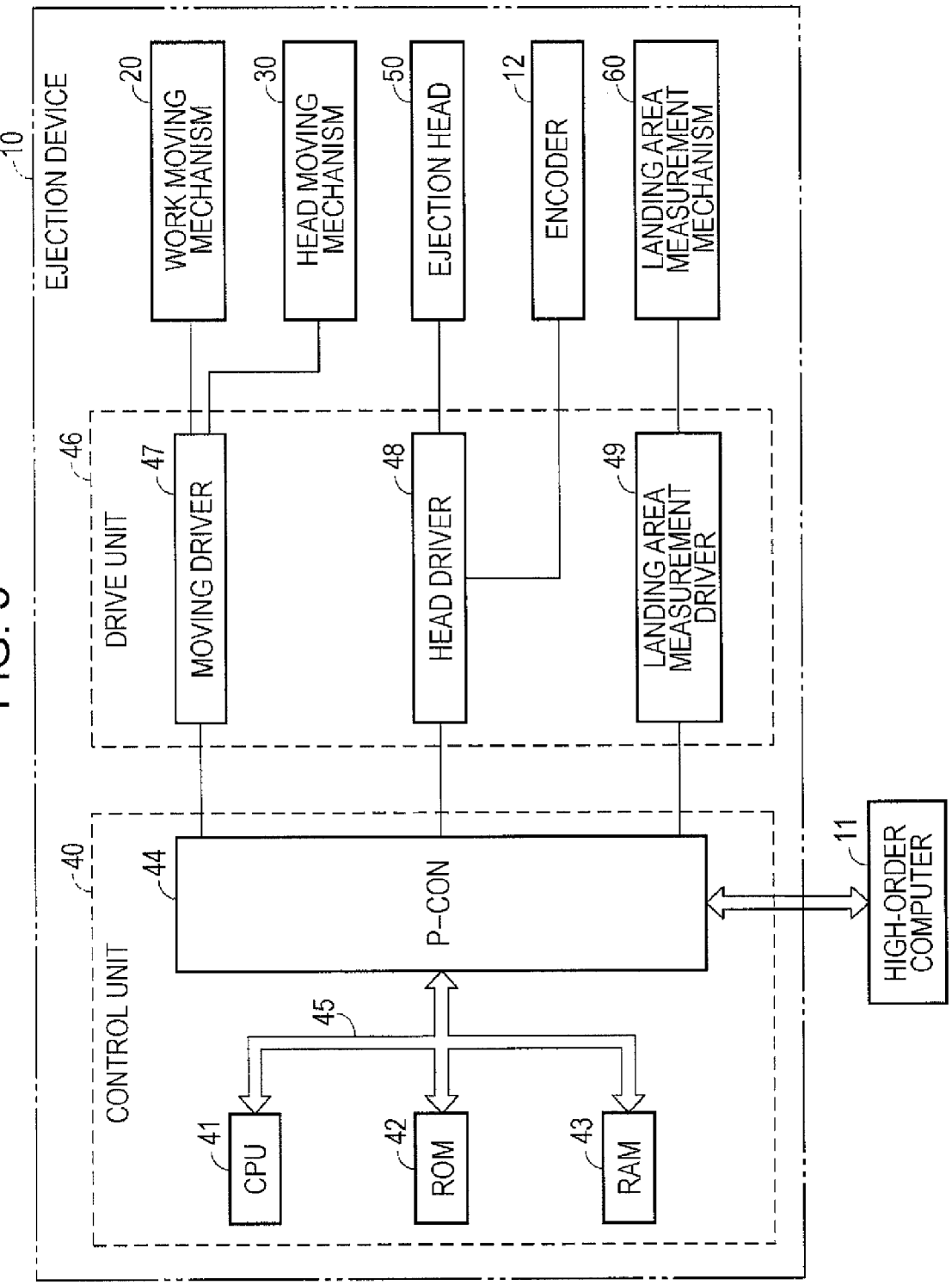
FIG. 5 is a block diagram showing a control system of the ejection device.

Next, a description will be given of a control system of the ejection device 10 with reference to FIG. 5. FIG. 5 is a block diagram showing a control system of the ejection device. As shown in FIG. 5, the control system of the ejection device 10 is provided with a control unit 40 which includes the driving unit 46 that has various drivers for driving the ejection heads 50, the work moving mechanism 20, the head moving mechanism 30, the landing area measurement mechanism 60, and the like and a control unit 40 which collectively controls the ejection device 10 including the drive unit 46.

The drive unit 46 is provided with a moving driver 47 which controls drive of the respective linear motors of the work moving mechanism 20 and the head moving mechanism 30, a head driver 48 which controls drive of the ejection heads 50, and a landing area measurement driver 49 which controls drive of the landing area measurement mechanism 60. Although a maintenance driver which controls drive of the maintenance mechanism, a weight measurement driver which controls drive of the weight measurement mechanism, and the like are provided in addition to the above drivers, such drivers are not shown in the drawing.

The control unit 40 is provided with a CPU 41, a ROM 42, a RAM 43, and a P-CON 44, and these components are connected to each other via a bus 45. A higher-order computer 11 is connected to the P-CON 44. The ROM 42 includes a control program region for storing control programs and the like to be processed by the CPU 41 and a control data region for storing control data for performing an image depicting operation, function recovery processing, and the like.

The RAM 43 includes various storage units including an image depiction data storage unit which stores image depiction data for depicting an image on the work W and a position data storage unit which stores position data of the work W and the ejection heads 50 (nozzle array 52c in practice), and the RAM 43 is used as various workspaces for control processing. Various drivers of the drive unit 46 and the like are connected to the P-CON 44, the P-CON 44 covers functions of the CPU 41, and a logic circuit for handling an interface signal with periphery circuits is configured and embedded in the P-CON 44. For this reason, the P-CON 44 takes, in the bus 45, various commands and the like from the higher-order computer 11 without any change or after processing the various commands and outputs data or a control signal, which is output from the CPU 41 or the like to the bus 45, to the drive unit 46 without any change or after processing the data or the control signal in conjunction with the CPU 41.

Then, the CPU 41 controls the entire ejection device 10 by inputting various detection signals, various commands, various data items, and the like via the P-CON 44 based on the control program in the ROM 42, processing the various data items or the like in the RAM 43, and then outputting various control signals to the drive unit 46 or the like via the P-CON 44. For example, the CPU 41 controls the ejection heads 50, the work moving mechanism 20, and the head moving mechanism 30 to cause the head unit 9 to face the work W. Then, the CPU 41 sends a control signal to the head driver 48 so as to cause the plurality of nozzles 52 of the respective ejection heads 50 mounted on the head unit 9 to eject the functional liquid as liquid droplets onto the work W in synchronization with relative movement of the head unit 9 and the work W. In this embodiment, ejection of the functional liquid in synchronization with the movement of the work W in the Y-axis direction is referred to as main scanning, and movement of the head unit 9 in the X-axis direction is referred to as sub scanning with respect to the main scanning. The ejection device 10 according to this embodiment can eject the functional liquid onto the work W by repeating the combination of the main scanning and the sub scanning over a plurality of times. The main scanning is not limited to the movement of the work W in one direction relative to the ejection heads 50 and can be performed by reciprocating the work W.

The encoder 12 is electrically connected to the head driver 48 and generates an encoder pulse during the main scanning. Since the moving table 22 is moved at a predetermined moving speed in the main scanning, the encoder pulse is periodically generated.

For example, it is assumed that when the moving speed of the moving table 22 in the main scanning is 200 mm/sec and a drive frequency, at which the ejection head 50 is driven, (in other words, ejection timing in a case of successively ejecting liquid droplets) is 20 kHz, ejecting resolution of liquid droplets in the main scanning direction can be obtained by dividing the moving speed by the drive frequency, which is 10 μm. That is, it is possible to arrange the liquid droplets at a pitch of 10 μm on the work W. If it is assumed that the moving speed of the moving table 22 is 20 mm/sec, it is possible to arrange the liquid droplets at a pitch of 1 μm on the work W. Actual liquid droplet ejection timing is based on a latch signal which is generated by counting the periodically generated encoder pulse. Such a minimum arrangement pitch of the liquid droplets on the work W in the main scanning is referred to as ejecting resolution.

The higher-order computer 11 sends control information such as a control program and control data to the ejection device 10. In addition, the higher-order computer 11 includes a function of an arrangement information generating unit which generates arrangement information as ejection control data for arranging a predetermined amount of functional liquid as liquid droplets in each ejecting region on the work W. The arrangement information is a bit map expression, for example, of information such as liquid droplet ejecting positions in each ejecting region (film formation region) (in other words, a relative positions of the work W and the nozzles 52), the number of arranged liquid droplets (in other words, the number of ejected liquid droplets from each nozzle 52), ON/OFF of the plurality of nozzles 52, that is, selection/non-selection of the nozzles 52 in the main scanning, and ejection timing. The higher-order computer 11 can not only generate the arrangement information but also modify the arrangement information which is stored temporarily in the RAM 43.

Figure 6:
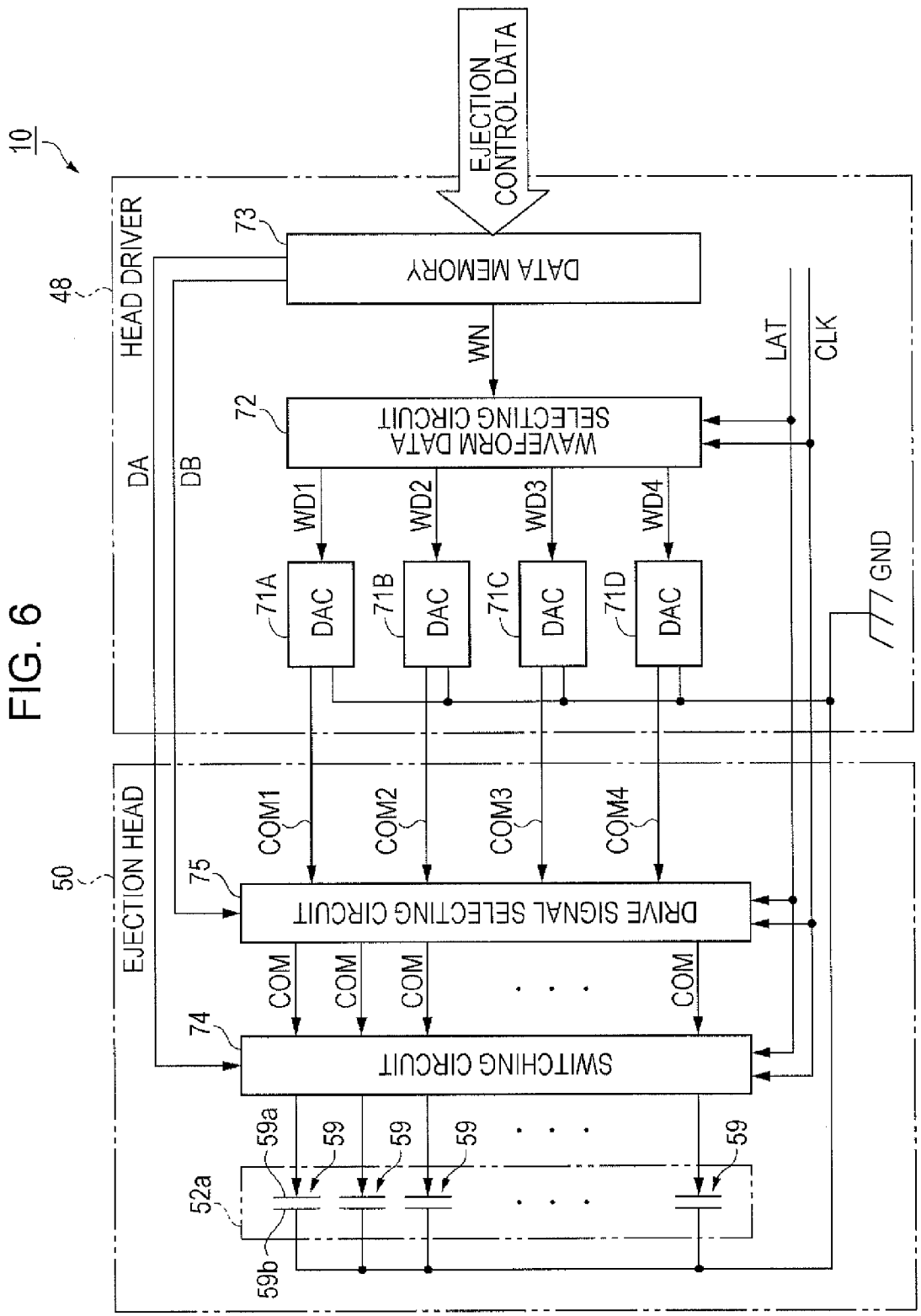
FIG. 6 is a block diagram showing electrical control of the ejection heads.

Next, a description will be given of an ejection control method for the ejection heads with reference to FIGS. 6 and 7. FIG. 6 is a block diagram showing electrical control of the ejection heads.

As shown in FIG. 6, the head driver 48 is provided with D/A converters (hereinafter, referred to as DACs) 71A to 71D which independently generate a plurality of different control signals COM for controlling liquid droplet ejection amounts, a waveform data selecting circuit 72 which includes a storage memory of slew rate data (hereinafter, referred to as waveform data (WD1 to WD4) of the driving signals COM generated by the DACs 71A to 71D therein, and a data memory 73 which stores ejection control data transmitted from the higher-order computer 11 via the P-CON 44. The driving signals COM generated by the DACs 71A to 71d are respectively output to respective COM lines of the COM1 to COM4.

Each ejection head 50 is provided with a switching circuit 74 which turns ON/OFF application of the driving signals COM to the piezoelectric elements 59 which are the drive sections (actuator) provided for the respective nozzles 52 and a driving signal selecting circuit 75 which selects one of the COM lines and transmits the driving signals COM to the switching circuit 74 connected to the respective piezoelectric elements 59.

In the nozzle array 52a (see FIG. 2B), one electrode 59b of each piezoelectric element 59 is connected to a ground line (GND) of the DACs 71A to 71D. In addition, the other electrode 59a (hereinafter, referred to as a segment electrode 59a) of the piezoelectric element 59 is electrically connected to the respective COM lines via the switching circuit 74 and the driving signal selecting circuit 75. Moreover, clock signals (CLK) and latch signals (LAT) corresponding to the respective ejection timing are input to the switching circuit 74, the driving signal selecting circuit 75, and the waveform data selecting circuit 72. The nozzle array 52B (see FIG. 2B) also includes a similar configuration of drive circuits.

The data memory 73 stores the following data for respective ejection timing periodically set in accordance with a scanning position of each ejection head 50. That is, the data memory 73 stores ejection data DA which defines application (ON/OFF) of the driving signals COM to the respective piezoelectric elements 59, driving signal selection data DB which defines selection of the COM lines (COM1 to COM4) corresponding to the respective piezoelectric elements 59, and waveform number data WN which defines a type of waveform data (WD1 to WD4) input to the DACs 71A to 71D. In this embodiment, the ejection data DA is configured by 1 bit (0, 1) for each nozzle, the driving signal selection data DB is configured by 2 bits (0, 1, 2, 3) for each nozzle, and the waveform number data WN is configured by 7 bits (0 to 127) for each one DAC. In addition, data structures can be appropriately changed.

Figure 7:
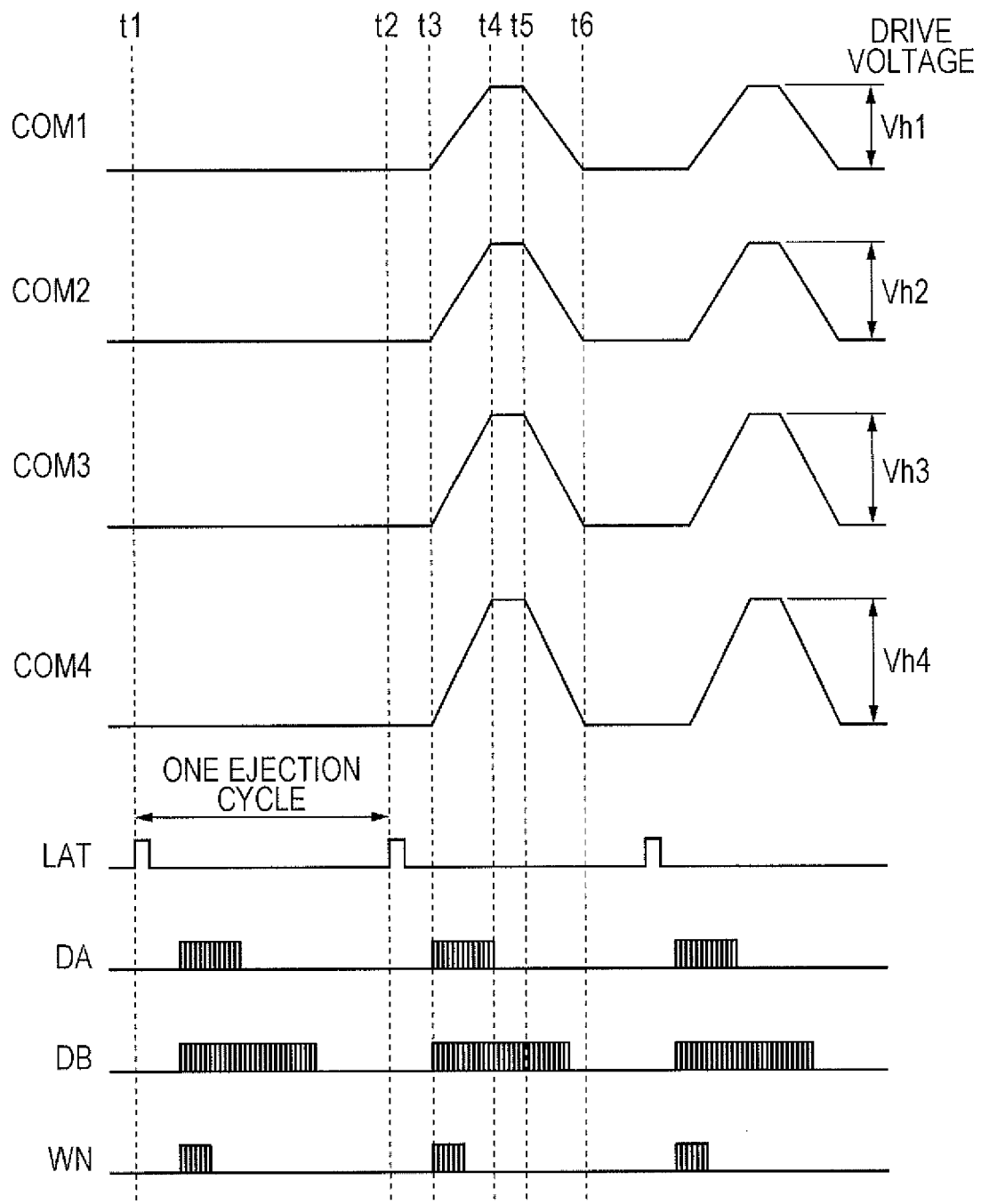
FIG. 7 is a timing diagram of driving signals and control signals.

FIG. 7 is a timing diagram of the driving signals and the control signals. In the aforementioned configuration, drive control relating to the respective ejection timing is performed as follows. As shown in FIG. 7, the ejection data DA, the driving signal selection data DB, the waveform number data WN are respectively converted into serial signals and transmitted to the switching circuit 74, the driving signal selecting circuit 75, the waveform data selecting circuit 72 for a period between timing t1 and timing t2. Then, the respective data is latched at the timing t2, and the segment electrode 59a of each piezoelectric element 59 relating to ejection (ON) is brought into a state in which the segment electrode 59a is connected to a COM line (one of COM1 to COM4) designated by the driving signal selection data DB. For example, the segment electrode 59a of the piezoelectric element 59 is connected to the COM1 when the driving signal selection data DB is "0". Similarly, the segment electrode 59a of the piezoelectric element 59 is connected to the COM2 when the driving signal selection data DB is "1", to the COM3 when the driving signal selection data DB is "2", and to the COM4 when the driving signal selection data DB is "3". In addition, waveform data (WD1 to WD4) of the driving signals relating to generation of the DACs 71A to 71D is set in conjunction with the selection.

The driving signals COM are respectively generated in a series of steps of potential rising, potential retaining, and potential falling based on the waveform data, which is set at the timing t2, for a period between timing t3 and timing t4. Then, the generated driving signals COM are supplied to the piezoelectric element 59 in a state where the piezoelectric element 59 is respectively connected to the COM1 to COM4, and content (pressure) of the cavity communicating with the corresponding nozzle 52 is controlled.

Time components and voltage components relating to the potential rising, the potential retaining, and the potential falling of the driving signals COM significantly depend on ejection amounts of the functional liquid which is ejected by the supply of the driving signals COM. Since an ejection amount exhibits satisfactory linearity with respect to a variation in the voltage component in the piezoelectric ejection head 50, in particular, it is possible to define a variation in the voltage component (potential difference) from the timing t3 to the timing t4 as drive voltages Vh (Vh1 to Vh4) and utilize the drive voltage Vh as a condition of the ejection amount control. That is, the drive voltage Vh is one of conditions of the driving signals for controlling the liquid droplet ejection amount. In addition, the generated driving signals COM are not limited to simple trapezoidal waves shown in this embodiment, and waveforms with various known shapes such as a rectangular wave can be appropriately employed. In addition, it is also possible to utilize pulse widths (time component) of the driving signals COM as conditions of the ejection amount control in an embodiment based on a different drive scheme (a thermal scheme, for example).

In this embodiment, it is possible to output the driving signals COM at different drive voltages Vh1 to Vh4 to the respective COM lines by preparing a plurality of types of waveform data, in which the drive voltage Vh is differentiated in a stepwise manner, and inputting the respectively independent waveform data items (WD1 to WD4) to the DACs 71A to 71D. The number of types of waveform data which can be prepared is 128 corresponding to the information amount (7 bits) of the waveform number data WN, and the types are associated with the drive voltage Vh per 0.1 V, for example. In other words, it is possible to set the respective drive waveforms at Vh1 to Vh4 per 0.1 V within a range of a potential difference of 12.8 V.

As described above, the ejection device 10 according to this embodiment can adjust the liquid droplet ejection amount and eject the functional liquid by appropriately setting the driving signal selection data DB which defines a correspondence relationship between each piezoelectric element 59 (nozzle 52) and each COM line and the waveform number data WN which defines a correspondence relationship between each COM line and a type of the driving signal COM (drive voltage Vh) in consideration of an ejection property of each nozzle 52. In other words, it is important to appropriately set the driving signal COM for each nozzle 52, which is determined depending on the relationship between the driving signal selection data DB and the waveform number data WN, in order to manage the ejection amount.

According to the ejection control method for the ejection heads 50 in the ejection device 10, it is possible to update the driving signal selection data DB and the waveform number data WN for the respective liquid droplet ejection, in other words, for the respective ejection timing. In addition, it is also possible to finely set the driving signals COM in accordance with the ejection data DA. Therefore, it is possible to change the ejection amount of the liquid droplets ejected from each nozzle 52 in at least four stages at the respective ejection timing and to thereby adjust variations in the ejection amounts of the liquid droplets, which are caused by the ejection properties of the nozzle arrays 52a and 52b, for the respective nozzles 52 and for the respective ejection of the liquid droplets as compared with a case where a constant driving signal COM is applied to the respective piezoelectric elements 59. Therefore, it is possible to reduce variations in ejection which are caused by the ejection properties of the nozzle arrays 52a and 52b and eject the functional liquid.

On the other hand, it is difficult to set the ejection amounts from all the plurality of nozzles 52 to a constant value, for example, to a reference ejection amount (or alternatively, a targeted ejection amount) even if it is possible to change the ejection amounts of the liquid droplets ejected from the respective nozzles 52 in at least four stages for the respective liquid droplet ejection. This is because of a mechanical factor that structures of the cavities communicating the respective nozzles 52 are not necessarily the same and an electrical factor that electric properties of the piezoelectric elements 59 of the respective nozzles 52 are not necessarily the same, for example.

Thus, the functional liquid is made to land as a plurality of liquid droplets on the medium 160 from the nozzles 52, and the ejection amounts of the liquid droplets ejected from the respective nozzles 52 are estimated by measuring the landing areas of the landing marks in this embodiment. Then, potential correction in the waveforms of the driving signals COM in the four stages is performed such that one of the driving signals COM in the four stages is appropriately applied to the respective selected nozzles 52 in the main scanning based on the correlation between the ejection amounts of the liquid droplets and the potential of the waveform of the driving signals COM. In doing so, variations in the total amount (also referred to as a filling amount) of the functional liquid ejected as a plurality of liquid droplets from the nozzles 52 selected in the main scanning over a plurality of times to the ejecting region is suppressed to a certain level of range.

Functional liquid Ejection Amount Measurement Method

Figure 8A:
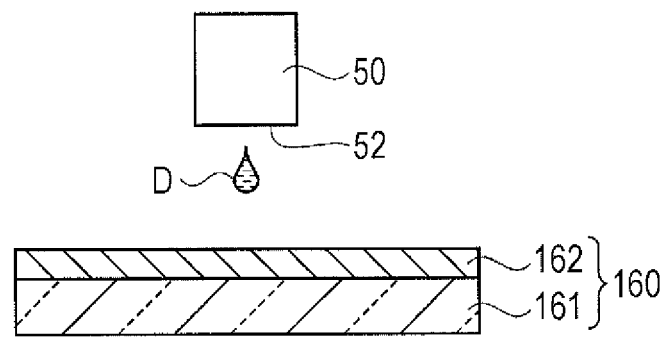
FIGS. 8A to 8C are outline cross-sectional views showing a method of measuring a landing area of functional liquid.
Figure 8B:
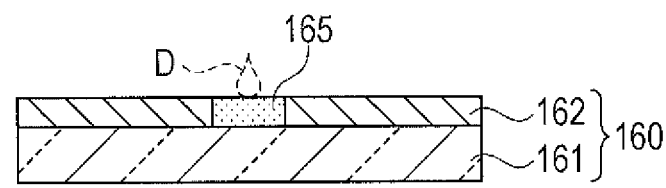
Figure 8C:
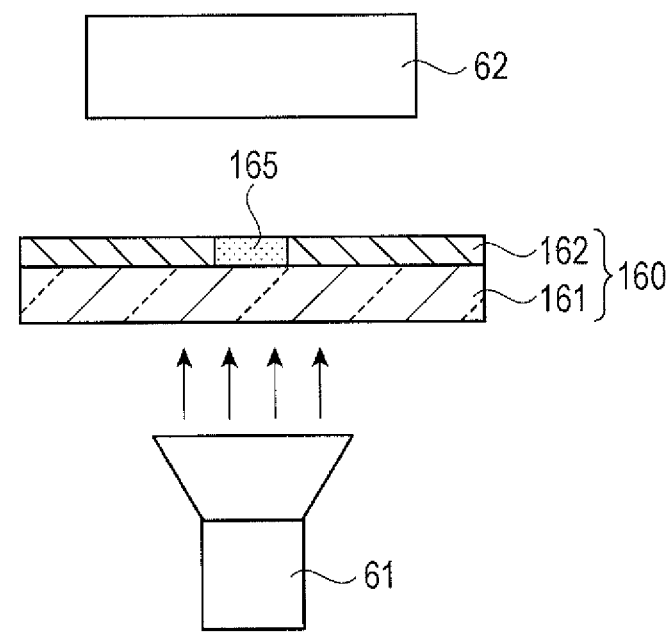

Hereinafter, a description will be given of a functional liquid landing area measurement method capable of precisely measuring an ejection amount of substantially transparent functional liquid with reference to FIGS. 8A to 8C and 9. FIGS. 8A to 8C are outline cross-sectional views showing a functional liquid landing area measurement method, and FIG. 9 is a photograph showing landing marks of the liquid droplets.

The functional liquid ejection amount measurement method according to this embodiment includes: an ejection step for measurement, in which a predetermined amount of functional liquid for the plurality of nozzles 52 is ejected as a plurality of liquid droplets D from the plurality of nozzles 52 of the ejection heads 50 to the medium 160 as shown in FIG. 8A; and a measurement step, in which functional liquid landing areas on the medium 160 are measured for the plurality of nozzles 52 as shown in FIG. 8C. The medium 160 includes a transparent base film 161 and an receiving later 162 which is formed on the surface of the base film 161 and receives and accommodates the functional liquid. As shown in FIG. 8B, the liquid droplets D ejected from the nozzles 52 and landed on the receiving later 162 penetrate and are accommodated in the receiving later 162 and form landing marks 165. In the measurement step, the illumination unit 61 illuminates the medium 160 from the back surface side, and the imaging unit 62 images the landing marks 165. Since it has been known that there is a correlation between the landing areas of the landing marks 165 and the ejection amount of the ejected functional liquid, it is possible to estimate the ejection amount of the functional liquid ejected from each nozzle 52 and variations thereof by obtaining landing areas of the landing marks 165 and variations thereof from the captured image.

The functional liquid according to this embodiment is used when a functional layer of an organic electroluminescence (EL) device which will be described later is formed in a liquid phase process (ink jet method), The functional liquid contains a functional layer forming material and solvent and is substantially transparent. The solvent is not necessarily one type of solvent, and it is desirable to select solvent with a boiling point of approximately 200° C. or higher such that the ejected functional liquid does not dry easily. Examples of the solvent include ethylene glycol (boiling point: 197.3° C.) which is an aliphatic solvent, cyclohexylbenzene (boiling point: 240° C.) which is an aromatic solvent, and 1,4-dimethylnaphthalene (boiling point: 247° C.).

As the medium 160, Graphic Arts Transparent Film manufactured by Pictorico Co., Ltd. is used. As the base film 161, a polyethylene terephthalate (PET) film with a thickness of approximately 145 μm is used. Although a detailed structure of the receiving layer 162 has not been disclosed, it is possible to select a receiving layer 162 with a thickness corresponding to the functional liquid to be applied. In this embodiment, a medium 160 which includes a receiving layer 162 with a thickness of 35 μm is used.

In the ejection process for measurement, the ejection heads 50 and the medium 160 are made to face each other, and the functional liquid is ejected as the plurality of liquid droplets D from the plurality of nozzles 52 of the ejection heads 50 as shown in FIG. 8A. In addition, the plurality of liquid droplets D are repeatedly ejected at predetermined ejection timing during the main scanning, in which the ejection heads 50 and the medium 160 are relatively moved in the main scanning direction. That is, a plurality of landing marks 165 appear on the medium 160 in the main scanning direction, and the same number of landing marks as the number of ejecting nozzles 52 appear in the sub scanning direction. In addition, since it becomes difficult to precisely measure the landing areas if the plurality of liquid droplets D are made to land at the same position in the receiving later 162 over a functional liquid acceptable amount of the receiving later 162 and the landing marks 165 bleed, the landing positions of the plurality of liquid droplets D are made to deviate from each other in units of microns (μm)

FIG. 9 is a photograph showing the landing marks of the functional liquid generated in the ejection step for measurement.

By the ejection process for measurement as described above, it is possible to obtain clear landing marks 165 by causing the plurality of liquid droplets D to be landed on the medium 160 while the liquid droplets D are made to deviate from each other in units of microns (μm) as shown in FIG. 9. Therefore, precision in measuring the landing areas of the landing marks 165 is enhanced. In addition, FIG. 9 shows a state where ten liquid droplets D, each of which is 10 pl, are ejected from each of the plurality of nozzles 52 onto the medium 160 which includes the receiving later 162 with a thickness of 35 μm such that the landing positions are made to deviate from each other by 1 μm.

In addition, light penetrating through parts of the receiving later 162, which the substantially transparent functional liquid is landed on and penetrates to, is scattered as compared with the other parts. For this reason, the parts of the receiving later 162, which the functional liquid is landed on and penetrates to, are brighter than the other part, and therefore, the image processing unit 63 performs processing for emphasizing the brightness difference.

In the landing area measurement step, the landing areas of the plurality of landing marks 165 produced in the ejection step for measurement are measured for the respective nozzles 52. Then, an average value, for example, of the landing areas of the plurality of landing marks 165 is calculated, and the ejection amounts of the nozzles 52 and variations thereof are estimated from the average value. Such landing area measurement is performed for each of the plurality of nozzles 52. The number of landing marks 165 measured per nozzle 52 is forty, for example.

As described above, it is possible to precisely obtain the ejection amount of the functional liquid ejected from the plurality of nozzles 52 and variations thereof. A description will be given of how the driving signal COM for driving the piezoelectric element 59 for each nozzle 52 is set based on the obtained ejection amount of the functional liquid and variations thereof for each of the nozzles 52 and how variations in the total amount (also referred to as a filling amount) of the functional liquid ejected onto the ejecting region are suppressed as a result based on an example of a specific functional liquid ejecting method.

Functional Liquid Ejecting Method and Nozzle Ejection Amount Correcting Method

First, a description will be given of a functional liquid ejecting method according to this embodiment with reference to FIG. 10.

Figure 10:
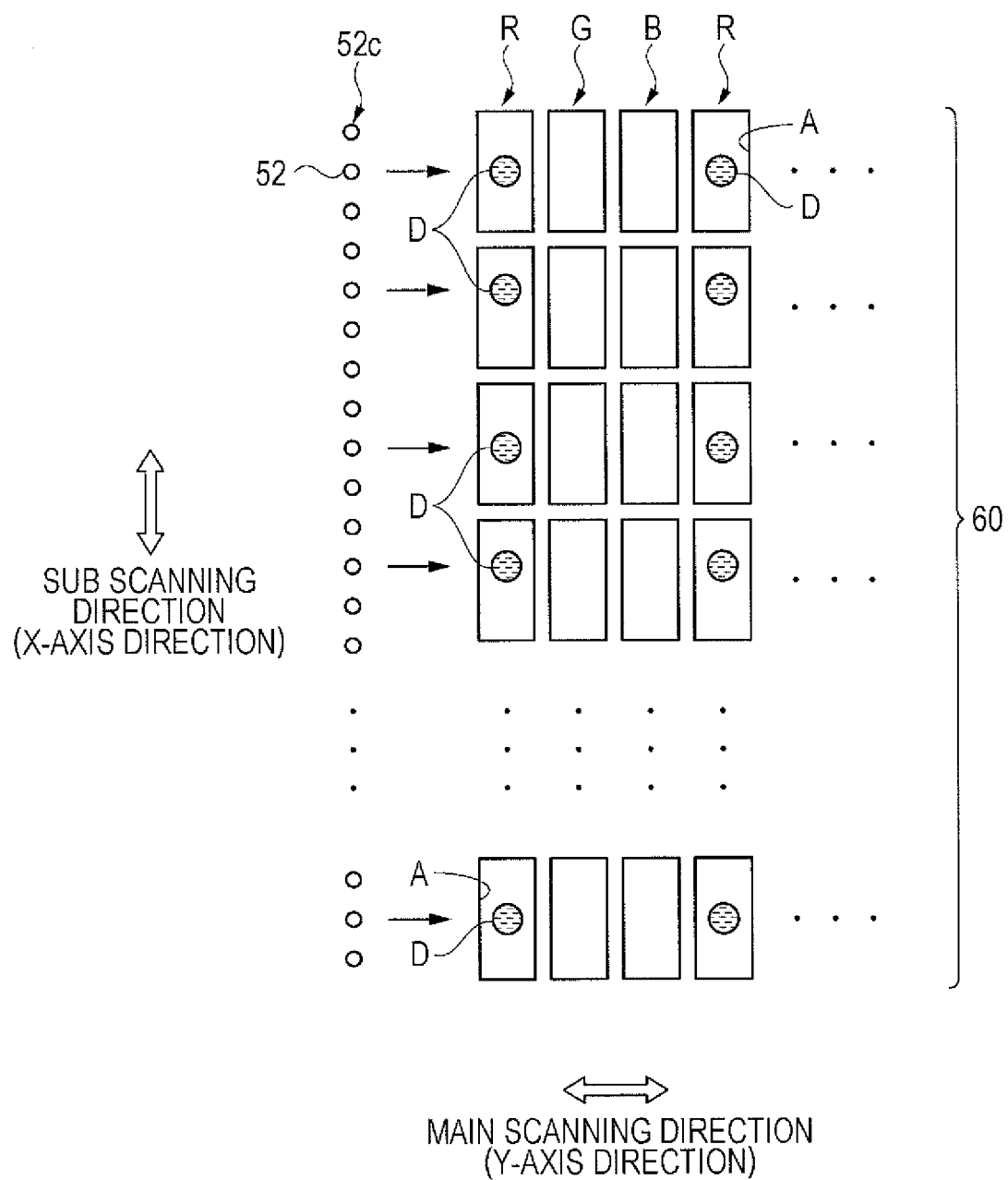
FIG. 10 is an outline planar view showing an example of a functional liquid ejecting method.

FIG. 10 is an outline planar view showing an example of a functional liquid ejecting method.

The functional liquid ejecting method according to this embodiment is applied to a liquid phase process for forming a functional layer in an organic EL device manufacturing method which will be described later, by ejecting functional liquid which contains a functional layer forming material onto an ejecting region and drying and fixing the ejected functional liquid.

As shown in FIG. 10, each ejecting region A has a substantially rectangular shape which has a pair of opposite sides longer than the other pair of sides, and a plurality of ejecting regions A are aligned in the sub scanning direction (X-axis direction) and the main scanning direction (Y-axis direction) on the work W such that the longitudinal direction of the ejecting regions A is along the sub scanning direction. In addition, the plurality of ejecting regions A are classified corresponding to red (R), green (G), and blue (B), and stripe-shaped arrangement in which ejecting regions A with the same color are aligned in the sub scanning direction (X-axis direction) and ejecting regions A with different colors are repeatedly aligned in units of red (R), green (G), and blue (B) in the main scanning direction (Y-axis direction) is employed. In addition, arrangement of the ejecting regions A is not limited thereto.

The nozzle array 52c (including the nozzle array 52a and the nozzle array 52b; see FIGS. 2A and 2B) of each ejection head 50 is arranged to face the plurality of ejecting regions A in the sub scanning direction (X-axis direction).

The functional liquid is ejected as the liquid droplets D onto the ejecting regions A from the nozzles 52 selected among the nozzle array 52c while the work W is arranged to face the ejection heads 50 and work W is moved relative to the ejection head 50 in the main scanning direction (main scanning). Particularly, when different kinds of functional liquid is ejected for R, G, and B, the liquid droplets D are selectively ejected on the ejecting region A of R among R, G, and B, for example, in the main scanning direction as shown in FIG. 10. The same is true to the ejecting regions A of G and B.

In the example of the functional liquid ejecting method shown in FIG. 10, the length of each ejecting region A in the sub scanning direction is approximately 200 µm, for example, and an arrangement pitch of the ejecting regions A in the sub scanning direction is approximately 250 µm, for example. Therefore, since an arrangement pitch of the nozzles 52 in the nozzle array 52c when viewed from the main scanning direction is approximately 70 µm, a maximum of three nozzles 52 covers an ejecting region A in the main scanning direction. In the main scanning, a nozzle 52 is selected among the plurality of nozzles 52 which cover the ejecting region A such that a liquid droplet D lands near a center of the ejecting region A in the longitudinal direction.

Hereinafter, a description will be given of a functional liquid ejecting method, to which the nozzle ejection amount correcting method according to the invention is applied, based on a comparative example and an example, in which a predetermined amount of functional liquid is ejected as five liquid droplets D onto one ejecting region A. In the following description of the comparative example and the example, the main scanning will be referred to as a pass. In addition, the number of ejected liquid droplets D in respective main scanning will be referred to as a shot number.

Since the nozzle array 52c includes the nozzle array 52a which includes 180 nozzles 52 and the nozzle array 52b which similarly includes 180 nozzles 52 as described above, the nozzle array 52c is configured by a total of 360 nozzles 52. Among the 360 nozzles 52, 340 nozzles 52 excluding 10 nozzles 52 positioned at both ends of the nozzle array 52c are utilized as effective nozzles. The following comparative example and the example will be described on the assumption that the number of ejecting regions A covered by the effective nozzles is 60 (see FIG. 10) in the main scanning using the effective nozzles.

Comparative Example

In a functional liquid ejecting method according to a comparative example, a predetermined amount of functional liquid is ejected as five liquid droplets D onto one ejecting region A over four passes. Specifically, one liquid droplet D is ejected in each of first to third passes, and two liquid droplets D are ejected at the final fourth pass. In addition, nozzles 52 to be selected are changed for each pass. That is, the nozzle array 52c is sub-scanned and a relative position with respect to the ejecting region A is changed for each pass in actual ejection of the liquid droplets D. A method of dispersing variations in the ejection amounts of the liquid droplets D due to a difference of ejection properties of the nozzles 52 by ejecting the liquid droplets D from different nozzles 52 for each pass is employed.

The nozzle ejection amount correcting method in such a functional liquid ejecting method according to the comparative example is a method, to which the invention disclosed in JP-A-2012-209216 in the above description of the related art is applied.

A description will be given of the nozzle ejection amount correcting method according to the comparative example with reference to FIGS. 11 to 15. FIG. 11 is a table showing variations in functional liquid filling amounts and driving signal correction amounts in a first correction step in the nozzle ejection amount correcting method according to the comparative example. FIG. 12 is a table showing variations in functional liquid filling amounts and driving signal correction amounts in a second correction step in the nozzle ejection amount correcting method according to the comparative example. FIG. 13 is a table showing variations in functional liquid filling amounts and driving signal correction amounts in a third correction step in the nozzle ejection amount correcting method according to the comparative example. FIG. 14 is a table showing variations in functional liquid filling amounts and driving signal correction amounts in a fourth correction step in the nozzle ejection amount correcting method according to the comparative example. FIG. 15 is a table showing variations in functional liquid filling amounts after final correction in the nozzle ejection amount correcting method according to the comparative example.

The nozzle ejection amount correcting method according to the comparative example includes the first to fourth correction steps for correcting the plurality of driving signals COM in a stepwise manner for each of the plurality of (four) passes.

First, in the first correction step, a total amount (filling amount) of the functional liquid in a case where liquid droplets D are respectively ejected onto the ejecting regions A from the selected nozzles 52 by using the driving signals COM before correction from the first to fourth passes is calculated for every sixty ejecting regions A. Specifically, the driving signals COM before correction are applied to the piezoelectric elements 59 which are actuators of the effective nozzles, a plurality of liquid droplets D are respectively ejected from the effective nozzles onto the medium 160, the ejection amounts of the liquid droplets D and variations thereof are estimated by measuring the landing areas of the landing marks 165, and the functional liquid filling amounts are expressed as numerical values. In the comparative example, a filling amount of the functional liquid to be ejected to one ejecting region A, namely the predetermined amount set in advance according to the invention is expressed as a numerical value of "5.0000".

In a first (No. 1) ejecting region A, for example, the ejection amount of the liquid droplets D ejected from the nozzle 52 selected at the first pass is "0.98845, the ejection amount at the second pass is "1.02080", the ejection amount at the third pass is "1.00433", and the ejection amount at the fourth pass is "1.00250" according to the calculation result of the functional liquid filling amounts in the first correction step of the comparative example as shown in FIG. 11. Since the ejection amount of one liquid droplet D at each pass is shown, the ejection amount at the fourth pass is actually double since two liquid droplets D are ejected at the fourth pass. Therefore, the total amount (filling amount) of the functional liquid ejected to the first ejecting region A after the fourth pass is "5.01858", and a difference (deviation amount) from the predetermined amount "5.0000" is "0.01858". The maximum value of the difference (deviation amount) from the predetermined amount in the sixty ejecting regions A is "0.07899" in the fourteenth ejecting region A. The minimum value of the difference (deviation amount) from the predetermined amount in the sixty ejecting regions A is "−0.11223" in the tenth ejecting region A. Therefore, a range of the difference (deviation amount) between the total amount (filling amount) of the functional liquid ejected onto the sixty ejecting regions A and the predetermined amount is "0.19122". A proportion of the range with respect to the predetermined amount is "3.82%".

In the first correction step of the comparative example, the correction amounts of the driving signals COM applied to the piezoelectric elements 59 of the nozzles 52 selected at the first pass are calculated so as to cancel out the deviation amount "0.01858" in the first (No. 1) ejecting region A, for example, only by correction of the ejection amount of the liquid droplet D ejected at the first pass. A relationship between the potential of the waveforms of the driving signals COM and the ejection amount of the liquid droplets D is obtained in advance as a standard curve, and correction amounts of the driving signals COM are calculated based on the standard curve. Based on the correction amounts, the nozzles 52 selected at the first pass are classified into eight ranks, for example. The nozzles 52 selected at the first pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the first correction step of the comparative example, a correction rate of the driving signal COM1 is set to "103.6%", a correction rate of the driving signal COM2 is set to "99.8%", a correction rate of the driving signal COM3 is set to "97.8%", and a correction rate of the driving signal COM4 is set to "95.5%". A difference between the maximum correction rate (MAX) and the minimum correction rate (MIN) of the driving signals is 8.1%. In addition, ½ of the difference between the maximum correction rate (MAX) and the minimum correction rate (MIN) of the driving signals COM is set as a reference voltage of the driving signals COM. Then, the processing proceeds to a second correction step.

In the second correction step of the example, the correction (first signal correction) of the plurality of driving signals COM (COM1 to COM4) calculated in the first correction step is applied to the first pass, and the ejection amounts of the respective ejecting regions A are calculated. The ejection amounts in a case where the liquid droplets D are ejected by applying the driving signals COM before correction are used without any change at the second to fourth passes in the same manner as in the first correction step. Then, the total amount (filling amount) of the functional liquid ejected to the respective ejecting regions A after completion of the fourth pass is calculated again.

In the first (No. 1) ejecting region A, for example, the ejection amount at the first pass is "0.95464", the ejection amount at the second pass is "1.02080", the ejection amount at the third pass is "1.00433", and the ejection amount at the fourth pass is "1.00250" according to the calculation result of the functional liquid filling amounts in the second correction step of the comparative example as shown in FIG. 12. Therefore, the total amount (filling amount) of the functional liquid ejected to the first ejecting region A after the fourth pass is "4.98477", and a difference (deviation amount) from the predetermined amount "5.0000" is "−0.01523". The maximum value of the difference (deviation amount) from the predetermined amount in the sixty ejecting regions A is "0.03176". The minimum value of the difference (deviation amount) from the predetermined amount in the sixty ejecting regions A is "−0.03139". Therefore, a range of the difference between the total amount (filling amount) of the functional liquid ejected onto the sixty ejecting regions A and the predetermined amount is "0.06315". A proportion of the range with respect to the predetermined amount is "1.26%".

In the second correction step of the comparative example, the correction amounts of the driving signals COM applied to the piezoelectric elements 59 of the nozzles 52 selected at the second pass are calculated so as to cancel out the deviation amount "−0.01523" in the first ejecting region A, for example, only by correction of the ejection amount of the liquid droplets D ejected at the second pass in the same manner as in the first correction step. Based on the correction amounts, the nozzles 52 selected at the second pass are classified into eight ranks, for example. The nozzles 52 selected at the second pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the second correction step of the comparative example, a correction rate of the driving signal COM1 is set to "101.6%", a correction rate of the driving signal COM2 is set to "100.8%", a correction rate of the driving signal COM3 is set to "99.4%", and a correction rate of the driving signal COM4 is set to "97.5%". A difference between the maximum correction rate (MAX) and the minimum correction rate (MIN) of the driving signals COM is 4.1%. In addition, ½ of the difference between the maximum correction rate (MAX) and the minimum correction rate (MIN) of the driving signals COM is set as a reference voltage of the driving signals COM. Then, the processing proceeds to a third correction step.

In the third correction step of the comparative example, the correction (second signal correction) of the plurality of driving signals COM (COM1 to COM4) calculated in the second correction step is applied to the second pass, and the ejection amounts of the respective ejecting regions A are calculated. The ejection amounts in a case where the liquid droplets D are ejected by applying the driving signals COM before correction are used without any change at the third and fourth passes. Then, the total amount (filling amount) of the functional liquid ejected to the respective ejecting regions A after completion of the fourth pass is calculated again.

In the first (No. 1) ejecting region A, for example, the ejection amount at the first pass is "0.95464, the ejection amount at the second pass is "1.03507", the ejection amount at the third pass is "1.00433", and the ejection amount at the fourth pass is "1.00250" according to the calculation result of the functional liquid filling amounts in the third correction step of the comparative example as shown in FIG. 13. Therefore, the total amount (filling amount) of the functional liquid ejected to the first ejecting region A after the fourth pass is "4.99903", and a difference (deviation amount) from the predetermined amount "5.0000" is "−0.00097". The maximum value of the difference (deviation amount) from the predetermined amount in the sixty ejecting regions A is "0.01285". The minimum value of the difference (deviation amount) from the predetermined amount in the sixty ejecting regions A is "−0.01520". Therefore, a range of the difference between the total amount (filling amount) of the functional liquid ejected onto the sixty ejecting regions A and the predetermined amount is "0.02805". A proportion of the range with respect to the predetermined amount is "0.56%".

In the third correction step of the comparative example, the correction amounts of the driving signals COM applied to the piezoelectric elements 59 of the nozzles 52 selected at the third pass are calculated so as to cancel out the deviation amount "−0.00097" in the first ejecting region A, for example, only by correction of the ejection amount of the liquid droplets D ejected at the third pass in the same manner as in the second correction step. Based on the correction amounts, the nozzles 52 selected at the third pass are classified into eight ranks, for example. The nozzles 52 selected at the third pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the third correction step of the comparative example, a correction rate of the driving signal COM1 is set to "100.3%", a correction rate of the driving signal COM2 is set to "100.0%", a correction rate of the driving signal COM3 is set to "99.6%", and a correction rate of the driving signal COM4 is set to "98.9%". A difference between the maximum correction rate (MAX) and the minimum correction rate (MN) of the driving signals COM is 1.4%. In addition, ½ of the difference between the maximum correction rate (MAX) and the minimum correction rate (MIN) of the driving signals COM is set as a reference voltage of the driving signals COM. Then, the processing proceeds to a fourth correction step.

In the fourth correction step of the comparative example, the correction (third signal correction) of the plurality of driving signals COM (COM1 to COM4) calculated in the third correction step is applied to the third pass, and the ejection amounts of the respective ejecting regions A are calculated. The ejection amounts in a case where the liquid droplets D are ejected by applying the driving signals COM before correction are used without any change at the fourth pass. Then, the total amount (filling amount) of the functional liquid ejected to the respective ejecting regions A after completion of the fourth pass is calculated again.

In the first (No. 1) ejecting region A, for example, the ejection amount at the first pass is "0.95464, the ejection amount at the second pass is "1.03507", the ejection amount at the third pass is "1.00650", and the ejection amount at the fourth pass is "1.00250" according to the calculation result of the functional liquid filling amounts in the fourth correction step of the comparative example as shown in FIG. 14. Therefore, the total amount (filling amount) of the functional liquid ejected to the first ejecting region A after the fourth pass is "5.00120", and a difference (deviation amount) from the predetermined amount "5.0000" is "0.00120". The maximum value of the difference (deviation amount) from the predetermined amount in the sixty ejecting regions A is "0.00598". The minimum value of the difference (deviation amount) from the predetermined amount in the sixty ejecting regions A is "−0.00576". Therefore, a range of the difference between the total amount (filling amount) of the functional liquid ejected onto the sixty ejecting regions A and the predetermined amount is "0.01174". A proportion of the range with respect to the predetermined amount is "0.23%".

In the fourth correction step of the comparative example, the correction amounts of the driving signals COM applied to the piezoelectric elements 59 of the nozzles 52 selected at the fourth pass are calculated so as to cancel out the deviation amount "0.00120" in the first ejecting region A, for example, only by correction of the ejection amount of the liquid droplets D ejected at the fourth pass in the same manner as in the third correction step. Based on the correction amounts, the nozzles 52 selected at the fourth pass are classified into eight ranks, for example. The nozzles 52 selected at the fourth pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the fourth correction step of the comparative example, a correction rate of the driving signal COM1 is set to "100.2", a correction rate of the driving signal COM2 is set to "100.0%", a correction rate of the driving signal COM3 is set to "100.0", and a correction rate of the driving signal COM4 is set to "99.9%". A difference between the maximum correction rate (MAX) and the minimum correction rate (MIN) of the driving signals COM is 0.3%. In addition, ½ of the difference between the maximum correction rate (MAX) and the minimum correction rate (MIN) of the driving signals COM is set as a reference voltage of the driving signals COM. Then, the processing proceeds to a final step.

In the final step of the comparative example, the correction (fourth signal correction) of the plurality of driving signals COM (COM1 to COM4) calculated in the fourth correction step is applied to the fourth pass, and the ejection amounts of the respective ejecting regions A are calculated. The total amount (filling amount) of the functional liquid ejected to the respective ejecting regions A after completion of the fourth pass is calculated again.

In the first (No. 1) ejecting region A, for example, the ejection amount at the first pass is "0.95464, the ejection amount at the second pass is "1.03507", the ejection amount at the third pass is "1.00650", and the ejection amount at the fourth pass is "1.00223" according to the calculation result of the functional liquid filling amounts in the final step of the comparative example as shown in FIG. 15. Therefore, the total amount (filling amount) of the functional liquid ejected to the first ejecting region A after the fourth pass is "5.00067", and a difference (deviation amount) from the predetermined amount "5.0000" is "0.00067". The maximum value of the difference (deviation amount) from the predetermined amount in the sixty ejecting regions A is "0.00244". The minimum value of the difference (deviation amount) from the predetermined amount in the sixty ejecting regions A is "−0.00237". Therefore, a range of the difference between the total amount (filling amount) of the functional liquid ejected onto the sixty ejecting regions A and the predetermined amount is "0.00481". A proportion of the range with respect to the predetermined amount is "0.10%".

Example

In a functional liquid ejecting method according to an example, a predetermined amount of functional liquid is ejected as five liquid droplets D onto one ejecting region A over four passes in the same manner as in the comparative example. Specifically, two liquid droplets D are ejected at the first pass, and one liquid droplet D is ejected at each of the second to fourth passes. In addition, nozzles 52 to be selected are changed for each pass. That is, a method of dispersing variations in the ejection amounts of the liquid droplets D due to a difference of ejection properties of the nozzles 52 by ejecting the liquid droplets D from different nozzles 52 for each pass is employed.

Although the nozzle ejection amount correcting method in such a functional liquid ejecting method according to the example is a method to which the invention disclosed in JP-A-2012-209216 in the above description of the related art is basically applied, the example is different from the comparative example in that the number of ejected liquid droplets D (shot number) at the first pass is larger than that at the other passes. Furthermore, the example is different from the comparative example in that the nozzle ejection amounts are corrected in a stepwise manner in priority to main scanning, in which the number of ejected droplets D (shot number) is the largest, among the main scanning performed a plurality of times for ejecting the liquid droplets D in practice.

A description will be given of the nozzle ejection amount correcting method according to the example with reference to FIGS. 16 to 20. FIG. 16 is a table showing functional liquid filling amounts and driving signal correction amounts in a first correction step in the nozzle ejection amount correcting method according to the example. FIG. 17 is a table showing functional liquid filling amounts and driving signal correction amounts in a second correction step in the nozzle ejection amount correcting method according to the example. FIG. 18 is a table showing functional liquid filling amounts and driving signal correction amounts in a third correction step in the nozzle ejection amount correcting method according to the example. FIG. 19 is a table showing functional liquid filling amounts and driving signal correction amounts in a fourth correction step in the nozzle ejection amount correcting method according to the example. FIG. 20 is a table showing functional liquid filling amounts after final correction in the nozzle ejection amount correcting method according to the example.

The nozzle ejection amount correcting method according to the example includes the first to fourth correction steps for correcting the plurality of driving signals COM in a stepwise manner for each of the plurality of (four) passes.

First, in the first correction step, a total amount (filling amount) of the functional liquid in a case where liquid droplets D are ejected onto the ejecting regions A from the selected nozzles 52 by using the driving signals COM before correction from the first to fourth passes is calculated for every sixty ejecting regions A. Although the basic idea relating to the correction of the driving signals COM in the first correction step is the same as that of the comparative example, a calculation result is not necessarily the same as that in the first correction step of the comparative example due to an influence of the number of ejected liquid droplets, since two liquid droplets D are ejected from each of the selected nozzles 52 at the first pass. The driving signals COM before correction are applied to the piezoelectric elements 59 which are actuators, a plurality of liquid droplets D are respectively ejected from the effective nozzles onto the medium 160, the ejection amounts of the liquid droplets D and variations thereof are estimated by measuring the landing areas of the landing marks 165, and the functional liquid filling amount is expressed as numerical values. In the example, a filling amount of the functional liquid to be ejected to one ejecting region A, namely the predetermined amount set in advance according to the invention, is expressed as a numerical value of "5.0000" in the same manner as in the comparative example.

In a first (No. 1) ejecting region A, for example, the ejection amount of the liquid droplets D ejected from the nozzle 52 selected at the first pass is "0.99643, similarly, the ejection amount at the second pass is "1.02080", the ejection amount at the third pass is "1.00433", and the ejection amount at the fourth pass is "1.00250" according to the calculation result of the functional liquid filling amounts in the first correction step of the example as shown in FIG. 16. Since the ejection amount of one liquid droplet D at each pass is shown, the ejection amount at the first pass is actually double since two liquid droplets D are ejected at the first pass. Therefore, the total amount (filling amount) of the functional liquid ejected to the first ejecting region A after the fourth pass is "5.02049", and a difference (deviation amount) from the predetermined amount "5.0000" is "0.02049". The maximum value of the difference (deviation amount) from the predetermined amount in the sixty ejecting regions A is "0.09801" in the fifty eighth ejecting region A. The minimum value of the difference (deviation amount) from the predetermined amount in the sixty ejecting regions A is "−0.07126 in the twentieth ejecting region A. Therefore, a range of the difference (deviation amount) between the total amount (filling amount) of the functional liquid ejected onto the sixty ejecting regions A and the predetermined amount is "0.16927". A proportion of the range with respect to the predetermined amount is "3.39%".

In the first correction step of the example, the correction amounts of the driving signals COM applied to the piezoelectric elements 59 of the nozzles 52 selected at the first pass are calculated so as to cancel out the deviation amount "0.02049" in the first (No. 1) ejecting region A, for example, only by correction of the ejecting amount of the two liquid droplets D ejected at the first pass. A relationship between the potential of the waveforms of the driving signals COM and the ejection amount of the liquid droplets D is obtained in advance as a standard curve, and correction amounts of the driving signals COM are calculated based on the standard curve. Based on the correction amounts, the nozzles 52 selected at the first pass are classified into eight ranks, for example. The nozzles 52 selected at the first pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the first correction step of the example, a correction rate of the driving signal COM1 is set to "101.5%", a correction rate of the driving signal COM2 is set to "99.9%", a correction rate of the driving signal COM3 is set to "98.9%", and a correction rate of the driving signal COM4 is set to "97.5%". A difference between the maximum correction rate (MAX) and the minimum correction rate (MIN) of the driving signals COM is 4.0%. In addition, ½ of the difference between the maximum correction rate (MAX) and the minimum correction rate (MIN) of the driving signals COM is set as a reference voltage of the driving signals COM. The difference between the maximum correction rate (MAX) and the minimum correction rate (MIN) of the driving signals COM is substantially a half of that in the comparative example in comparison between the comparative example and the example at the timing of the first correction step. Then, the processing proceeds to a second correction step.

In the second correction step of the example, the correction (first signal correction) of the plurality of driving signals COM (COM1 to COM4) calculated in the first correction step is applied to the first pass, and the ejection amounts of the respective ejecting regions A are calculated. The ejection amounts in a case where the liquid droplets D are ejected by applying the driving signals COM before correction are used without any change at the second to fourth passes in the same manner as in the first correction step. Then, the total amount (filling amount) of the functional liquid ejected to the respective ejecting regions A after completion of the fourth pass is calculated again.

In the first (No. 1) ejecting region A, for example, the ejection amount at the first pass is "0.97899, the ejection amount at the second pass is "1.02080", the ejection amount at the third pass is "1.00433", and the ejection amount at the fourth pass is "1.00250" according to the calculation result of the functional liquid filling amounts in the second correction step of the example as shown in FIG. 17. Therefore, the total amount (filling amount) of the functional liquid ejected to the first ejecting region A after the fourth pass is "4.98561", and a difference (deviation amount) from the predetermined amount "5.0000" is "−0.01439". The maximum value of the difference (deviation amount) from the predetermined amount in the sixty ejecting regions A is "0.02702". The minimum value of the difference (deviation amount) from the predetermined amount in the sixty ejecting regions A is "−0.02566". Therefore, a range of the difference between the total amount (filling amount) of the functional liquid ejected onto the sixty ejecting regions A and the predetermined amount is "0.05268". A proportion of the range with respect to the predetermined amount is "1.05%".

In the second correction step of the example, the correction amounts of the driving signals COM applied to the piezoelectric elements 59 of the nozzles 52 selected at the second pass are calculated so as to cancel out the deviation amount "−0.01439" in the first ejecting region A, for example, only by correction of the ejection amount of the liquid droplets D ejected at the second pass in the same manner as in the first correction step. Based on the correction amounts, the nozzles 52 selected at the second pass are classified into eight ranks, for example. The nozzles 52 selected at the second pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the second correction step of the example, a correction rate of the driving signal COM1 is set to "101.4%", a correction rate of the driving signal COM2 is set to "100.4%", a correction rate of the driving signal COM3 is set to "99.7%", and a correction rate of the driving signal COM4 is set to "99.1%". A difference between the maximum correction rate (MAX) and the minimum correction rate (MN) of the driving signals COM is 2.3%. In addition, ½ of the difference between the maximum correction rate (MAX) and the minimum correction rate (MN) of the driving signals COM is set as a reference voltage of the driving signals COM. Then, the processing proceeds to a third correction step.

In the third correction step of the example, the correction (second signal correction) of the plurality of driving signals COM (COM1 to COM4) calculated in the second correction step is applied to the second pass, and the ejection amounts of the respective ejecting regions A are calculated. The ejection amounts in a case where the liquid droplets D are ejected by applying the driving signals COM before correction are used without any change at the third and fourth passes. Then, the total amount (filling amount) of the functional liquid ejected to the respective ejecting regions A after completion of the fourth pass is calculated again.

In the first (No. 1) ejecting region A, for example, the ejection amount at the first pass is "0.97899, the ejection amount at the second pass is "1.03415", the ejection amount at the third pass is "1.00433", and the ejection amount at the fourth pass is "1.00250" according to the calculation result of the functional liquid filling amounts in the third correction step of the example as shown in FIG. 18. Therefore, the total amount (filling amount) of the functional liquid ejected to the first ejecting region A after the fourth pass is "4.99895", and a difference (deviation amount) from the predetermined amount "5.0000" is "−0.00105". The maximum value of the difference (deviation amount) from the predetermined amount in the sixty ejecting regions A is "0.00777". The minimum value of the difference (deviation amount) from the predetermined amount in the sixty ejecting regions A is "−0.00640". Therefore, a range of the difference between the total amount (filling amount) of the functional liquid ejected onto the sixty ejecting regions A and the predetermined amount is "0.01417". A proportion of the range with respect to the predetermined amount is "0.28%".

In the third correction step of the example, the correction amounts of the driving signals COM applied to the piezoelectric elements 59 of the nozzles 52 selected at the third pass are calculated so as to cancel out the deviation amount "−0.00105" in the first ejecting region A, for example, only by correction of the ejection amount of the liquid droplets D ejected at the third pass in the same manner as in the second correction step. Based on the correction amounts, the nozzles 52 selected at the third pass are classified into eight ranks, for example. The nozzles 52 selected at the third pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the third correction step of the example, a correction rate of the driving signal COM1 is set to "100.4%", a correction rate of the driving signal COM2 is set to "100.2%", a correction rate of the driving signal COM3 is set to "100.0%", and a correction rate of the driving signal COM4 is set to "99.7%". A difference between the maximum correction rate (MAX) and the minimum correction rate (MIN) of the driving signals COM is 0.7%. In addition, ½ of the difference between the maximum correction rate (MAX) and the minimum correction rate (MIN) of the driving signals COM is set as a reference voltage of the driving signals COM. Then, the processing proceeds to a fourth correction step.

In the fourth correction step of the example, the correction (third signal correction) of the plurality of driving signals COM (COM1 to COM4) calculated in the third correction step is applied to the third pass, and the ejection amounts of the respective ejecting regions A are calculated. The ejection amounts in a case where the liquid droplets D are ejected by applying the driving signals COM before correction are used without any change at the fourth pass. Then, the total amount (filling amount) of the functional liquid ejected to the respective ejecting regions A after completion of the fourth pass is calculated again.

In the first (No. 1) ejecting region A, for example, the ejection amount at the first pass is "0.97899, the ejection amount at the second pass is "1.03415, the ejection amount at the third pass is "1.00433", and the ejection amount at the fourth pass is "1.00250" according to the calculation result of the functional liquid filling amounts in the fourth correction step of the example as shown in FIG. 19. Therefore, the total amount (filling amount) of the functional liquid ejected to the first ejecting region A after the fourth pass is "4.99895", and a difference (deviation amount) from the predetermined amount "5.0000" is "–0.00105". The maximum value of the difference (deviation amount) from the predetermined amount in the sixty ejecting regions A is "0.00284". The minimum value of the difference (deviation amount) from the predetermined amount in the sixty ejecting regions A is "–0.00260". Therefore, a range of the difference between the total amount (filling amount) of the functional liquid ejected onto the sixty ejecting regions A and the predetermined amount is "0.00544". A proportion of the range with respect to the predetermined amount is "0.11%".

In the fourth correction step of the example, the correction amounts of the driving signals COM applied to the piezoelectric elements 59 of the nozzles 52 selected at the fourth pass are calculated so as to cancel out the deviation amount "–0.00105" in the first ejecting region A, for example, only by correction of the ejection amount of the liquid droplets D ejected at the fourth pass in the same manner as in the third correction step. Based on the correction amounts, the nozzles 52 selected at the fourth pass are classified into eight ranks, for example. The nozzles 52 selected at the third pass in the sixty ejecting regions A are respectively classified into ranks. Then, the plurality of driving signals COM are uniformly allocated in accordance with the ranks of the sixty selected nozzles 52. For example, two ranks among the eight ranks are allocated to one of the four driving signals COM.

In the fourth correction step of the example, a correction rate of the driving signal COM1 is set to "100.1%", a correction rate of the driving signal COM2 is set to "100.1%", a correction rate of the driving signal COM3 is set to "100.0%", and a correction rate of the driving signal COM4 is set to "99.9%". A difference between the maximum correction rate (MAX) and the minimum correction rate (MIN) of the driving signals COM is 0.3%. In addition, ½ of the difference between the maximum correction rate (MAX) and the minimum correction rate (MIN) of the driving signals COM is set as a reference voltage of the driving signals COM. Then, the processing proceeds to a final step.

In the final step of the example, the correction (fourth signal correction) of the plurality of driving signals COM (COM1 to COM4) calculated in the fourth correction step is applied to the fourth pass, and the ejection amounts of the respective ejecting regions A are calculated. The total amount (filling amount) of the functional liquid ejected to the respective ejecting regions A after completion of the fourth pass is calculated again.

In the first (No. 1) ejecting region A, for example, the ejection amount at the first pass is "0.97899, the ejection amount at the second pass is "1.03417", the ejection amount at the third pass is "1.00433, and the ejection amount at the fourth pass is "1.00363" according to the calculation result of the functional liquid filling amounts in the final step of the example as shown in FIG. 20. Therefore, the total amount (filling amount) of the functional liquid ejected to the first ejecting region A after the fourth pass is "5.00008", and a difference (deviation amount) from the predetermined amount "5.0000" is "0.00008". The maximum value of the difference (deviation amount) from the predetermined amount in the sixty ejecting regions A is "0.00076". The minimum value of the difference (deviation amount) from the predetermined amount in the sixty ejecting regions A is "–0.00078". Therefore, a range of the difference between the total amount (filling amount) of the functional liquid ejected onto the sixty ejecting regions A and the predetermined amount is "0.00154". A proportion of the range with respect to the predetermined amount is "0.03%".

Figure 22A:
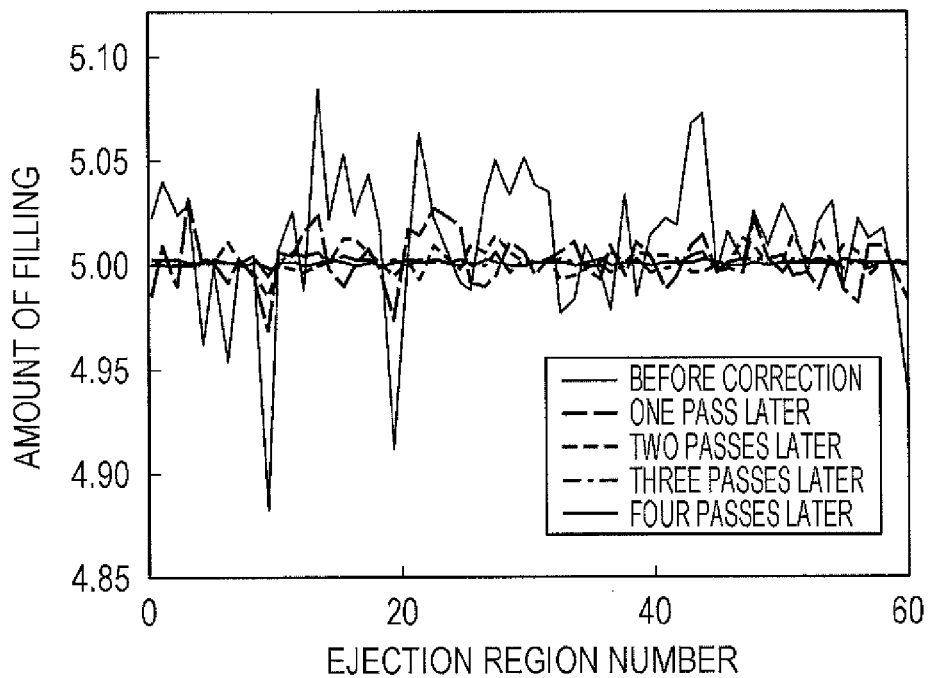
FIG. 22A is a graph showing variations in functional liquid filling amounts in the respective ejecting region according to the comparative example.
Figure 22B:
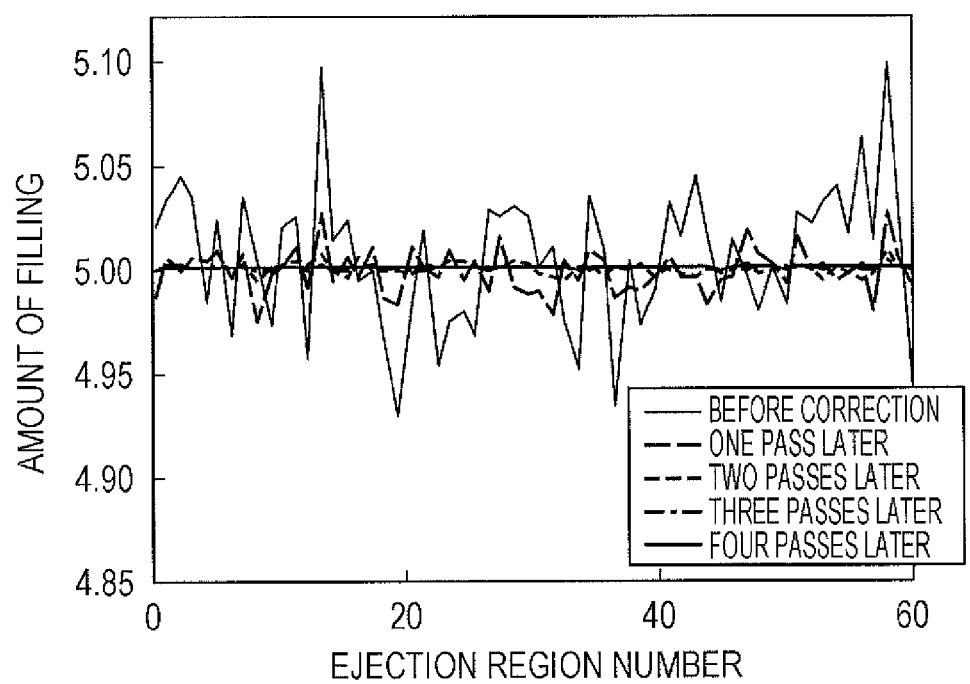
FIG. 22B is a graph showing variations in functional liquid filling amounts in the respective ejecting regions according to the example.
Figure 23A:
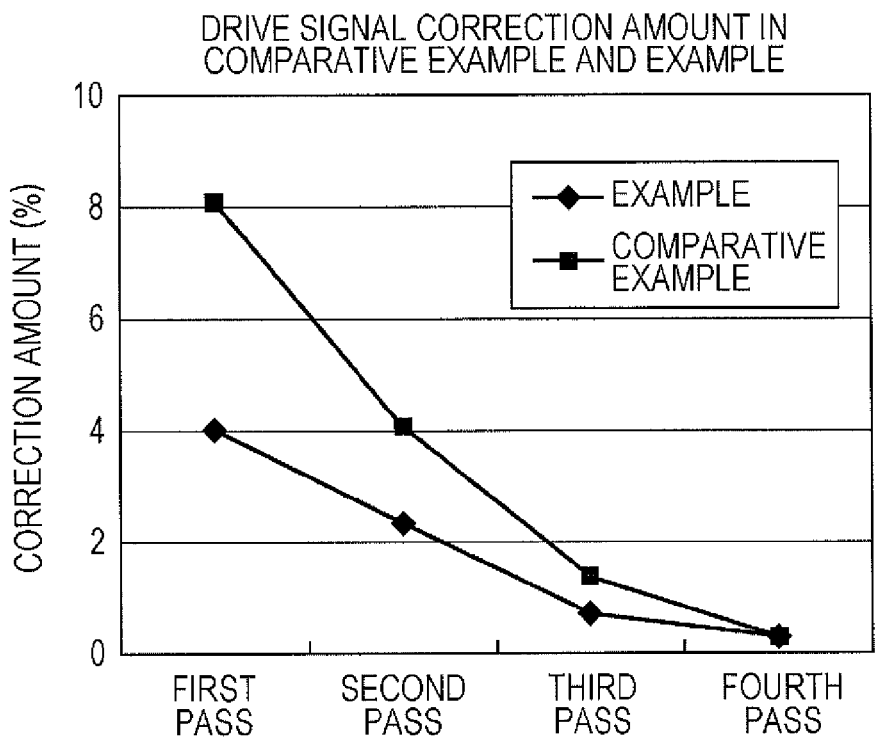
FIG. 23A is a graph showing driving signal correction amounts in the main scanning according to the comparative example and the example.
Figure 23B:
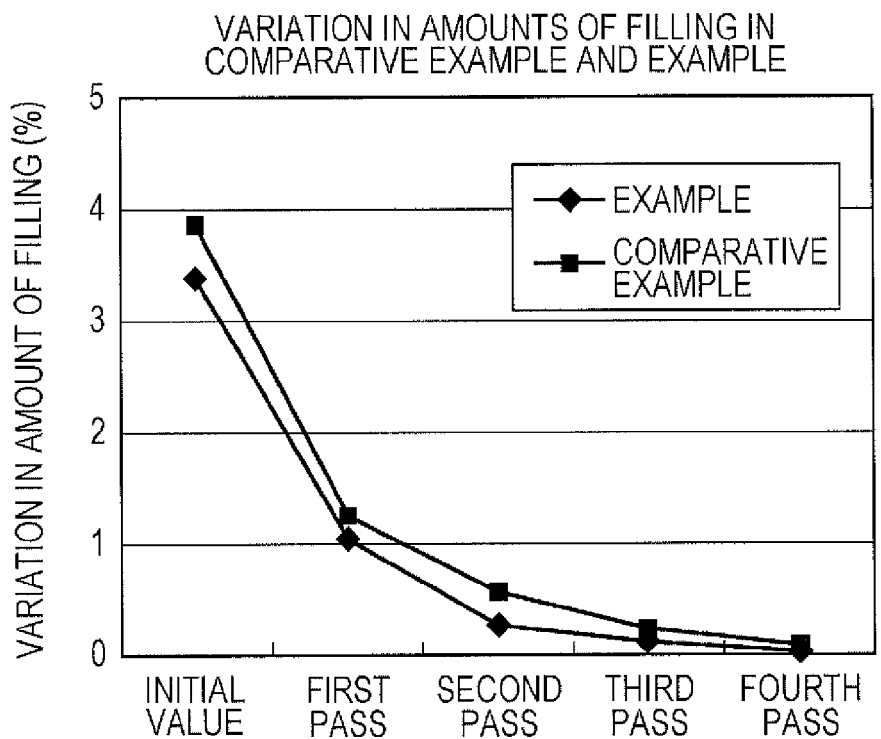
FIG. 23B is a graph showing variations in the filling amounts in the main scanning according to the comparative example and the example.

FIG. 21 is a table showing driving signal correction amounts in main scanning and variations in functional liquid filling amounts in ejecting regions according to the comparative example and the example. FIG. 22A is a graph showing variations in functional liquid filling amounts in the respective ejecting regions according to the comparative example, and FIG. 22B is a graph showing variations in functional liquid filling amounts in the respective ejecting regions according to the example. FIG. 23A is a graph showing driving signal correction amounts in the main scanning according to the comparative example and the example, and FIG. 23B is a graph showing variations in the filling amounts in the main scanning according to the comparative example and the example. FIGS. 22A and 22B and FIGS. 23A and 23B are graph expressions of the numerical data shown in FIG. 21.

As shown in the table in FIG. 21 and the graphs in FIGS. 22A and 22B, the total amounts (filling amounts) of the functional liquid in the ejecting regions A respectively have variations which exceed 3% when the liquid droplets D are ejected by using the driving signals COM before correction in the functional liquid ejecting methods according to the comparative example and the example.

Since the ejecting amounts of the liquid droplets D ejected from the selected nozzles 52, namely the nozzle ejection amounts, are corrected at the respective passes (main scanning) by respectively correcting the plurality of driving signals COM (COM1 to COM4) at the respective passes (main scanning), variations in the filling amounts decrease as the pass progresses in the comparative example and the example.

However, the correction amounts of the driving signals COM at the respective passes in the comparative example are greater than those in the example as shown in the table in FIG. 21 and the graph in FIG. 23A. In other words, the correction amounts of the driving signals COM in the example are smaller than those in the comparative example. Since correction is performed in priority to the pass (main scanning), in which the number of ejected liquid droplets D is larger, in the example, it is not necessary to excessively correct the driving signals COM. In relation to the standard curve which represents the relationship between the potential of the waveforms of the driving signals COM applied to the piezoelectric elements 59 as actuators and the ejection amount of the liquid droplets D, the ejection amount of the liquid droplets D more easily deviates from the linear relationship in the standard curve as a pressurizing or depressurizing potential increases with respect to the reference potential, for example. That is, it is desired to correct the driving signals COM within a range in which the standard curve of the driving signal COM is highly reliable.

According to the functional liquid ejecting method and the nozzle ejection amount correcting method of the example, it is possible to decrease the variations in the functional liquid filling amounts in the ejecting regions A as compared with the comparative example as shown in FIG. 23B.

Second Embodiment

Organic Electroluminescence Device

Figure 24:
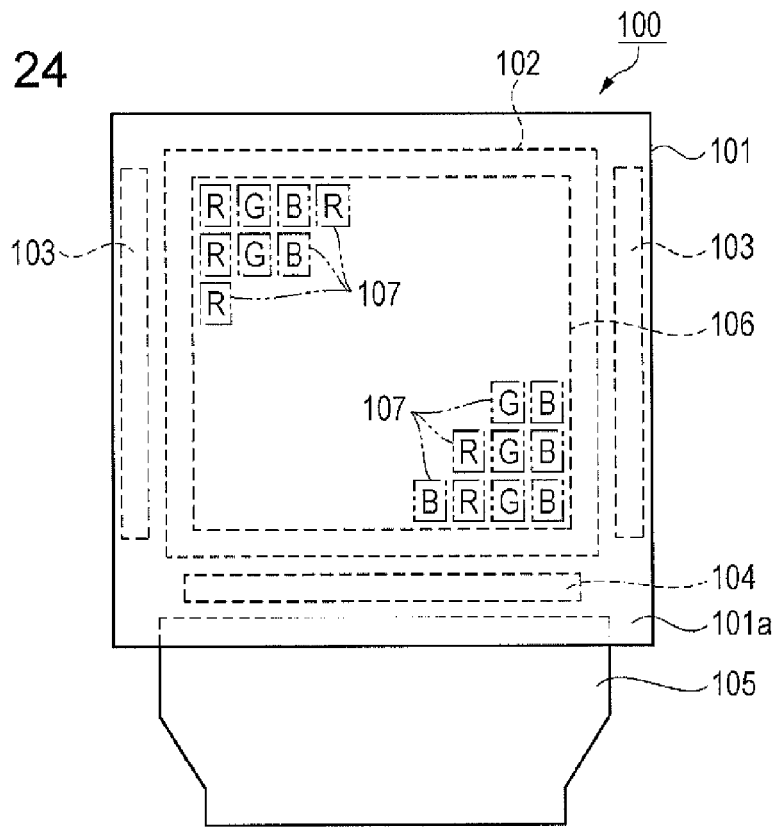
FIG. 24 is an outline front view showing an organic EL device.
Figure 25:
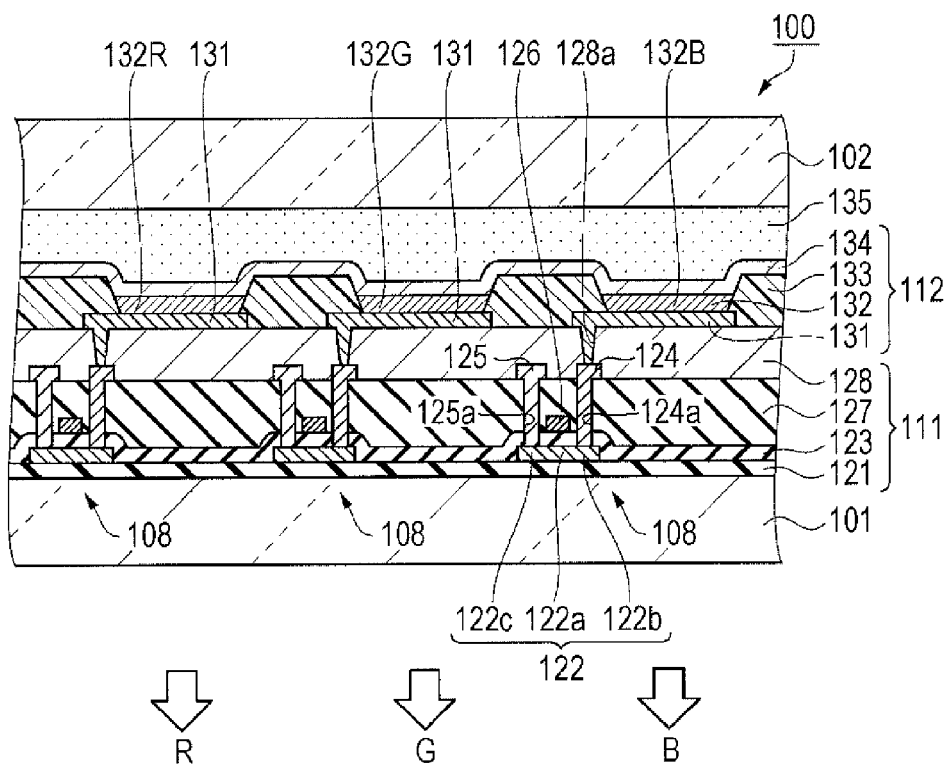
FIG. 25 is an outline cross-sectional view of main parts of the organic EL device.

Next, a description will be given of an organic electroluminescence (EL) device with reference to FIGS. 24 and 25. FIG. 24 is an outline front view showing an organic EL device, and FIG. 25 is an outline cross-sectional view of main parts of the organic EL device.

As shown in FIG. 24, an organic EL device 100 is provided with an element substrate 101 which includes light emitting pixels 107 of three colors, namely R (red), G (green), and B (blue) and a sealing substrate 102 which is arranged so as to face the element substrate 101 with a predetermined gap interposed therebetween. The sealing substrate 102 is attached to the element substrate 101 by using an adhesive agent with high air tightness so as to seal a light emitting region 106, in which a plurality of light emitting pixels 107 are provided.

The light emitting pixels 107 are provided with organic EL elements 112 (see FIG. 25) as light emitting elements as will be described later, and the light emitting pixels 107 aligned in a so-called stripe fashion such that the light emitting pixels 107, from which light emission of the same color can be obtained, are aligned in a longitudinal direction of the drawing. In addition, the light emitting pixels 107 have minute sizes in practice and are expressed in an enlarged manner for the purpose of clearly showing the light emitting pixels 107 in the drawing.

The element substrate 101 is slightly larger than the sealing substrate 102, and two scanning line drive circuit units 103 for driving the light emitting pixel 107 and one data line drive circuit unit 104 are provided at a part extending in a frame shape. The scanning line drive circuit units 103 and the data line drive circuit unit 104 may be mounted as ICs, in which electric circuits are integrated on the element substrate 101, or alternatively, the scanning line drive circuit units 103 and the data line drive circuit unit 104 may be directly formed on the surface of the element substrate 101.

A relay substrate 105 for connecting the scanning line drive circuit units 103 and the data line drive circuit unit 104 to an external drive circuit are mounted on a terminal 101a of the element substrate 101. As the relay substrate 105, a flexible circuit substrate may be used, for example.

As shown in FIG. 25, each organic EL element 112 in the organic EL device 100 includes an anode 131 as a pixel electrode, a partition wall 133 for sectioning the anode 131, and a functional layer 132 including a light emitting layer which is an organic film formed on the anode 131. In addition, the organic EL element 112 includes a cathode 134 as a common electrode which is formed so as to face the anode 131 via the functional layer 132.

The partition wall 133 is made of a photo-sensitive resin with an insulation property, such as phenol resin or polyimide resin, and is provided so as to cover a part of the circumference of each anode 131 configuring each light emitting element 107 and a section the plurality of anodes 131, respectively.

The anode 131 is connected to one of three terminals of a TFT element 108 formed on the element substrate 101 and is an electrode which is obtained by forming indium tin oxide (ITO) as a transparent electrode material into a film with a thickness of about 100 nm, for example.

The cathode 134 is formed of metal with light reflectivity, such as Al or Ag, or alloy of the metal with other metal (Mg, for example).

The organic EL device 100 has a so-called bottom emission structure, and drive current is made to flow between the anode 131 and the cathode 134, the light emitted from the functional layer 132 is reflected by the cathode 134 and extracted from the side of the element substrate 101. Therefore, a transparent substrate made of glass or the like is used as the element substrate 101. In addition, it is possible to use any one of a transparent substrate and an opaque substrate as the sealing substrate 102. Examples of the opaque substrate include a substrate obtained by performing insulation processing such as surface oxidation on a ceramic sheet of alumina or the like or a metal sheet of metal such as stainless steel, a substrate made of thermoset resin, and a substrate made of thermoplastic resin.

The element substrate 101 is provided with a circuit unit 111 for driving the organic EL element 112.

That is, a base protective layer 121 containing $SiO_2$ as a main constituent is formed on the surface of the element substrate 101, and a semiconductor layer 122 made of polysilicon, for example, is formed thereon. A gate insulating film 123 containing $SiO_2$ and/or SiN as a main constituent is formed on the surface of the semiconductor layer 122.

In addition, a region, which overlaps with the gate electrode 126 with the gate insulating film 123 interposed therebetween, of the semiconductor layer 122 is a channel region 122a. In addition, the gate electrode 126 is a part of a scanning line which is not shown in the drawing. On the other hand, a first interlayer insulating layer 127 which contains SiO2 as a main constituent is formed on the surface of the gate insulating film 123, which covers the semiconductor layer 122, on which the gate electrode 126 is formed.

In addition, a low-density source region and a high-density source region 122c are provided on a source side of the channel region 122a while a low-density drain region and a high-density drain region 122b are provided on a drain side of the channel region 122a in the semiconductor layer 122, and a so-called light doped drain (LDD) structure is employed. In the structure, the high-density source region 122c is connected to a source electrode 125 via a contact hole 125a which opens through the gate insulating film 123 and the first interlayer insulating layer 127. The source electrode 125 is configured as a part of a power source line (not shown). On the other hand, the high-density drain region 122b is connected to a drain electrode 124, which is in the same layer as that of the source electrode 125, via a contact hole 124a which penetrates through the gate insulating film 123 and the first interlayer insulating layer 127.

A flattening layer 128 is formed on an upper layer of the first interlayer insulating layer 127, in which the source electrode 125 and the drain electrode 124 are formed. The flattening layer 128 is formed of heat resistant insulating resin such as acrylic-based resin or a polyimide-based resin, and a known flattening layer can be used for flattening the unevenness of the surface due to the TFT element 108, the source electrode 125, the drain electrode 124, and the like.

In addition, the anode 131 is formed on the surface of the flattening layer 128 and is connected to the drain electrode 124 via a contact hole 128a which is provided in the flattening layer 128. That is, the anode 131 is connected to the high-density drain region 122b of the semiconductor layer 122 via the drain electrode 124. The cathode 134 is connected to a GND. Therefore, the TFT element 108 as a switching element controls drive current which is supplied from the power source line to the anode 131 and flows between the anode 131 and the cathode 134. In doing so, the circuit unit 111 causes a desired organic EL element 112 to emit light and can perform color display.

In addition, the configuration of the circuit unit 111 which drives the organic EL element 112 is not limited thereto.

The functional layer 132 is configured of a plurality of thin-film layers including a hole-injecting layer, an intermediate layer, and a light emitting layer as organic layers and these layers are laminated in this order from the side of the anode 131. In this embodiment, such organic layers are funned by using a liquid phase process (ink jet method).

As a material of the hole-injecting layer, a mixture (PEDOT/PSS) obtained by adding polystyrene sulfonate (PSS) as a dopant to a polythiophene derivative such as polyethylenedioxythiophene (PEDOT), polystyrene, polypyrrole, polyanilline, polyacetylene, or derivatives thereof may be used.

The intermediate layer is provided between the hole-injecting layer and the light emitting layer to enhance a transport property (an injection property) of the hole with respect to the light emitting layer and suppress leakage of electron from the light emitting layer to the hole-injecting layer. That is, the intermediate layer is for improving light emitting efficiency by coupling the hole and the electron in the light emitting layer. Examples of a material of the intermediate layer include a material which contains triphenylamine-based polymer with a satisfactory hole transport property.

As a material of the light emitting layer, it is possible to use a polyfluorene derivative (PF), from which red, green, and blue light emission can be obtained, a polyparaphenylene vinylene derivative (PPV), a polyphenylene derivative (PP), a polyparaphenylene derivative (PPP), polyvinyl carbazole (PVK), a polythiophenylene derivative such as PEDOT, polymethyl phenylene silane (PMPS), or the like. In addition, such high molecular materials may be doped with a high molecular material such as perylene-based pigment, coumalin-based pigment, or rhodamine-based pigment or low molecular material such as rubrene, perylene, 9,10-diphenylanthracene, tetraphenylbutadiene, nile red, coumalin 6, or quinacridone.

The element substrate 101 which includes such an organic EL element 112 is sealed with no gap from the sealing substrate 102 via a sealing and bonding layer 135, in which thermosetting epoxy resin or the like is used as an adhesive member.

The organic EL device 100 is manufactured by using the ejection device 10 described above in the first embodiment, and at least the light emitting layer has a substantially constant film thickness and a stable film shape (cross-sectional shape). Therefore, it is possible to obtain desired light emitting properties of the functional layers 132R, 132G, and 132B, from which different light emitting colors can be obtained.

In addition, the organic EL device 100 according to this embodiment is not limited to the bottom emission structure, and for example, the organic EL device 100 may have a top emission structure, in which the anode 131 is formed by using a light reflective conductive material, the cathode 134 as a common electrode is formed by using a transparent conductive material, and the light emitted from the organic EL element 112 is reflected by the anode 131 and extracted from the side of the sealing substrate 102. In a case of employing the top emission structure, a configuration in which a color filter corresponding to the light emission color of the organic EL element 112 is provided on the side of the sealing substrate 102 may also be employed. Furthermore, a configuration in which white light emission can be obtained from the organic EL element 112 may also be employed in a case of providing the color filter on the side of the sealing substrate 102.

Organic EL Device Manufacturing Method

Figure 26:
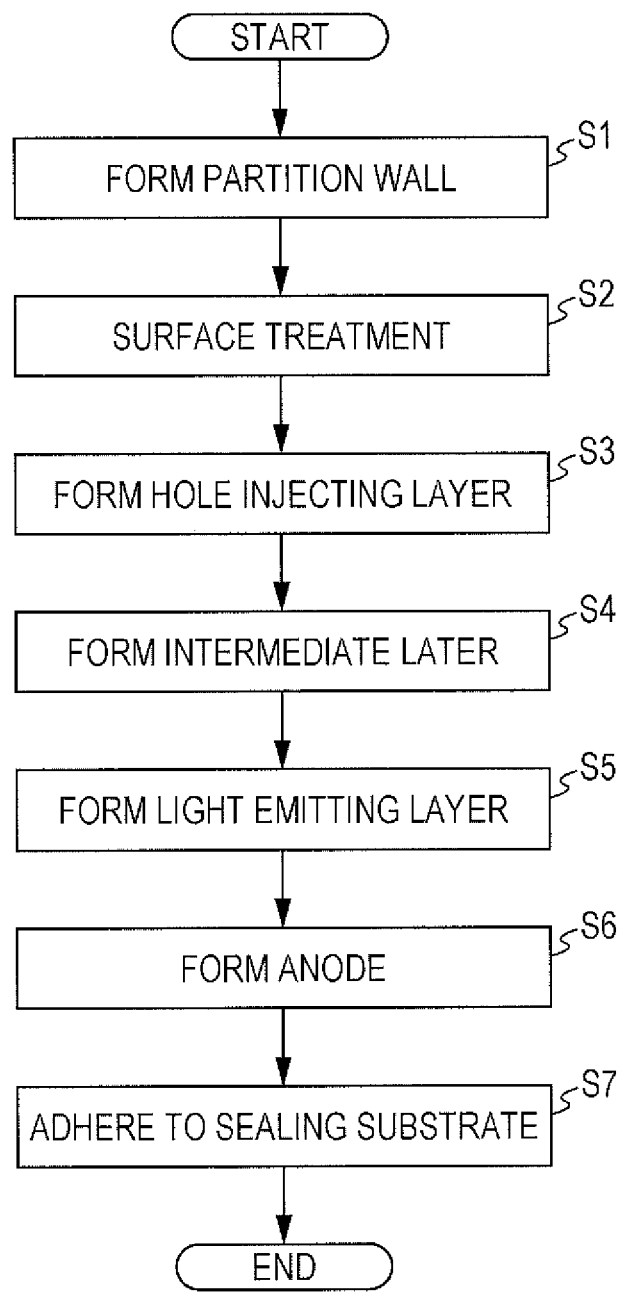
FIG. 26 is a flowchart showing a manufacturing method of the organic EL device.

Next, a description will be given of an organic EL device manufacturing method according to this embodiment with reference to FIGS. 26, 27A to 27D, and 28E to 28H. FIG. 26 is a flowchart showing an organic EL device manufacturing method, FIGS. 27A to 27D and FIGS. 28A to 28D are outline cross-sectional views showing the organic EL device manufacturing method.

In the manufacturing method of the organic EL device 100 according to this embodiment, the ejection device 10 according to the first embodiment is used. In addition, the functional liquid ejecting method, to which the nozzle ejection amount correcting method according to the invention is applied, is used.

As shown in FIG. 26, the manufacturing method of the organic EL device 100 according to this embodiment includes at least: a partition wall formation process (Step S1); a surface treatment process (Step S2) for performing surface treatment on a substrate with the partition wall formed thereon; a hole-injecting layer formation process (Step S3); an intermediate layer formation process (Step S4); a light emitting layer formation process (Step S5); a cathode formation process (Step S6); and a sealing substrate bonding process (Step S7) for bonding the element substrate 101 with the organic EL element 112 formed thereon to the sealing substrate 102. In addition, known manufacturing methods may be used for a process for forming the circuit unit 111 (see FIG. 25) on the element substrate 101 and a process for forming the anode 131 which is electrically connected to the circuit unit 111, and a detailed description thereof will be omitted in this embodiment. Therefore, the circuit unit 111 is not shown in FIGS. 27A to 27D and FIGS. 28A to 28D.

Figure 27A:
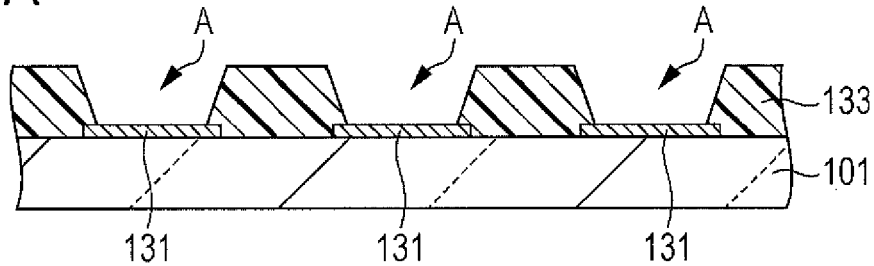
FIGS. 27A to 27D are outline cross-sectional views showing the manufacturing method of the organic EL device.

Step S1 in FIG. 26 is the partition wall formation process. In Step S1, the partition wall 133 is formed so as to cover a part of the circumference of the anode 131 and section each anode 131 as shown in FIG. 27A. According to a formation method, photo-sensitive phenol resin or polyimide resin is applied to the surface of the element substrate 101, in which the anode 131 is formed, to have a thickness of about 1 μm to about 3 μm. As an application method, it is possible to exemplify a transfer method, a slit coating method, and the like. Then, the obtained object is exposed by using a mask corresponding to the shape of the light emitting pixel 107 and developed to form the partition wall 133. In the following description, a region of the light emitting pixel 107 sectioned by the partition wall 133 corresponds to an ejecting region A in the invention. Then, the processing proceeds to Step S2.

Step S2 in FIG. 26 is the surface treatment process. In Step S2, lyophilic treatment and lyophobic treatment are performed on the surface of the element substrate 101, on which the partition wall 133 is formed. First, plasma treatment using oxygen as processing gas is performed, and the lyophilic treatment is performed on the surface of the anode 131 which is made mainly of an inorganic material. Then, plasma treatment using fluorine-based gas such as CF4 as processing gas is performed to introduce fluorine to the surface of the partition wall 133 which is made of an organic material, and the lyophobic treatment is performed thereon.

In addition, the formation of the lyophobic partition wall 133 is not limited thereto. For example, the partition wall 133 may be formed by transferring a lyophobic material to a head portion of the partition wall 133 and forming a lyophobic layer or by causing the photosensitive resin itself to contain a lyophobic material. In such a case, a surface treatment for removing residuals when the partition wall 133 is formed, such as UV ozone treatment for irradiating the surface with an ultraviolet ray and generating ozone may be employed. Then, the processing proceeds to Step S3.

Figure 27B:
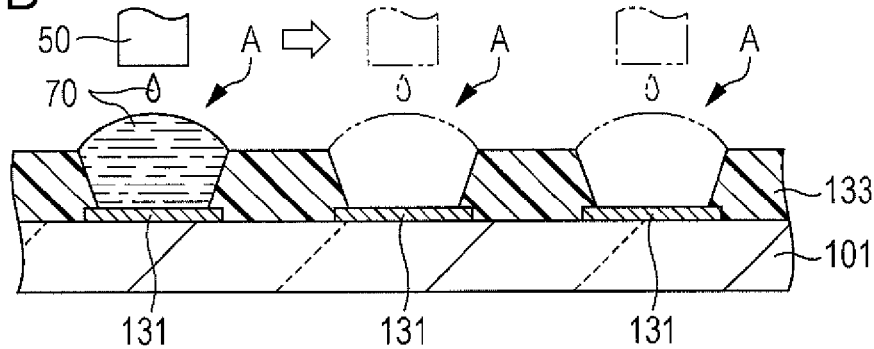

Step S3 in FIG. 26 is the hole-injecting layer formation process. In Step S3, functional liquid 70 which contains a hole-injecting layer forming material is applied to the ejecting region A as shown in FIG. 27B. As the functional liquid 70, a functional liquid which contains diethylene glycol and water (pure water), for example, as solvents and contains PEDOT/PSS at a ratio by weight of about 0.5% as the hole-injecting layer forming material is used. The rate of solvents is adjusted such that viscosity is equal to or less than 20 mPa·s.

As an application method of the functional liquid 70, the ejection device 10 capable of ejecting the functional liquid (ink) described above in the first embodiment from the nozzles 52 of the ejection heads 50 is used. The ejection heads 50 are made to face the element substrate 101 as the work W, and the functional liquid 70 is ejected from the ejection heads 50. The ejected functional liquid 70 lands and expands as liquid droplets on the anode 131 after lyophilic treatment. A predetermined amount of functional liquid in accordance with the area of the ejecting region A is ejected as liquid droplets such that the film thickness of the hole-injecting layer after drying ranges from about 50 nm to about 70 nm. Then, the processing proceeds to a drying process.

Figure 27C:
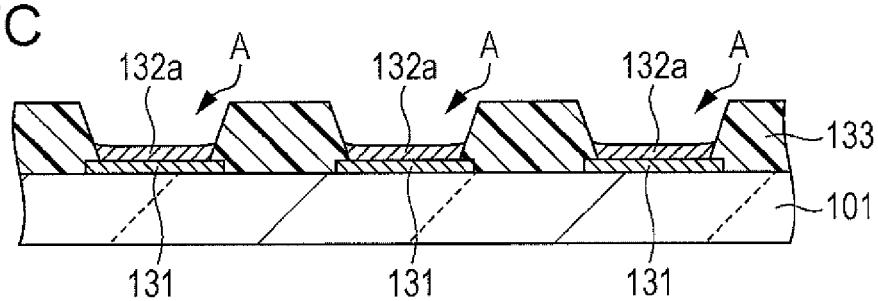

In the drying process, the solvent constituents in the functional liquid 70 are dried and removed by heating the element substrate 101 by a lamp anneal method, for example, and the hole-injecting layer 132a is formed on the anode 131 in the ejecting region A as shown in FIG. 27C. Although the hole-injecting layer 132a made of the same material is formed in each ejecting region A in this embodiment, the materials of the hole-injecting layer 132a may be changed for each light emitting color in accordance with the light emitting layer which is formed later. Then, the processing proceeds to Step S4.

Figure 27D:
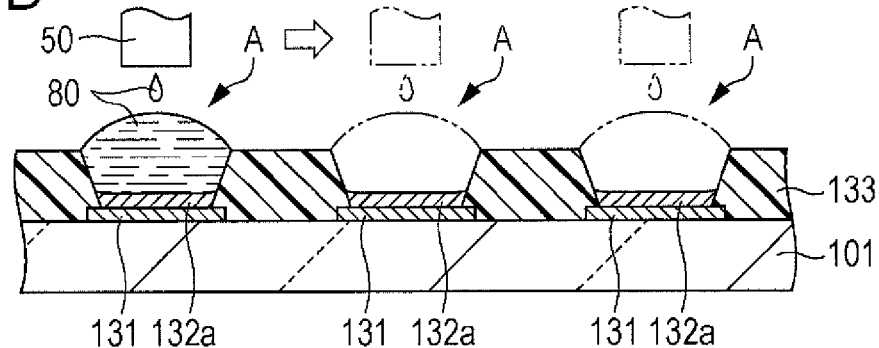

Step S4 in FIG. 26 is the intermediate layer formation process. In Step S4, functional liquid 80 which contains an intermediate layer forming material is ejected to the ejecting region A as shown in FIG. 27D.

As the functional liquid 80, functional liquid which contains cyclohexylbenzene, for example, as a solvent and contains aforementioned triphenylamine-based polymer at a ratio of weigh of about 0.1% as the intermediate layer forming material is used. The viscosity is about 6 mPa·s.

As an application method of the functional liquid 80, the ejection device 10 according to the first embodiment is used in the same manner as in the case of applying the functional liquid 70. A predetermined amount of functional liquid in accordance with the area of the ejecting region A is ejected as liquid droplets such that the film thickness of the intermediate layer after drying ranges from about 10 nm to about 20 nm. Then, the processing proceeds to a drying process.

Figure 28A:
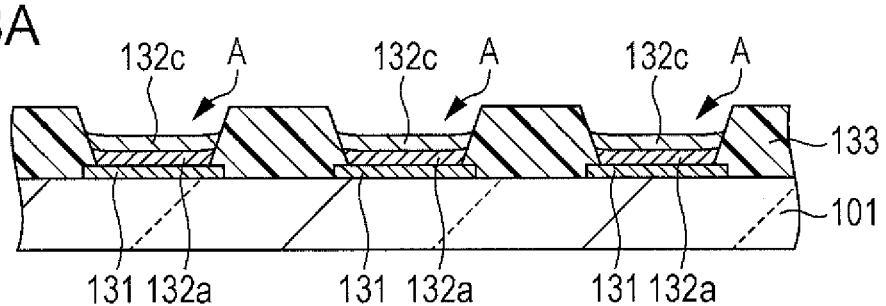
FIGS. 28A to 28D are outline cross-sectional views showing the manufacturing method of the organic EL device.

In the drying process, the solvent constituents in the functional liquid 80 are dried and removed by heating the element substrate 101 by a lamp anneal method, for example, and the intermediate layer 132c is formed on the hole-injecting layer 132a in the ejecting region A as shown in FIG. 28A. Then, the processing proceeds to Step S5.

Figure 28B:
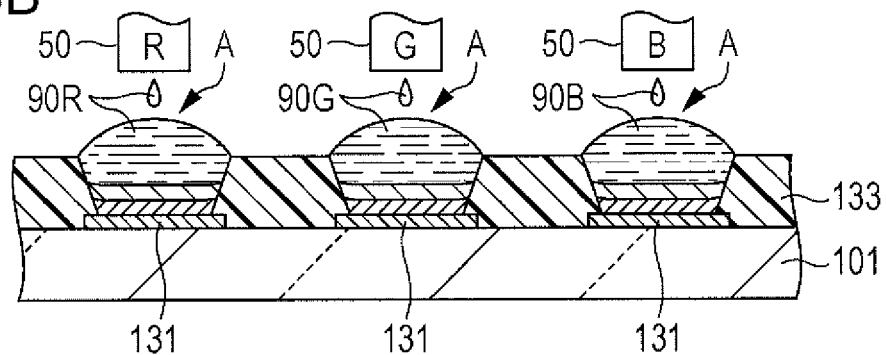

Step S5 in FIG. 26 is the light emitting layer formation process. In Step S5, functional liquid 90R, 90G, and 90B which contain the light emitting layer forming materials are applied to a corresponding ejecting region A as shown in FIG. 28B.

As the functional liquid 90R, 90G, and 90B, functional liquid which contains cyclohexylbenzene as a solvent and contains PF as a light emitting layer forming material at a ratio of weight of 0.7% is used. The viscosity is about 14 mPa·s.

As an application method of the functional liquid 90R, 90G, and 90B, the ejection device 10 according to the first embodiment is used, different ejection heads 50 are filled with the functional liquid 90R, 90G, and 90B, and the functional liquid 90R, 90G, and 90B is ejected. In addition, a predetermined amount of functional liquid in accordance with the area of the ejecting area A is ejected as liquid droplets such that the film thickness of the light emitting layer after drying ranges from about 50 nm to about 100 nm. Then, the processing proceeds to a drying process.

Figure 28C:
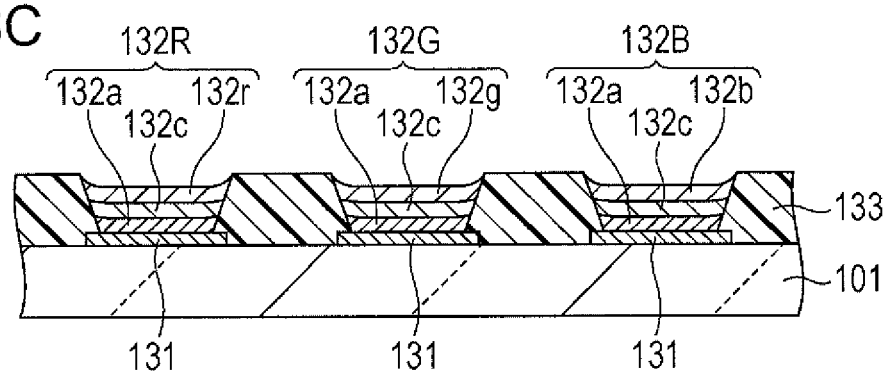

As the drying process for the ejected functional liquid 90R, 90G, and 90B in this embodiment, a reduced-pressure drying method capable of relatively uniformly drying the solvent constituent as compared with a general heat drying is used. Necessary amounts of functional liquid 90R, 90G, and 90B are uniformly applied to each the corresponding ejecting regions A. Therefore, the light emitting layers 132r, 132g, and 132b formed after the drying have substantially constant film thicknesses for the respective ejecting regions A and stable film shapes (cross-sectional shapes) as shown in FIG. 28C. In doing so, the functional layers 132R, 132G, and 132B which contain the light emitting layers 132r, 132g, and 132b are completed. Then, the processing proceeds to Step S6.

Figure 28D:
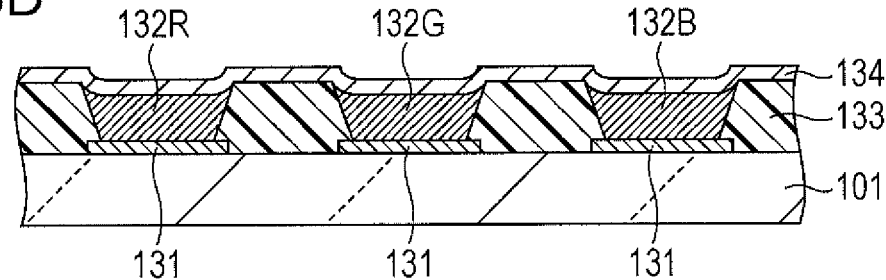

Step S6 in FIG. 26 is the cathode formation process. In Step S6, the cathode 134 is formed so as to cover the partition wall 133, the respective functional layers 132R, 132G, and 132B as shown In FIG. 28D. In doing so, the organic EL element 112 is configured for each light emitting pixel 107.

As a material of the cathode 134, alloy of aluminum (Al) or silver (Ag) and magnesium (Mg) or the like is used. A film of Ca, Ba, or LiF with a small work function may be formed on a side close to the functional layers 132R, 132G, and 132B. In addition, a protective layer of $SiO_2$, SiN, or the like may be laminated on the cathode 134. In doing so, it is possible to prevent oxidation of the cathode 134. As a formation method of the cathode 134, it is possible to exemplify a deposition method, a sputtering method, a CVD method, and the like. Particularly, the deposition method is preferable from a viewpoint that it is possible to prevent the functional layers 132R, 132G, and 132B from being damaged due to heat. Then, the processing proceeds to Step S7.

Step S7 in FIG. 26 is the sealing substrate bonding process. In Step S7, a sealing and bonding layer 135 is applied to the element substrate 101 on which the organic EL element 112 is formed, and the element substrate 101 is sealed with no gap from the sealing substrate 102 (see FIG. 25). Furthermore, it is desired to provide an adhesive layer for preventing infiltration of moisture, oxygen, and the like in an outer circumferential region of the sealing substrate 102 and cause the element substrate 101 to adhere to the sealing substrate 102.

According to the manufacturing method of the organic EL device 100 as described above, the functional layers 132R, 132G, and 132B are formed by a liquid phase process (ink jet method) by using the ejection device 10 according to the first embodiment. In addition, the driving signals COM are corrected at the respective passes (main scanning) by using the nozzle ejection amount correcting method according to the first embodiment, and the respective functional liquid is ejected as liquid droplets from the selected nozzles 52 to the ejecting regions A. A pass (main scanning) with the largest number of ejected liquid droplets D is performed as a first pass (main scanning). Therefore, variations in the filling amounts of the functional liquid ejected from the nozzles 52 of the ejection heads 50 can be suppressed to a certain level of range. For this reason, the functional layers 132R, 132G, and 132B which include the light emitting layers 132r, 132g, and 132b with substantially constant film thicknesses and stable film shapes (cross-sectional shapes) are formed in each light emitting pixel 107 in the light emitting region 106. Accordingly, it is possible to manufacture the organic EL device 100, in which variations in luminance caused by variations in the film thicknesses of the functional layers 132R, 132G, and 132B are reduced, which can perform color display with an excellent light emitting property, namely excellent display quality, and with a satisfactory appearance.

According to the functional liquid ejecting method using the ejection device 10 according to the first embodiment, it is possible to achieve the above effect by applying the functional liquid ejecting method to the application of the functional liquid 90R, 90G, and 90B which contain at least the light emitting layer forming material.

Electronic Device

The organic EL device 100 manufactured by using the organic EL device manufacturing method according to the invention can be preferably used as a display unit of various electronic devices.

As the electronic devices, it is possible to exemplify a mobile phone, a personal computer, a mobile information terminal such as a PDA and a POS, a digital camera, a digital video camera, a car navigation system, a television, a head-mounted display (HMD), a head-ups display (HUD), and the like.

In addition, the organic EL device 100 may be used not only as a display unit but also as an illumination device of an electronic device, in which the organic EL element 112 is configured to obtain white light emission.

The invention is not limited to the aforementioned embodiments and can be appropriately modified without departing from the scope or the idea of the invention which can be understood from the claims and the entire specification, and a nozzle ejection amount correcting method, and a functional liquid ejecting method, to which the nozzle ejection amount correcting method is applied, and an organic EL device manufacturing method, to which the functional liquid ejecting method is applied, with such modifications are also within the technical range of the invention. Various modification examples can be considered in addition to the above embodiments. Hereinafter, modification examples will be described.

Modification Example 1

The number of liquid droplets ejected to one ejecting region A is not limited to five, and the number of times of the main scanning to eject the five liquid droplets is not limited to four, in the nozzle ejection amount correcting method and the functional liquid ejecting method according to the first embodiment. The functional liquid ejecting method, to which the invention is applied, is applied to a case where at least N+1 liquid droplets are ejected to an ejecting region A in main scanning performed N times (N is a positive integer) and main scanning, in which the number of ejected liquid droplets is larger than those in the other main scanning, is included in the main scanning performed N times.

Modification Example 2

Arrangement of the nozzle array 52c with respect to the plurality of ejecting regions A in the functional liquid ejecting method according to the first embodiment is not limited thereto. Since it is possible to increase the number of the nozzles 52 which covers one ejecting region A in the main scanning, while an image depiction range, in which one nozzle array 52c can eject the liquid droplets D in the main scanning, decreases by obliquely arranging the nozzle array 52c with respect to the main scanning direction to face the ejecting region A, it is possible to enhance a property of dispersing variations in the ejection amounts of the nozzles 52.

Modification Example 3

The functional liquid ejecting method according to the first embodiment is not limited to the configuration in which the liquid droplets D are ejected while the selected nozzles 52 are changed for the respective main scanning. If the selected nozzles 52 are changed at least once in the main scanning performed a plurality of times, it is possible to disperse variations in the ejection amounts of the nozzles 52.

Modification Example 4

The number of ranks of the ejection amounts of the liquid droplets from the selected nozzles 52 in the main scanning is not limited to eight. If the number of ranks is an integer multiple of the number of driving signals COM with different waveforms, it is possible to perform uniform allocation.

Modification Example 5

Application targets of the nozzle ejection amount correcting method and the functional liquid ejecting method according to the invention are not limited to the manufacturing method of the organic EL device 100. For example, the nozzle ejection amount correcting method and the functional liquid ejecting method according to the invention can be applied to a color filter manufacturing method, in which functional liquid contains a coloring material, a wiring or electrode forming method, in which functional liquid contains a conductive material, a semiconductor layer forming method, in which functional liquid contains a semiconductor material, and the like.

The entire disclosure of Japanese Patent Application No. 2012-279070, filed Dec. 21, 2012 is expressly incorporated by reference herein.

What is claimed is:

1. A nozzle ejection amount correcting method in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and ejection amounts of liquid droplets are corrected for the plurality of nozzles, the method comprising:
   performing first signal correction by calculating first correction amounts of the plurality of driving signals and adjusting the plurality of driving signals based on the first corrections amounts,
   the first correction amounts being based on a difference C between an amount B and a predetermined amount A,
   the predetermined amount A being a total amount of functional liquid set in advance to be ejected onto each of the ejecting regions, and
   the amount B being a total amount of functional liquid that is ejected as the liquid droplets from the selected nozzles to each of the ejecting regions by using the plurality of driving signals before the first signal correction when the main scanning is performed a plurality of times;

performing second signal correction by calculating second correction amounts of the plurality of driving signals and adjusting the plurality of driving signals based on the second correction amounts, the second correction amounts being based on a difference E between an amount D and the predetermined amount A, the amount D being a total amount of functional liquid that is ejected as the liquid droplets from the selected nozzles to each of the ejecting regions when the main scanning is performed a plurality of times, by using the plurality of driving signals on which the first signal correction has been preformed in a main scanning at one time of the main scanning performed a plurality of times, and by using the plurality of driving signals before correction in the main scanning performed a plurality of times other than the main scanning at the one time of the plurality of times; and performing the second signal correction by using the plurality of driving signals on which the first signal correction has been performed in the main scanning at the one time of the main scanning performed a plurality of times, and by using the plurality of driving signals before correction in the main scanning performed the plurality of times other than the main scanning at the one time of the plurality of times, at each iteration of the main scanning, in accordance with the remaining number of times of the main scanning performed, wherein main scanning, in which the number of ejected liquid droplets ejected to the ejecting regions is the largest, among the main scanning performed a plurality of times, is the main scanning at the one time of the plurality of times, the nozzle ejection amounts being corrected, at each iteration of the main scanning, with priority given to the main scanning in which the number of ejected liquid droplets is the largest.

2. The method according to claim 1, wherein a nozzle selected at least once in the main scanning performed a plurality of times is different from nozzles selected in the other main scanning with respect to the same ejecting region.

3. The method according to claim 1, wherein different nozzles are selected for the main scanning performed a plurality of times with respect to the same ejecting region.

4. The method according to claim 1, wherein the actuators are piezoelectric elements, and wherein the plurality of driving signals are corrected by correcting a potential of waveforms of the plurality of driving signals.

5. A functional liquid ejecting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and a predetermined amount of functional liquid is ejected as liquid droplets from the selected nozzles to the ejecting regions, the method comprising:

performing signal correction, in which the plurality of driving signals are corrected in the main scanning performed a plurality of times by using the nozzle ejection amount correcting method according to claim 1; and ejecting the predetermined amount of functional liquid as the liquid droplets from the selected nozzles to the ejecting regions while the main scanning is performed a plurality of times by using the plurality of driving signals, by which the signal correction is performed.

6. A functional liquid ejecting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and a predetermined amount of functional liquid is ejected as liquid droplets from the selected nozzles to the ejecting regions, the method comprising:

performing signal correction, in which the plurality of driving signals are corrected in the main scanning performed a plurality of times by using the nozzle ejection amount correcting method according to claim 2; and ejecting the predetermined amount of functional liquid as the liquid droplets from the selected nozzles to the ejecting regions while the main scanning is performed a plurality of times by using the plurality of driving signals, by which the signal correction is performed.

7. A functional liquid ejecting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and a predetermined amount of functional liquid is ejected as liquid droplets from the selected nozzles to the ejecting regions, the method comprising:

performing signal correction, in which the plurality of driving signals are corrected in the main scanning performed a plurality of times by using the nozzle ejection amount correcting method according to claim 3; and ejecting the predetermined amount of functional liquid as the liquid droplets from the selected nozzles to the ejecting regions while the main scanning is performed a plurality of times by using the plurality of driving signals, by which the signal correction is performed.

8. A functional liquid ejecting method, in which a plurality of nozzles are arranged to face a target of ejection where ejecting regions are formed, one of a plurality of driving signals is supplied to actuators of selected nozzles among the plurality of nozzles while main scanning is performed a plurality of times for relatively moving the plurality of nozzles and the target of ejection, and a predetermined amount of functional liquid is ejected as liquid droplets from the selected nozzles to the ejecting regions, the method comprising:

performing signal correction, in which the plurality of driving signals are corrected in the main scanning performed a plurality of times by using the nozzle ejection amount correcting method according to claim 4; and ejecting the predetermined amount of functional liquid as the liquid droplets from the selected nozzles to the ejecting regions while the main scanning is performed a plurality of times by using the plurality of driving signals, by which the signal correction is performed.

9. The method according to claim 5, wherein in ejecting the predetermined amount of functional liquid, main scanning, in which the number of ejected liquid droplets to the ejecting regions is the largest among the main scanning performed a plurality of times, is performed as first main scanning.

10. A manufacturing method of an organic EL device which includes a light emitting layer in each of a plurality of ejecting regions on a substrate, the method comprising:

applying a predetermined amount of functional liquid to each of the plurality of ejecting regions by using the functional liquid ejecting method according to claim 5; and forming one organic layer among the functional layers in each of the plurality of ejecting regions by solidifying the applied functional liquid.

11. A manufacturing method of an organic EL device which includes a functional layer configured to have a light emitting layer in each of a plurality of ejecting regions on a substrate, the method comprising:

applying a predetermined amount of functional liquid to each of the plurality of ejecting regions by using the functional liquid ejecting method according to claim 6; and forming one organic layer among the functional layers in each of the plurality of ejecting regions by solidifying the applied functional liquid.

12. A manufacturing method of an organic EL device which includes a functional layer configured to have a light emitting layer in each of a plurality of ejecting regions on a substrate, the method comprising:

applying a predetermined amount of functional liquid to each of the plurality of ejecting regions by using the functional liquid ejecting method according to claim 7; and forming one organic layer among the functional layers in each of the plurality of ejecting regions by solidifying the applied functional liquid.

13. A manufacturing method of an organic EL device which includes a functional layer configured to have a light emitting layer in each of a plurality of ejecting regions on a substrate, the method comprising:

applying a predetermined amount of functional liquid to each of the plurality of ejecting regions by using the functional liquid ejecting method according to claim 8; and forming one organic layer among the functional layers in each of the plurality of ejecting regions by solidifying the applied functional liquid.

14. A manufacturing method of an organic EL device which includes a functional layer configured to have a light emitting layer in each of a plurality of ejecting regions on a substrate, the method comprising:

applying a predetermined amount of functional liquid to each of the plurality of ejecting regions by using the functional liquid ejecting method according to claim 9; and forming one organic layer among the functional layers in each of the plurality of ejecting regions by solidifying the applied functional liquid.

15. The manufacturing method of an organic EL device according to claim 10, wherein in applying the functional liquid, the functional liquid which contains a light emitting layer forming material is applied.

* * * * *